(12) United States Patent
Sawano et al.

(10) Patent No.: US 10,483,124 B2
(45) Date of Patent: Nov. 19, 2019

(54) SEMICONDUCTOR DEVICE

(71) Applicant: Toshiba Memory Corporation, Minato-ku (JP)

(72) Inventors: Masakazu Sawano, Mie (JP); Takahiro Tomimatsu, Yokkaichi (JP); Junichi Shibata, Yokkaichi (JP); Hideki Inokuma, Yokkaichi (JP); Hisashi Kato, Yokkaichi (JP); Kenta Yoshinaga, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/126,055

(22) Filed: Sep. 10, 2018

(65) Prior Publication Data

US 2019/0214268 A1 Jul. 11, 2019

(30) Foreign Application Priority Data

Jan. 11, 2018 (JP) .................................. 2018-002788

(51) Int. Cl.
| | |
|---|---|
| *H01L 23/48* | (2006.01) |
| *H01L 29/40* | (2006.01) |
| *H01L 21/311* | (2006.01) |
| *H01L 27/11519* | (2017.01) |
| *H01L 27/11582* | (2017.01) |
| *H01L 27/11556* | (2017.01) |
| *H01L 27/11565* | (2017.01) |
| *H01L 27/11575* | (2017.01) |
| *H01L 27/11548* | (2017.01) |

(52) U.S. Cl.
CPC .. *H01L 21/31144* (2013.01); *H01L 21/31116* (2013.01); *H01L 27/11519* (2013.01); *H01L 27/11548* (2013.01); *H01L 27/11556* (2013.01); *H01L 27/11565* (2013.01); *H01L 27/11575* (2013.01); *H01L 27/11582* (2013.01)

(58) Field of Classification Search
CPC ........ H01L 21/31144; H01L 27/11524; H01L 27/11556; H01L 21/3086; H01L 21/31116; H01L 27/11526; H01L 27/11534; H01L 27/11551; H01L 27/11573; H01L 27/228
USPC ........................................................ 257/773
See application file for complete search history.

(56) References Cited

U.S. PATENT DOCUMENTS

| | | | |
|---|---|---|---|
| 8,822,285 B2 | 9/2014 | Hwang et al. | |
| 9,548,315 B2 | 1/2017 | Ishiduki et al. | |
| 2011/0309431 A1* | 12/2011 | Kidoh ............... | H01L 27/11573 257/324 |

(Continued)

*Primary Examiner* — Theresa T Doan
(74) *Attorney, Agent, or Firm* — Oblon, McClelland, Maier & Neustadt, L.L.P.

(57) ABSTRACT

According to one embodiment, a semiconductor device includes: a first stack above a substrate and including insulation layers and conductive layers alternately stacked in a first direction, the first stack including a staircase-shaped portion in an end portion of the first stack in a second direction parallel to a main face of the substrate, the staircase-shaped portion including steps and terraces corresponding to the conductive layers, at least a part of the steps having arc shape curved along a third direction crossing the second direction; and a second stack above the substrate and including first and second layers stacked in the first direction. In the second and/or third direction, a dimension of the first stack is larger than a dimension of the second stack.

20 Claims, 76 Drawing Sheets

(56) References Cited

U.S. PATENT DOCUMENTS

2012/0043599 A1* 2/2012 Katsumata ......... H01L 27/1157
                                                   257/314
2014/0053979 A1   2/2014 Chen et al.
2015/0214242 A1   7/2015 Lee
2016/0211209 A1   7/2016 Wu et al.

* cited by examiner

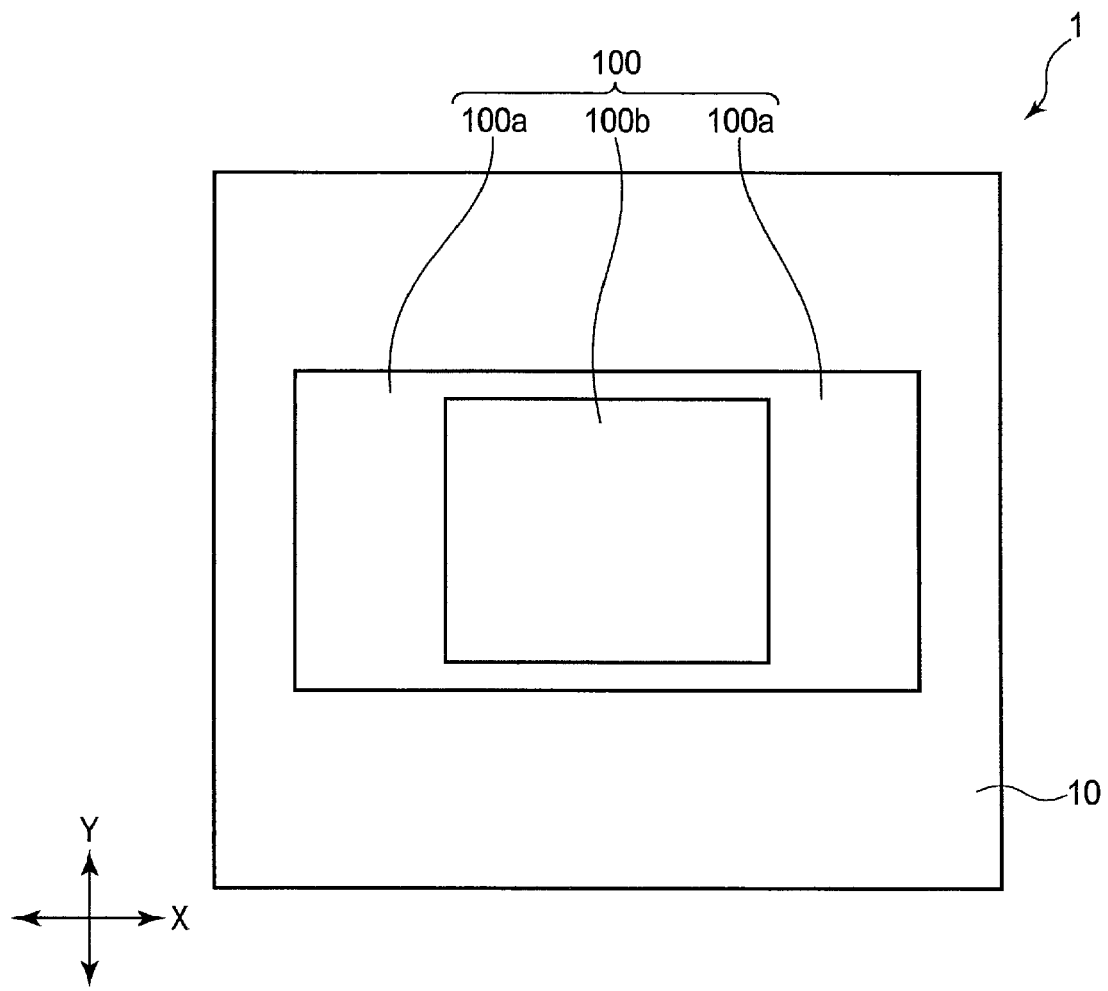
F I G. 1

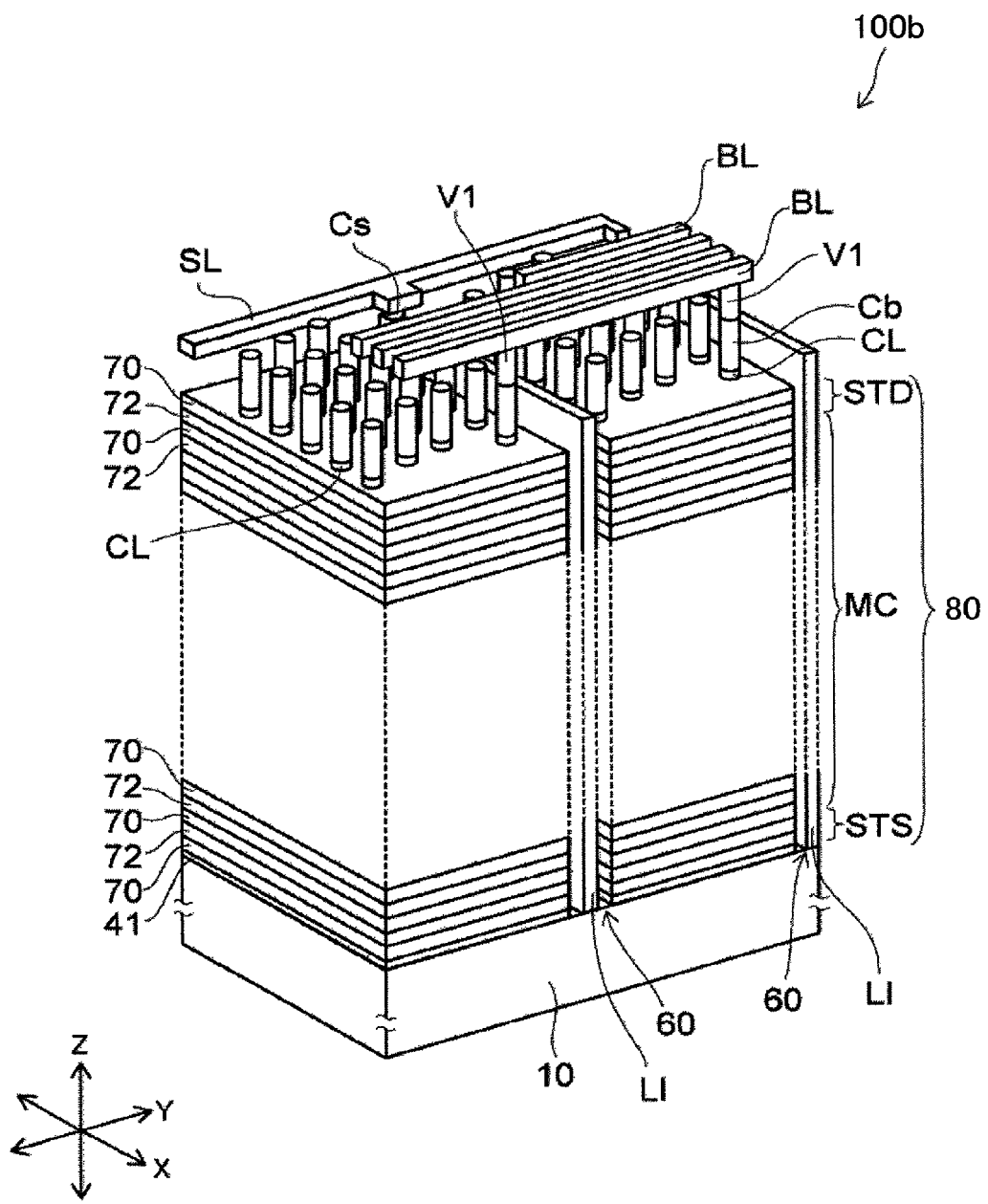
F I G. 2

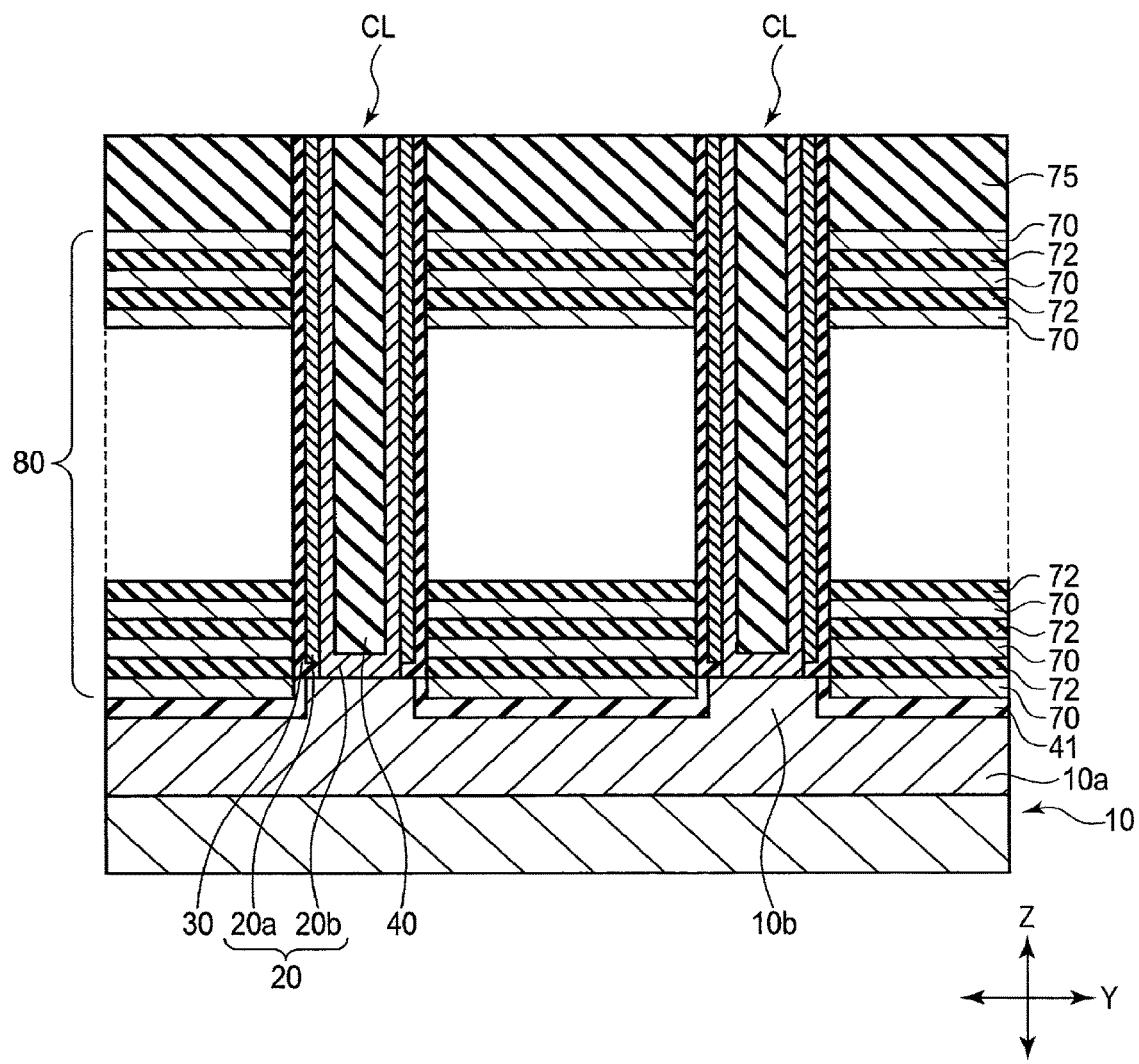
F I G. 3

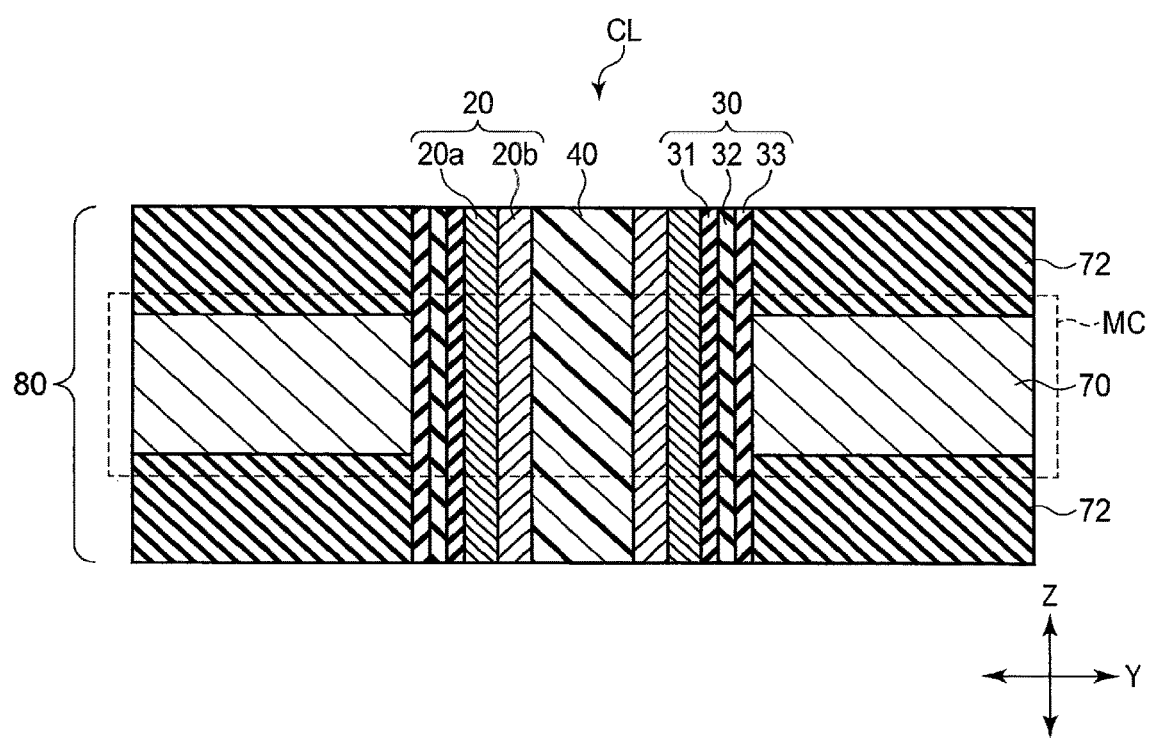
F I G. 4

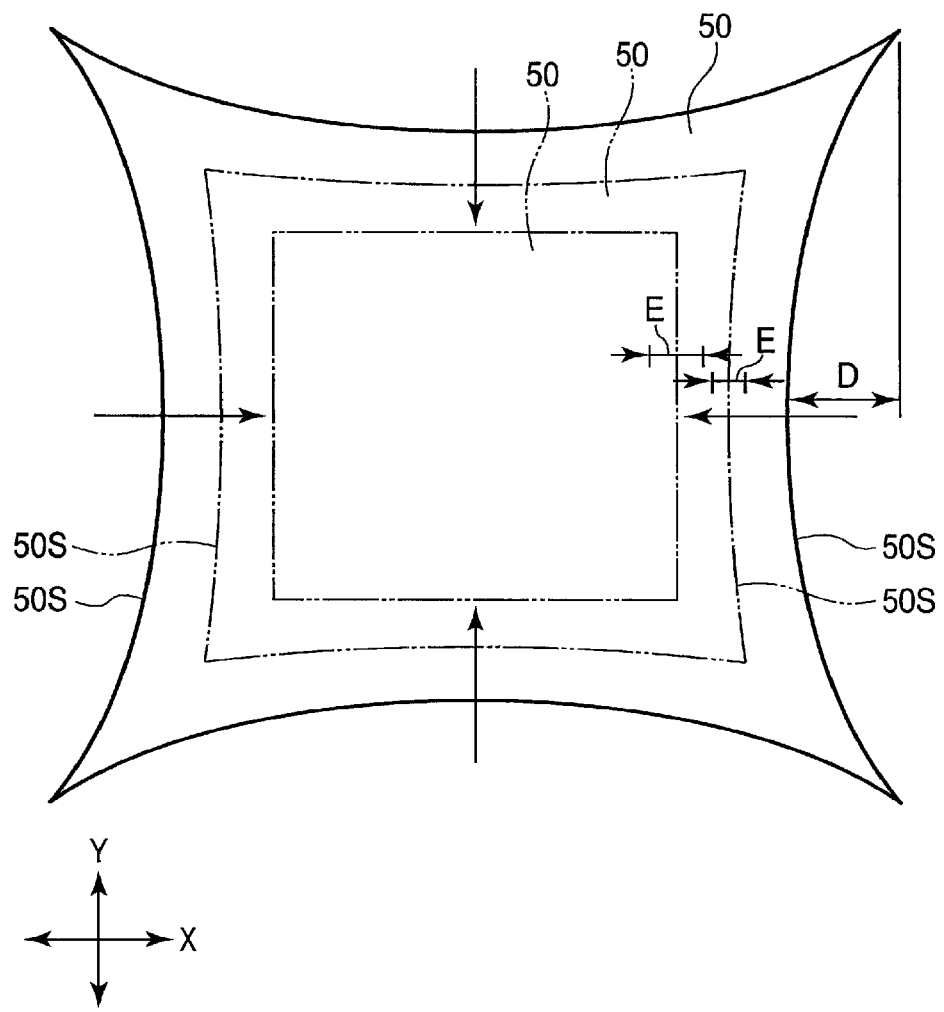
F I G. 6

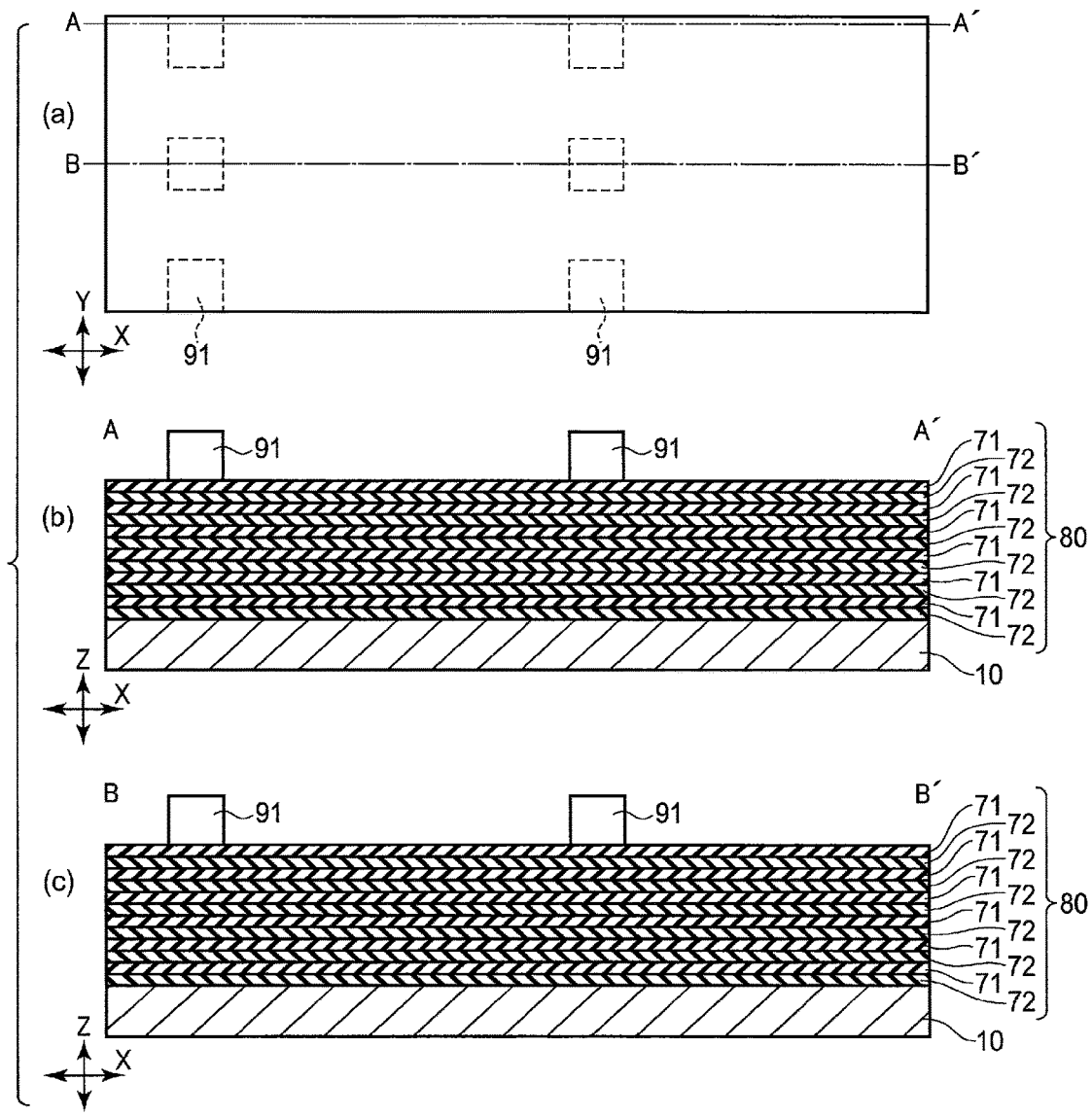
F I G. 7

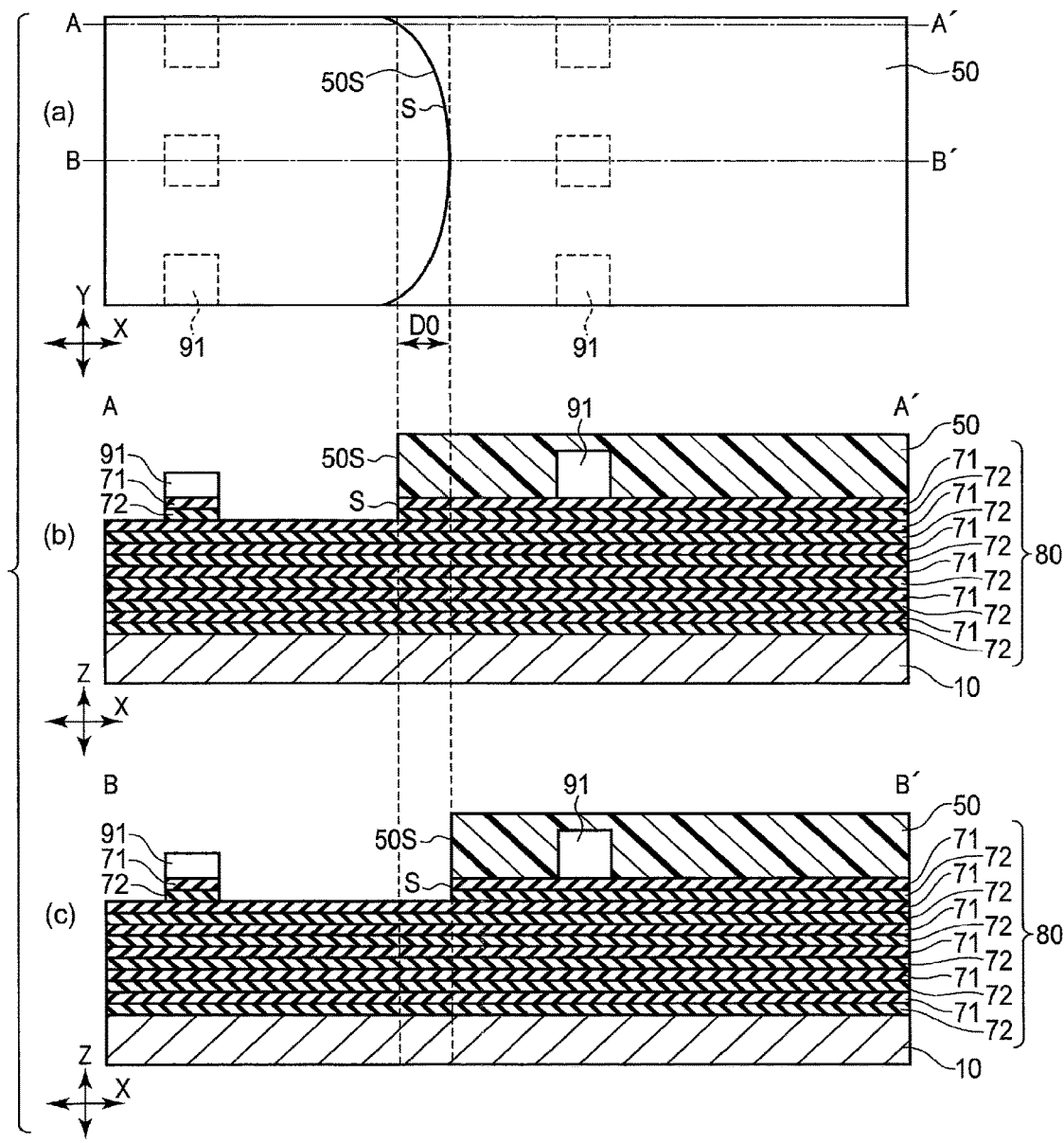
F I G. 9

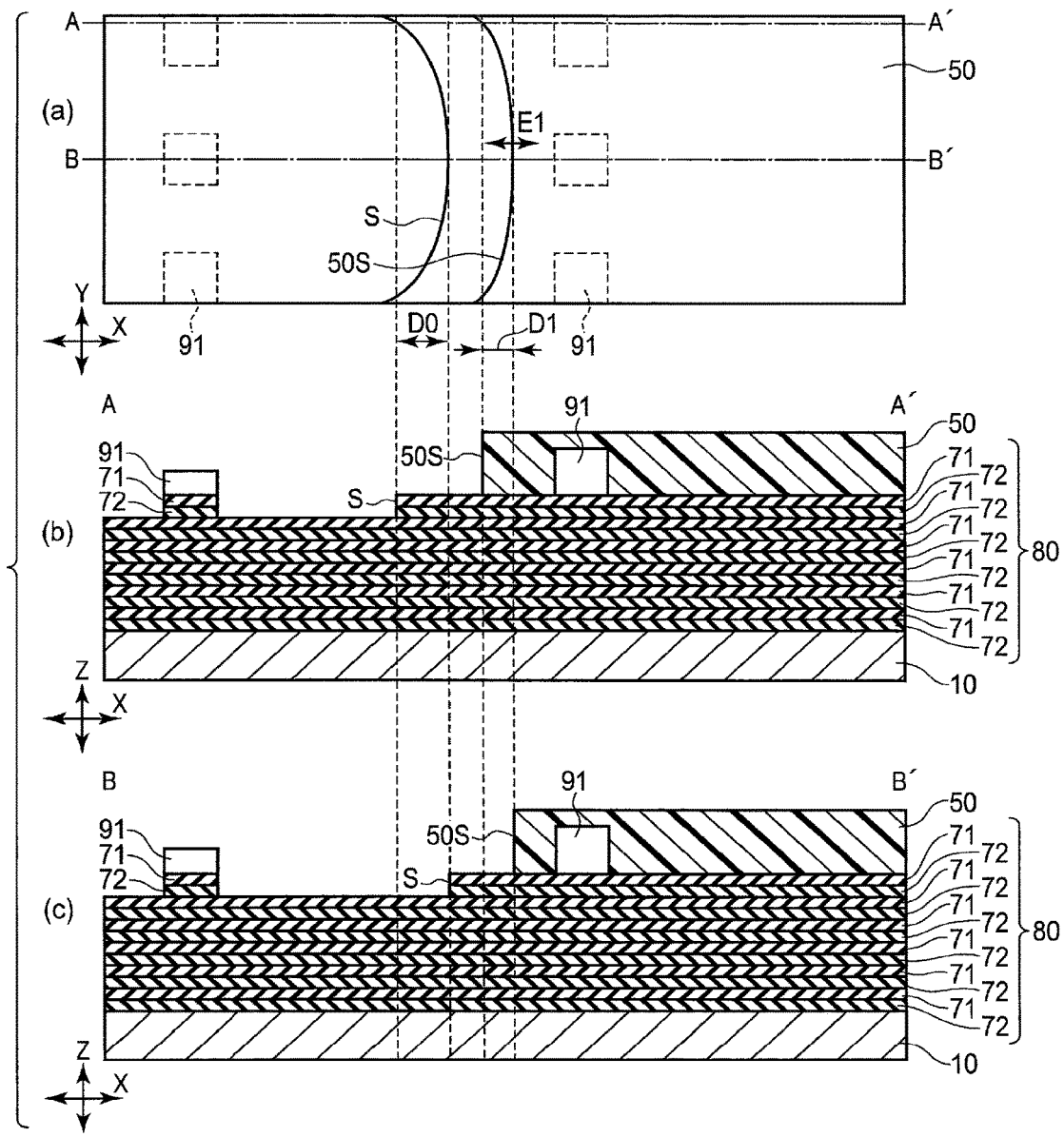
F I G. 10

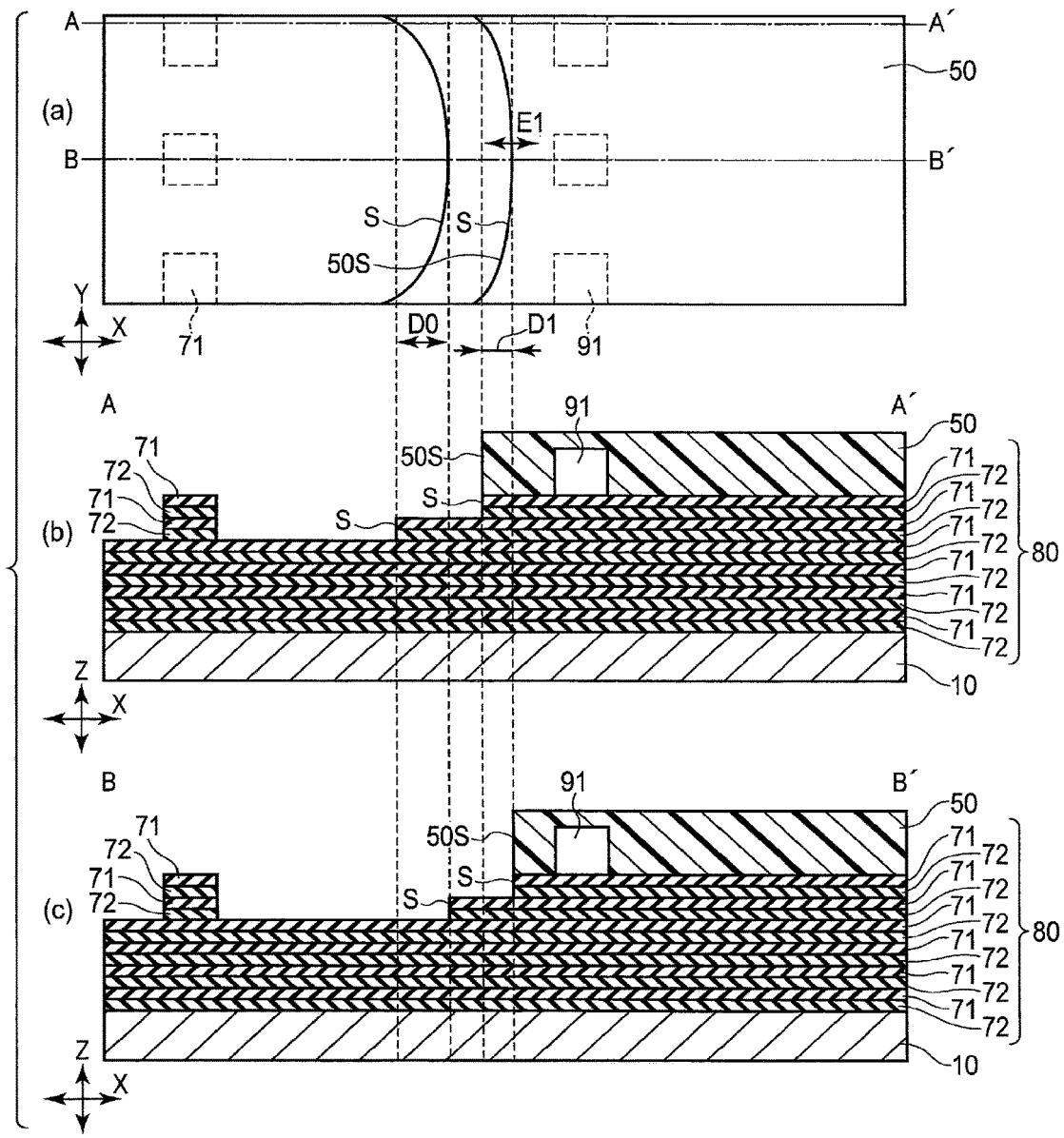
F I G. 11

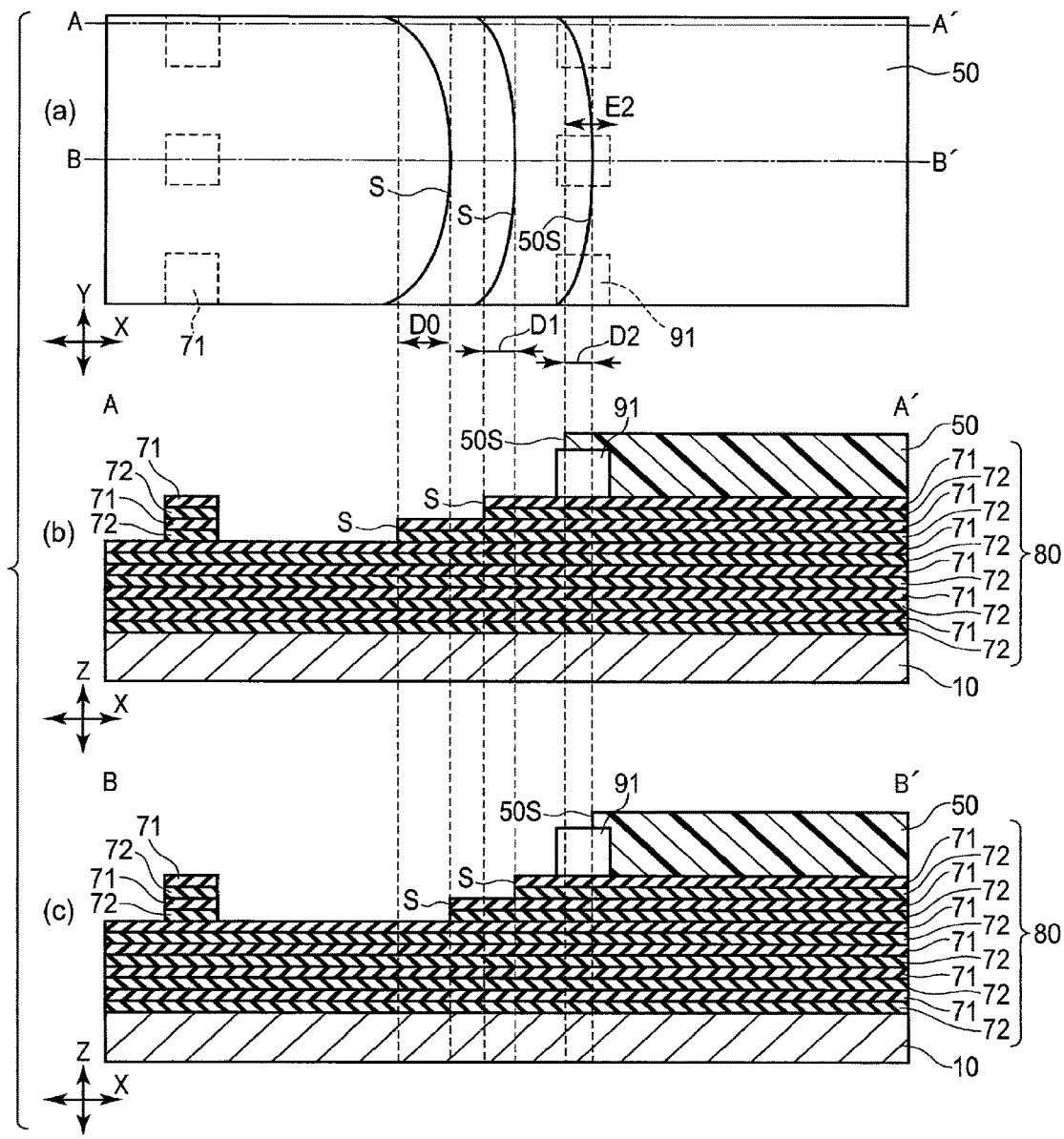
F I G. 12

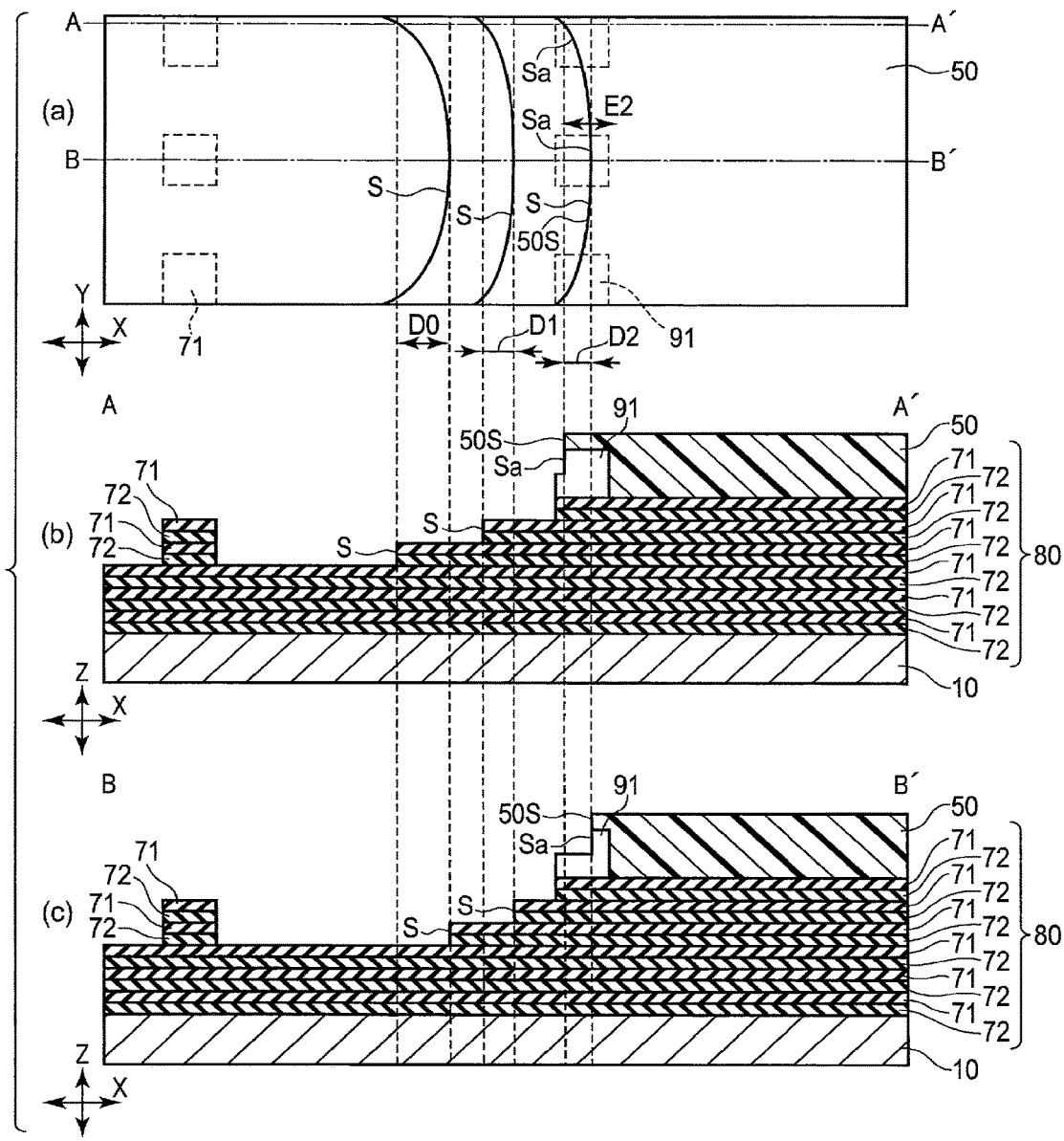
F I G. 13

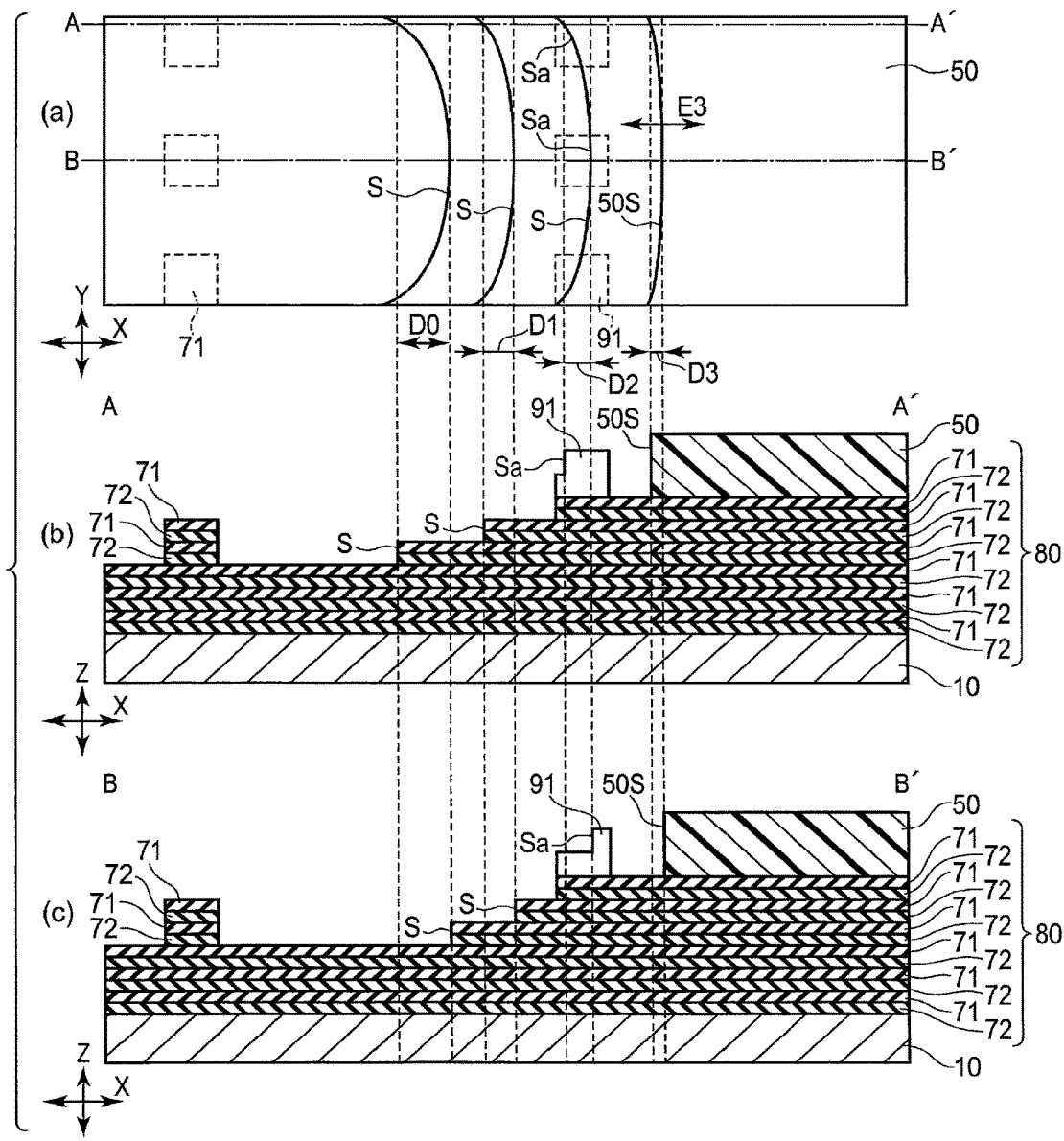
F I G. 14

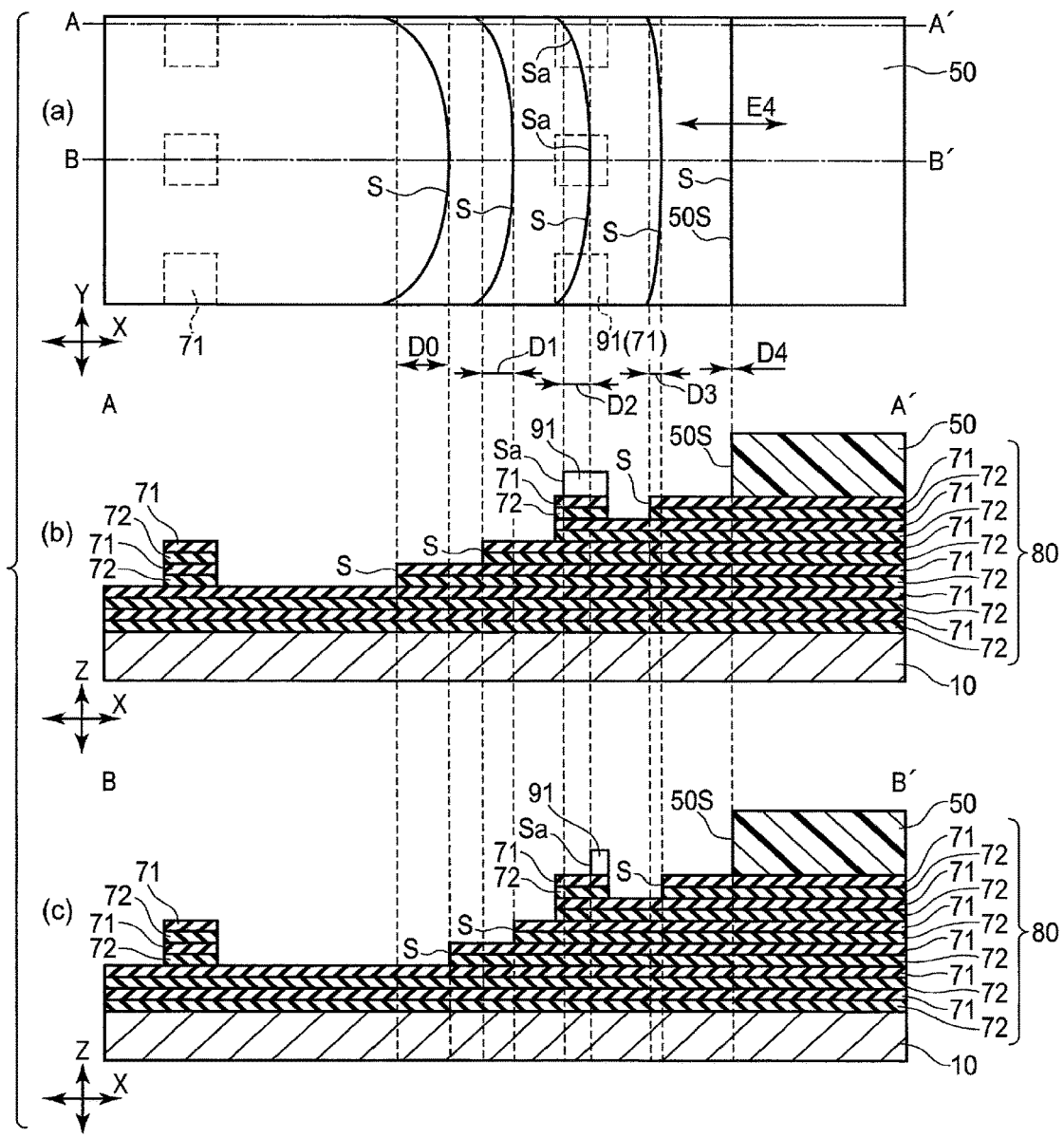
F I G. 16

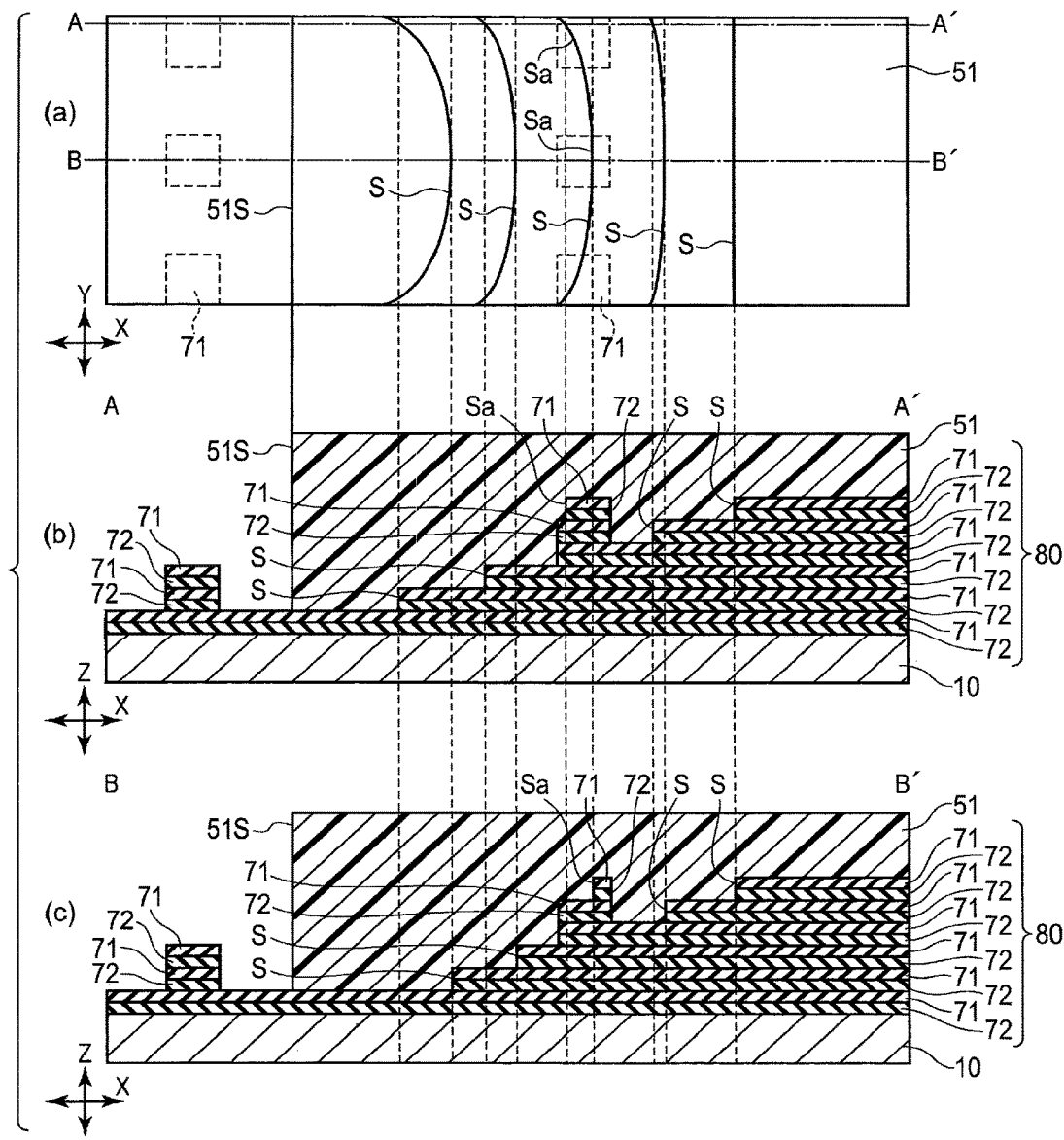
F I G. 18

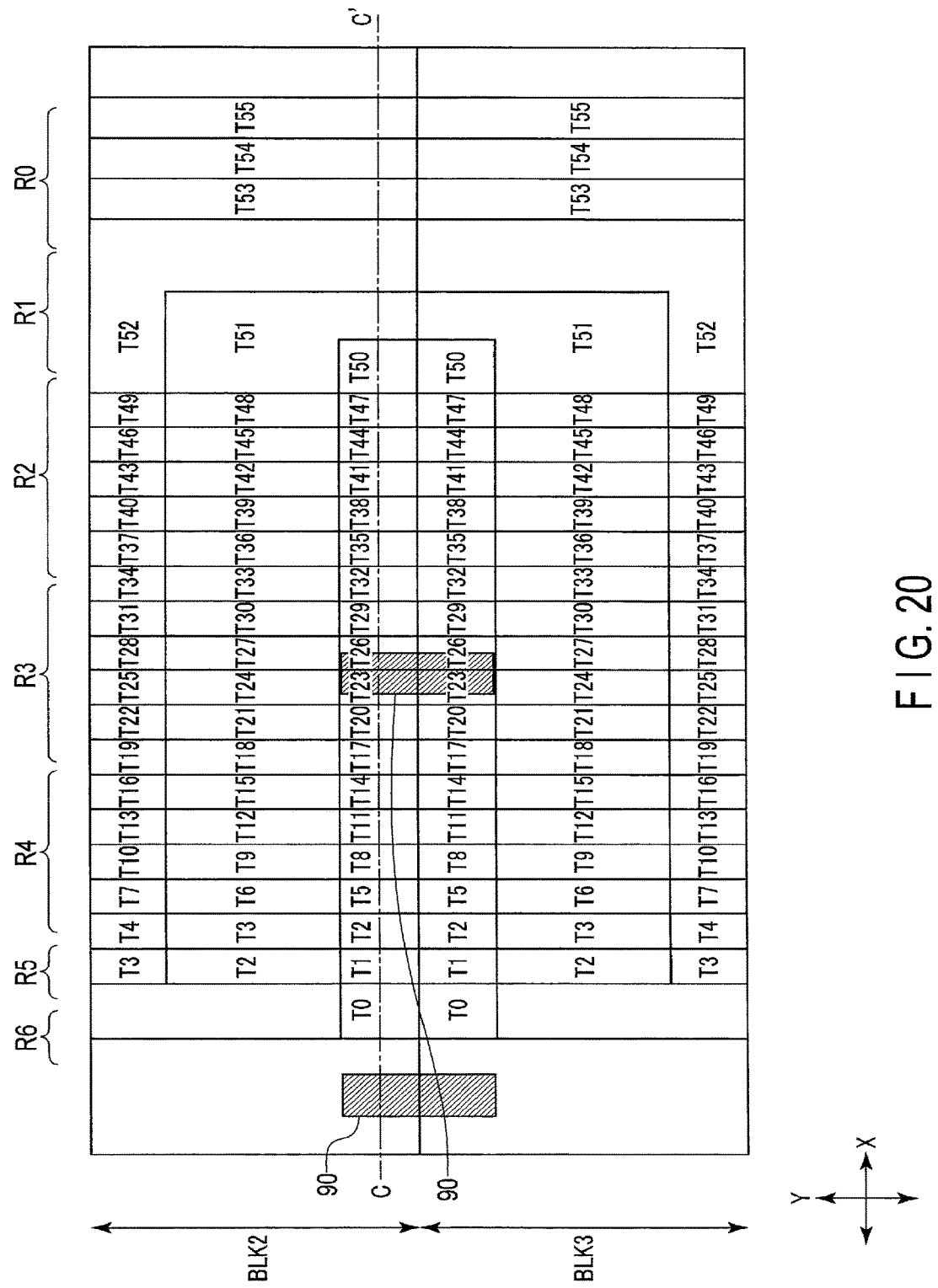
F I G. 20

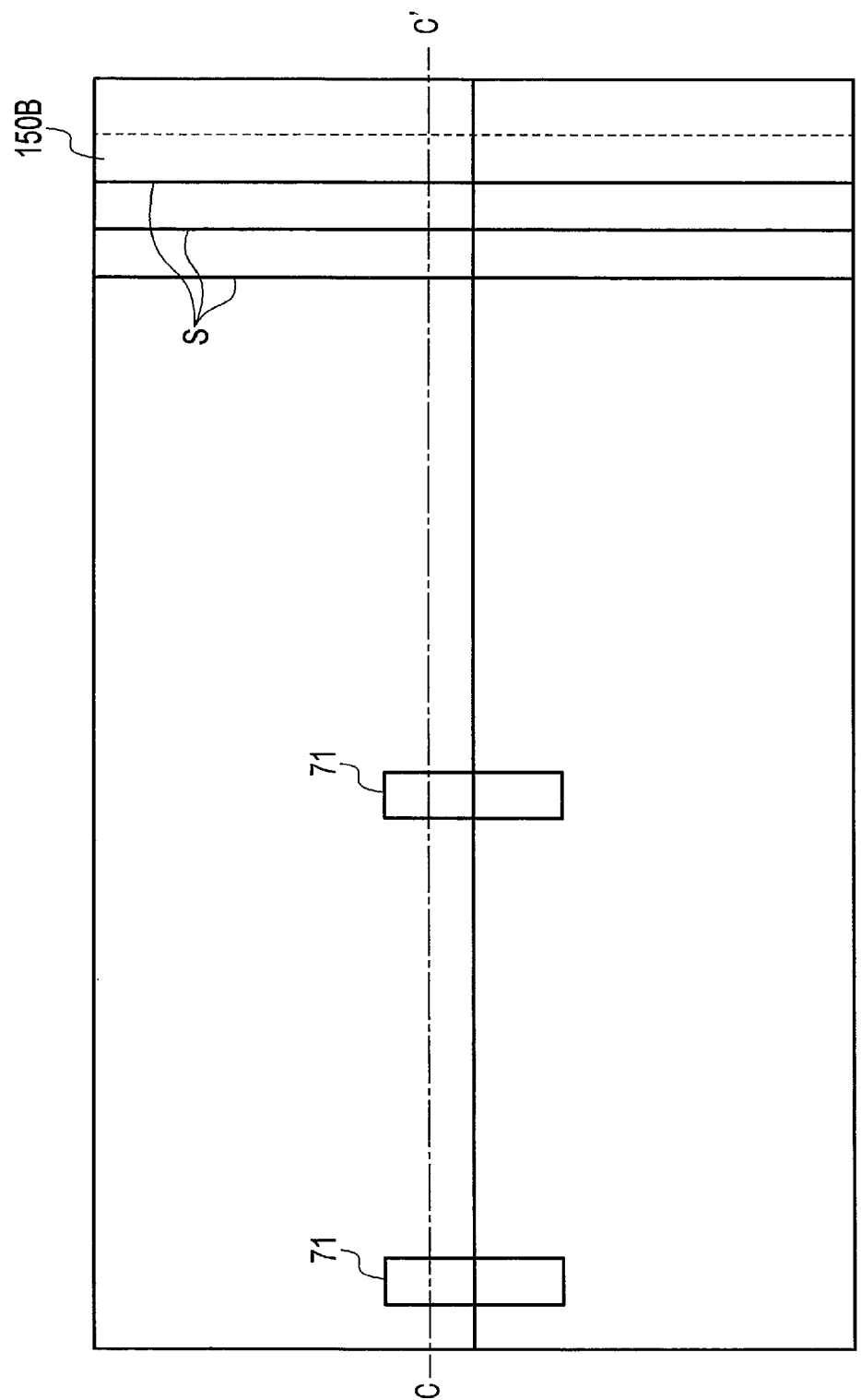
F I G. 27

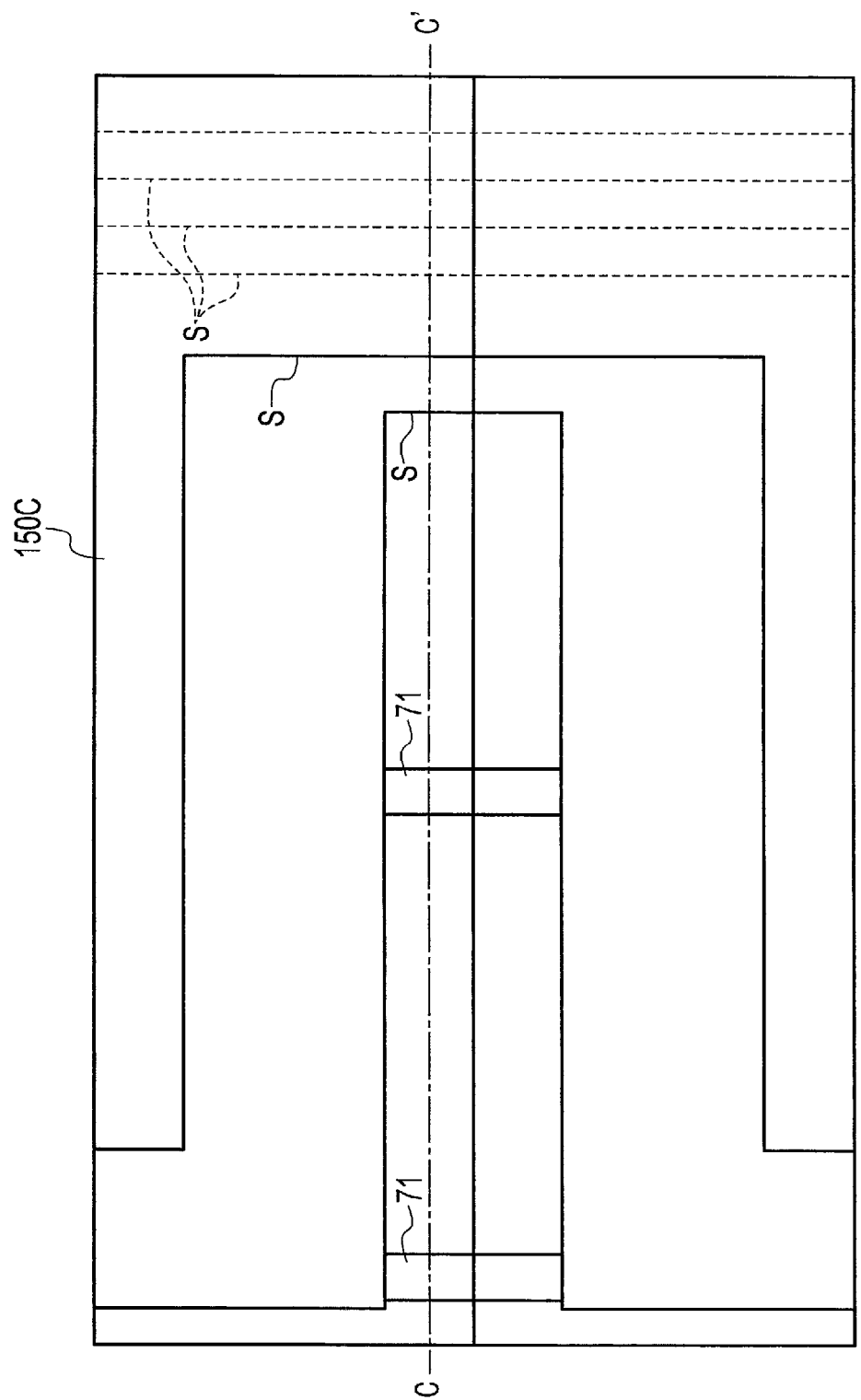
F I G. 31

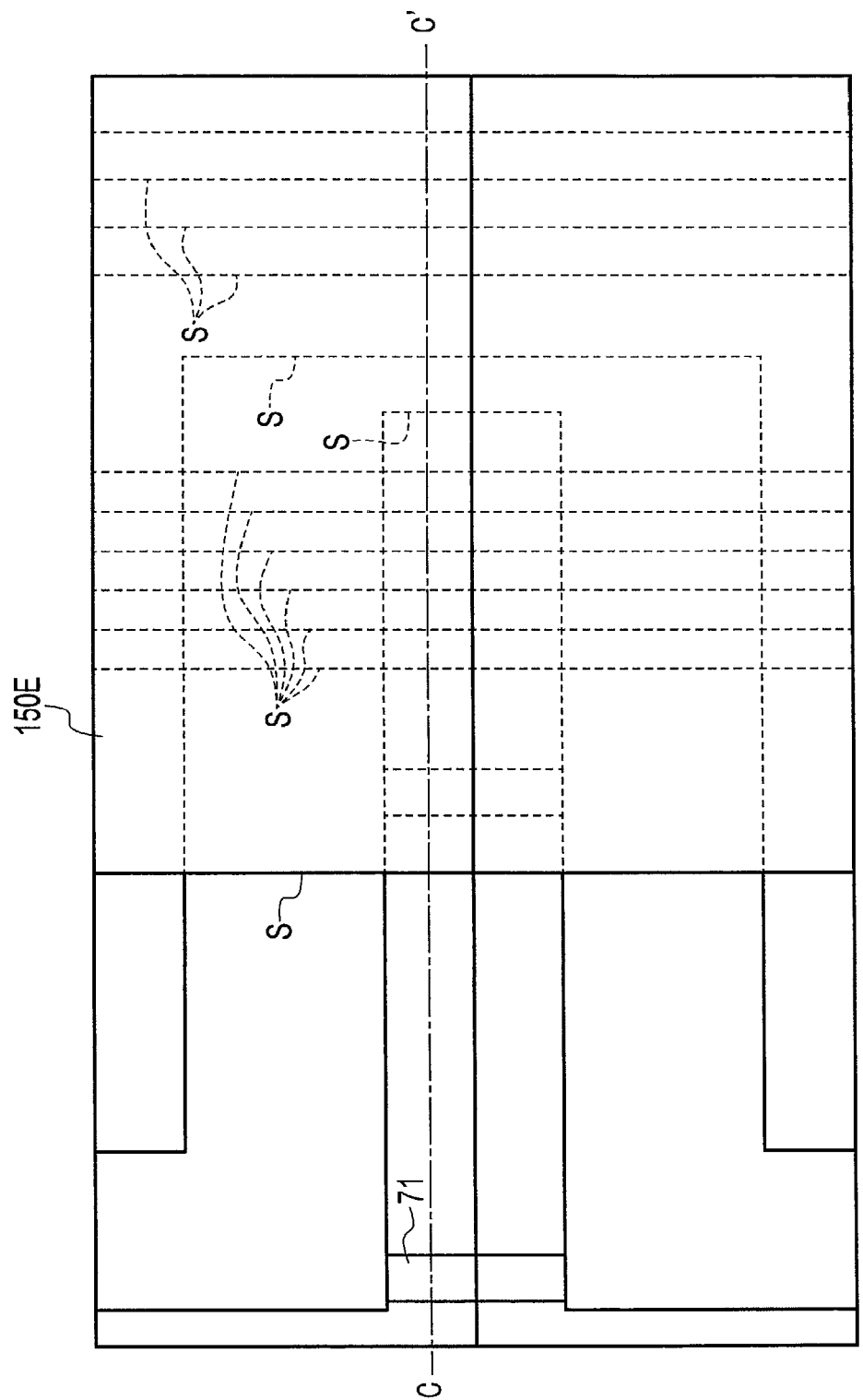
F I G. 37

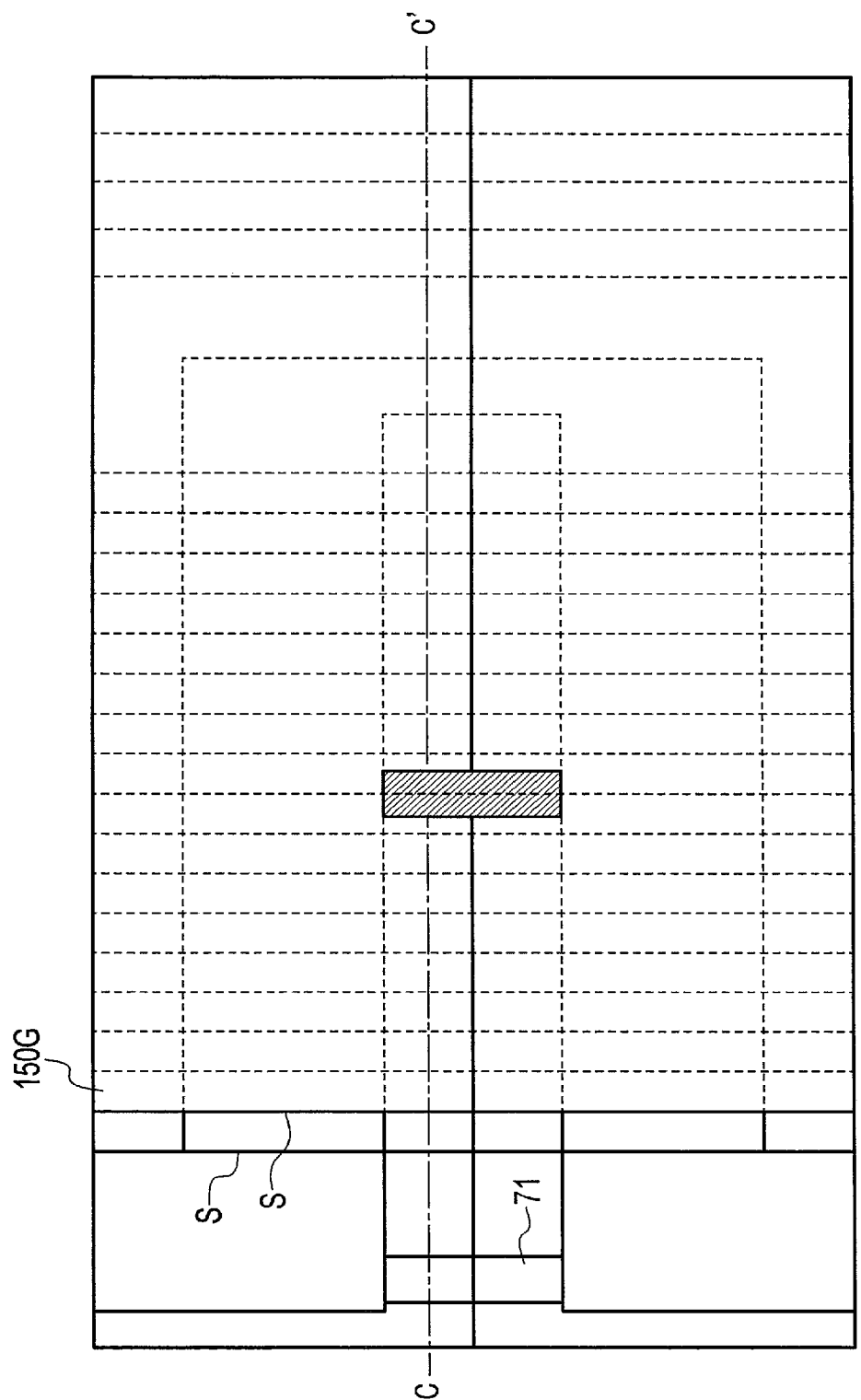
F I G. 47

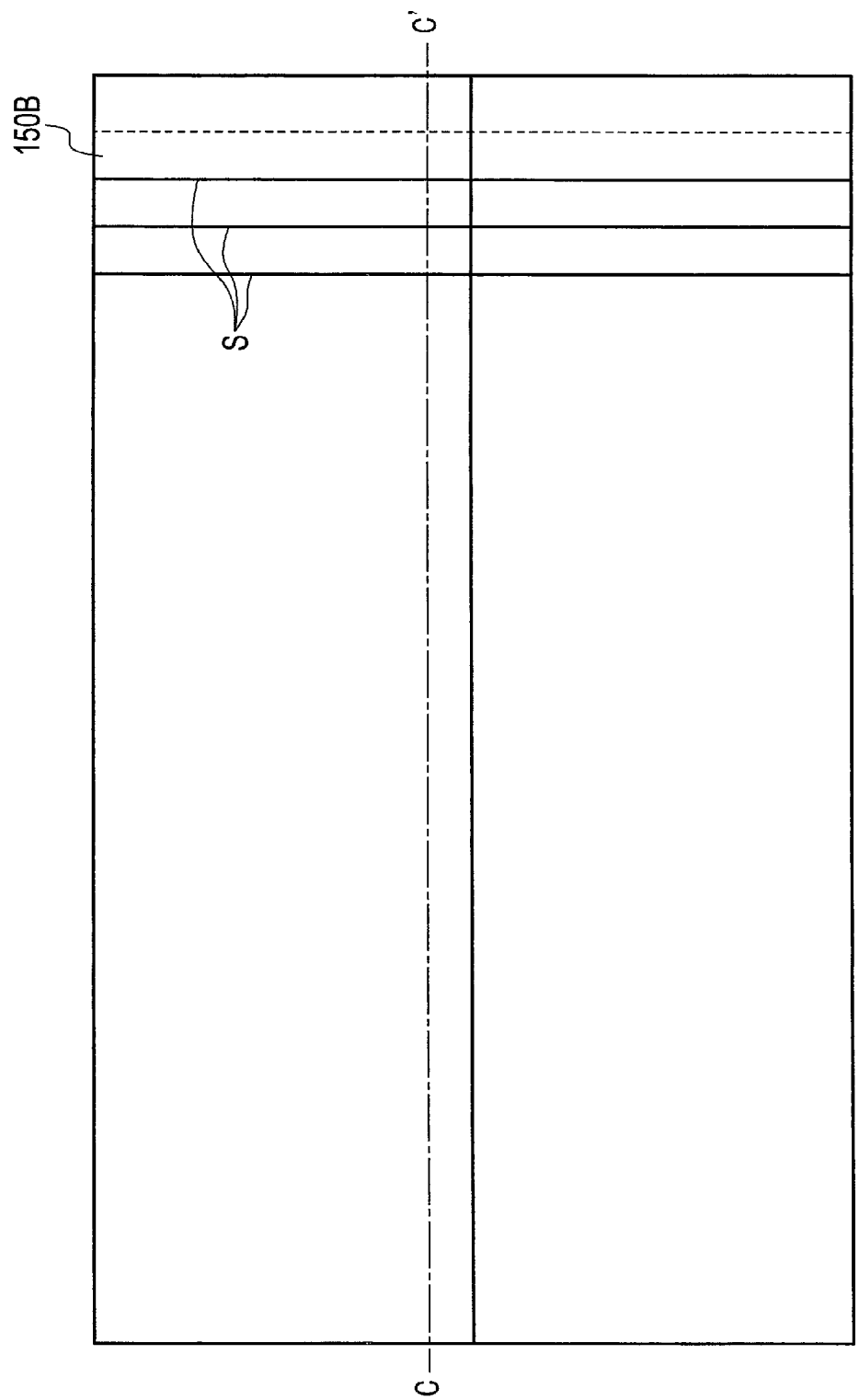
F I G. 60

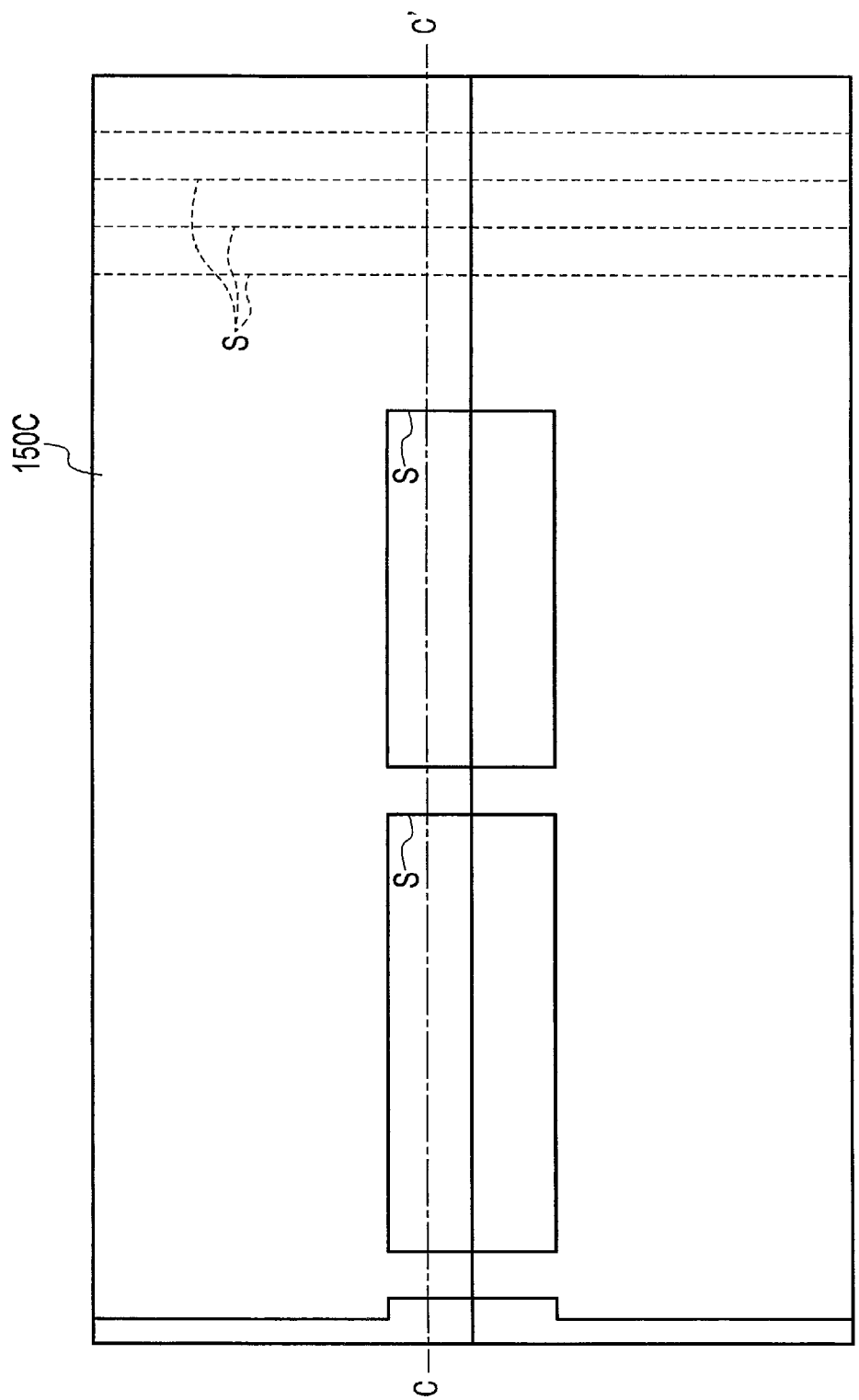
F I G. 62

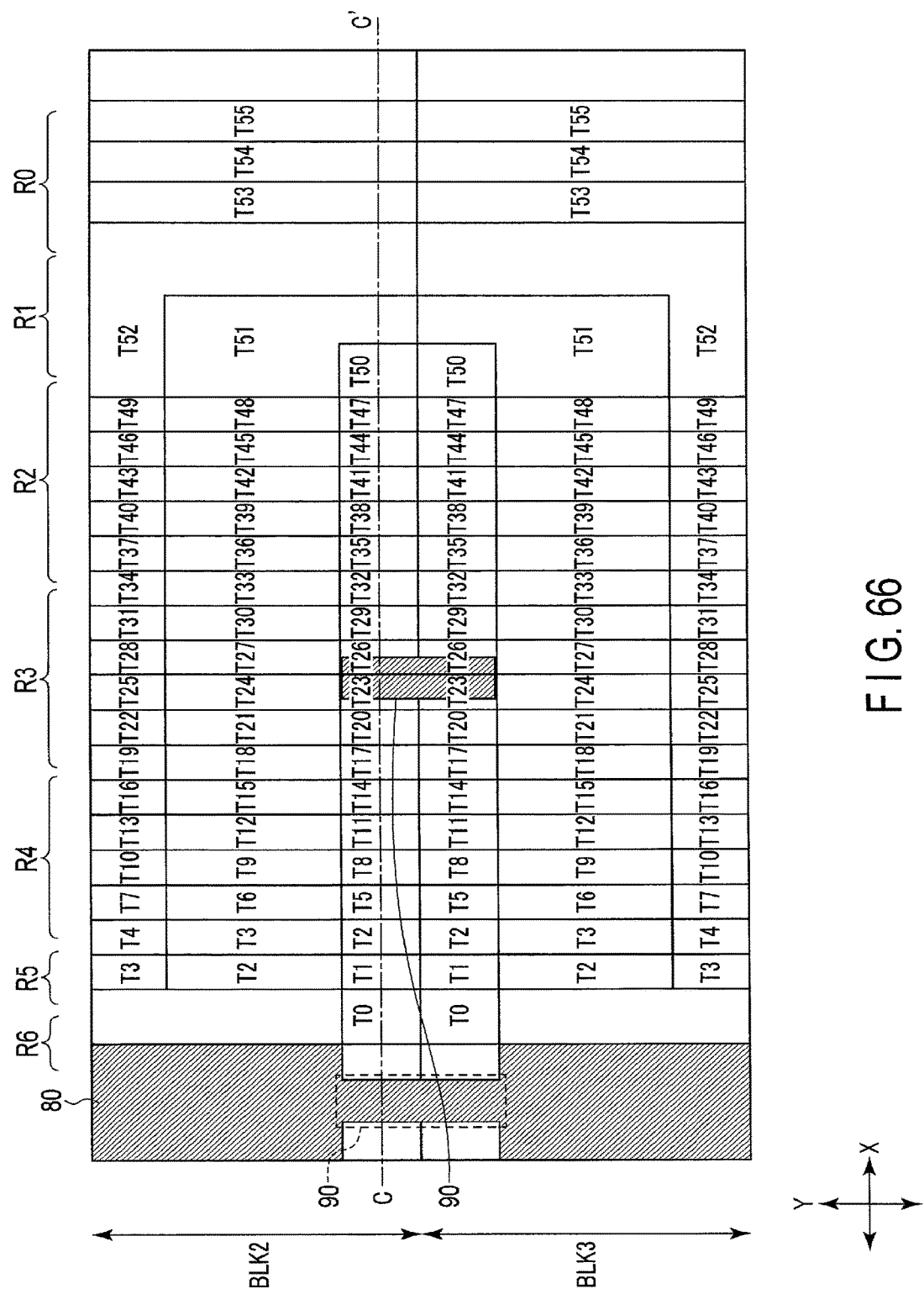
F I G. 66

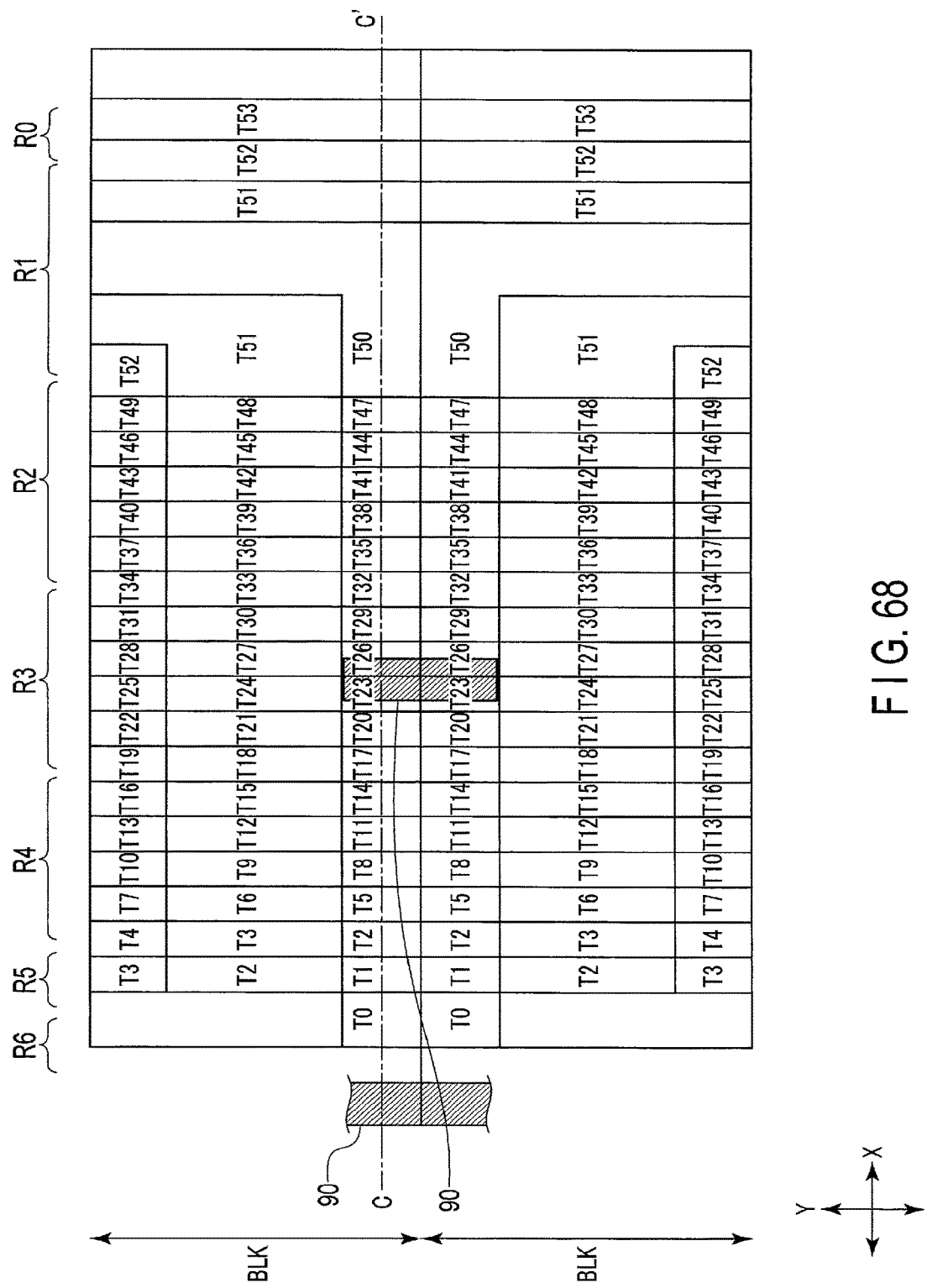
F I G. 68

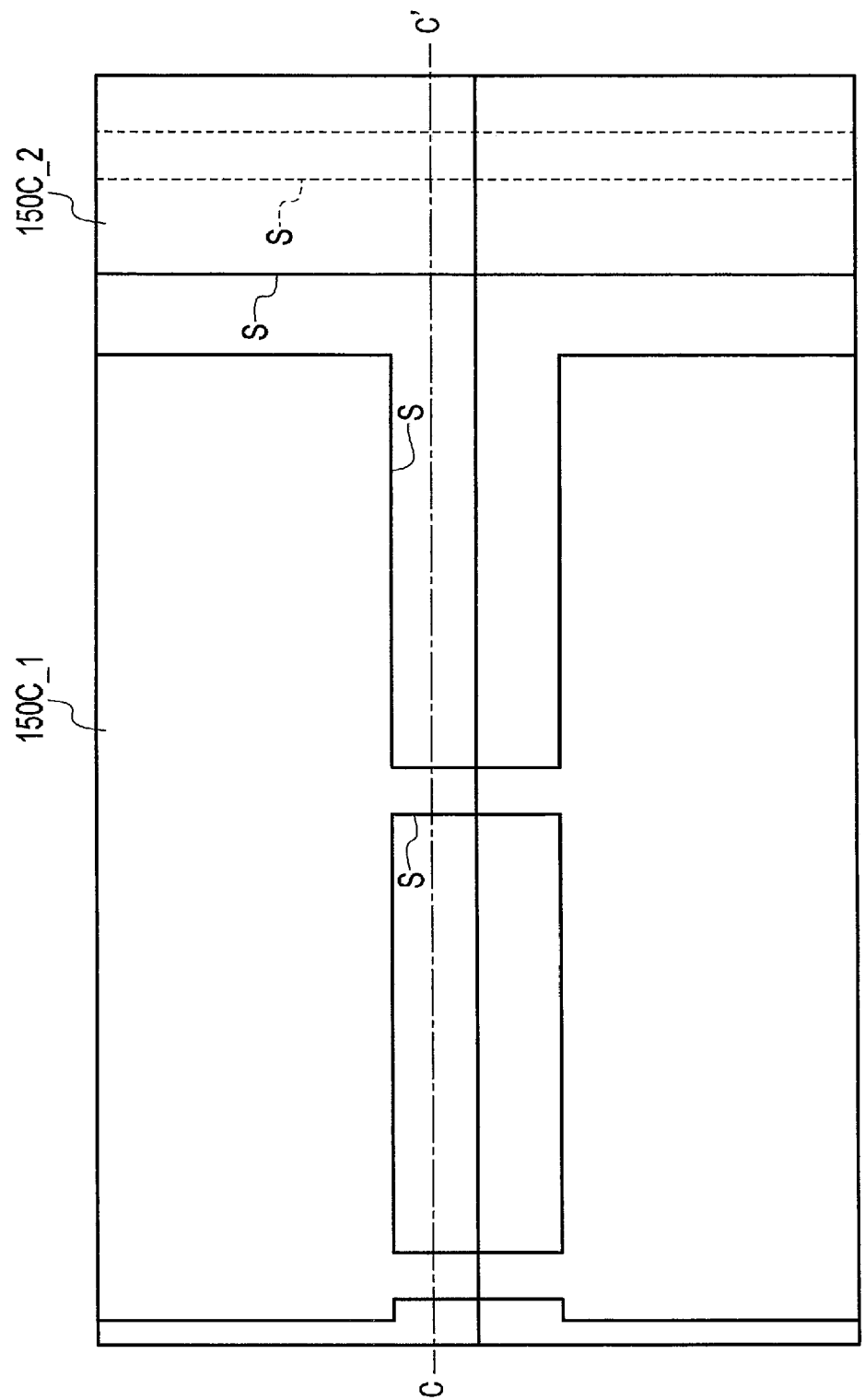
F I G. 71

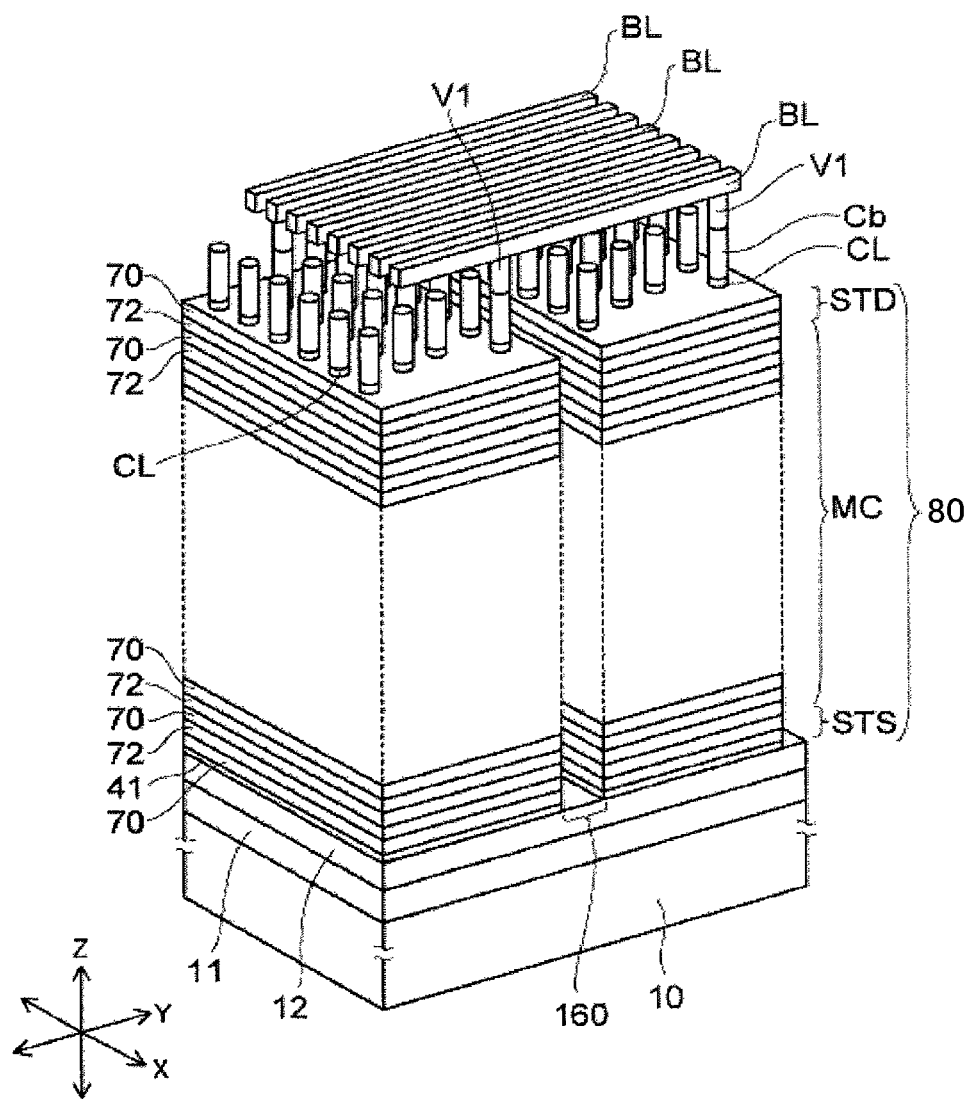
F I G. 75

SEMICONDUCTOR DEVICE

CROSS-REFERENCE TO RELATED APPLICATIONS

This application is based upon and claims the benefit of priority from Japanese Patent Application No. 2018-002788, filed Jan. 11, 2018, the entire contents of which are incorporated herein by reference.

FIELD

Embodiments described herein relate generally to a semiconductor device.

BACKGROUND

A NAND flash memory having three-dimensionally arranged memory cells is known.

BRIEF DESCRIPTION OF THE DRAWINGS

FIG. 1 is a planar view of a semiconductor device according to a first embodiment.

FIG. 2 is a perspective view of a middle portion of the semiconductor device according to the first embodiment.

FIG. 3 is a sectional view of the middle portion of the semiconductor device according to the first embodiment.

FIG. 4 is an enlarged sectional view of a part including a stack and a pillar of the semiconductor device according to the first embodiment.

FIG. 6 is a planar view of resist patterns for use in a method for manufacturing the semiconductor device according to the first embodiment.

FIGS. 7, 8, 9, 10, 11, 12, 13, 14, 15, 16, 17, and 18 are views illustrating a method for manufacturing the end portion of the semiconductor device according to the first embodiment.

FIG. 20 is a planar view of a layout of a staircase area in the semiconductor device according to the second embodiment.

FIG. 27 is a planar view illustrating the method for manufacturing the staircase area in the semiconductor device according to the second embodiment.

FIG. 31 is a planar view illustrating the method for manufacturing the staircase area in the semiconductor device according to the second embodiment.

FIG. 37 is a planar view illustrating the method for manufacturing the staircase area in the semiconductor device according to the second embodiment.

FIG. 47 is a planar view illustrating the method for manufacturing the staircase area in the semiconductor device according to the second embodiment.

FIG. 60 is a planar view illustrating the method for manufacturing the staircase area in the semiconductor device according to the fourth embodiment.

FIG. 62 is a planar view illustrating the method for manufacturing the staircase area in the semiconductor device according to the fourth embodiment.

FIG. 66 is a planar view of a layout of a first modification of the staircase area in the semiconductor device according to the fourth embodiment.

FIG. 68 is a planar view of a layout of a second modification of the staircase area in the semiconductor device according to the fourth embodiment.

FIG. 71 is a planar view illustrating the method for manufacturing the second modification of the staircase area in the semiconductor device according to the fourth embodiment.

FIG. 75 is a perspective view illustrating a first application example of the middle portion of the semiconductor device according to each embodiment.

DETAILED DESCRIPTION

Figure 5:
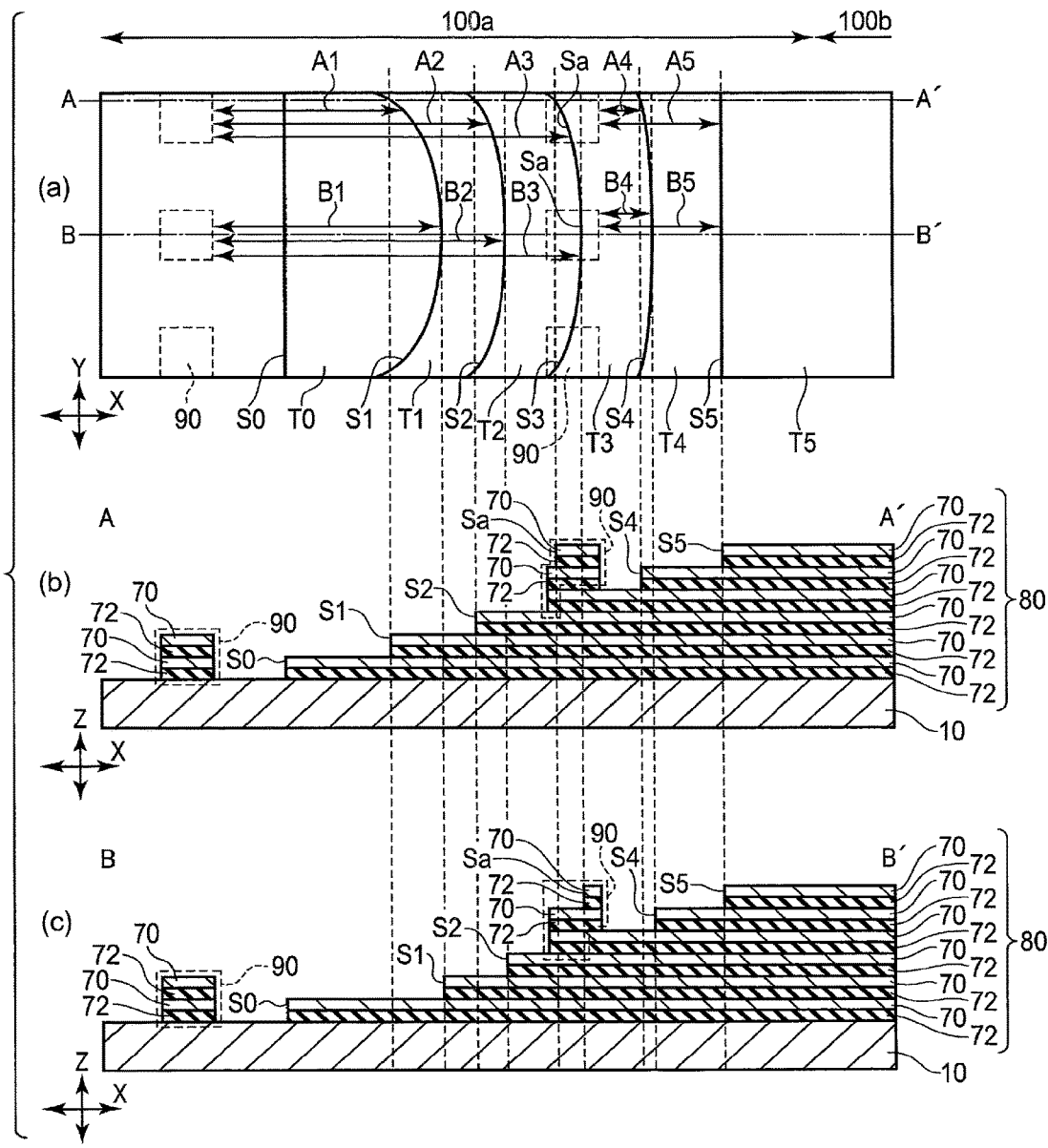
FIG. 5 is views of an end portion of the semiconductor device according to the first embodiment.

Embodiments will be described with reference to the drawings. The drawings use the same reference symbols for the same components or portions.

In general, according to one embodiment, a semiconductor device includes: a substrate; a first stack above the substrate and including first insulation layers and first conductive layers alternately stacked in a first direction, the first stack including a staircase-shaped portion in an end part of the first stack in a second direction parallel to a main face of the substrate, the staircase-shaped portion including steps and terraces corresponding to the first conductive layers, at least a part of the steps having arc shape curved along a third direction crossing the second direction; and at least one second stack above the substrate and including at least one first layer and at least one second layer stacked in the first direction, wherein, in the at least one of the second direction and the third direction, a first dimension of the first stack is larger than a second dimension of the second stack.

First Embodiment

A semiconductor device according to a first embodiment will be described with reference to FIGS. 1 to 18. By way of example, the description will assume the semiconductor device to be a NAND flash memory of a three-dimensional stack type. The drawings are schematic, and may discretionarily involve emphasized expressions, omissions, etc. For example, the drawings may show components in fewer numbers but in larger sizes than actually the case. Also, the drawings may not necessarily adopt constant numbers and dimension ratios for the components.

Structures for First Embodiment

FIG. 1 is a planar view of a semiconductor device 1 according to the first embodiment.

As shown in FIG. 1, the semiconductor device 1 includes a semiconductor substrate 10 and a stack structure 100.

The semiconductor substrate 10 is formed of, for example, silicon mono-crystals. The stack structure 100 is disposed on the semiconductor substrate 10. The semiconductor device 1 may include a multiple of the stack structures 100.

For the sake of explanation, the present disclosure will adopt an X-Y-Z orthogonal coordinate system. Two mutually-orthogonal directions that are parallel to the main face of the semiconductor substrate 10 will be referred to as an "X direction" and a "Y direction", and a direction perpendicular to the main face of the semiconductor substrate 10 will be referred to as a "Z direction". Also, "upper", "above", or their equivalent will be used for positions, etc., ahead in the Z direction assumed to extend from the semiconductor substrate 10 toward the stack structure 100. Meanwhile, "lower", "below", or their equivalent will be used for positions, etc., ahead in the Z direction assumed to extend from the stack structure 100 toward the semiconductor substrate 10. Such notations are for convenience and are unconnected with the direction of gravity.

The stack structure 100 has a shape of a substantially quadrilateral frustum. The stack structure 100 includes two end portions 100a in the X direction, each having a staircase shape. A top of a middle portion 100b located between the two end portions 100a is a substantially flat. The stack structure 100 has two end portions in the Y direction, which may each have a staircase shape or which may be substantially sheer ends.

The middle portion 100b of the stack structure 100 is a memory cell array area, and the end portions 100a are hock-up areas (lead-out areas) for word lines.

FIG. 2 is a perspective view of the memory cell array area (middle portion 100b) of the semiconductor device 1 according to the first embodiment.

As shown in FIG. 2, the middle portion 100b includes, above the semiconductor substrate 10, a stack 80, multiple pillars CL, multiple separators 60, and upper interconnects provided above the stack 80. FIG. 2 shows bit lines BL and a source line SL as the upper interconnects, for example.

The pillars CL are each formed in a substantially cylindrical shape extending inside the stack 80 in its stacking direction (Z direction). The pillars CL are disposed to have, for example, a staggered pattern in the plane that extends in the X direction and the Y direction. The pillars CL may instead have a square grid pattern in the plane that extends in the X direction and the Y direction.

The separators 60 divide the stack 80 into multiple blocks (or finger portions) in the Y direction. The separators 60 each include an interconnect portion LI extending in the X direction and the Z direction. While not illustrated, an insulation layer is provided between the interconnect portion LI and the stack 80.

Multiple bit lines BL and a source line SL are provided above the stack 80. These bit lines BL and source line SL are, for example, metal layers extending in the Y direction. The bit lines BL are apart from each other in the X direction.

The upper end of a semiconductor layer 20 (described later) of the pillar CL is connected to the bit line BL via a contact Cb and a contact V1.

A group of pillars CL is connected to one common bit line BL. Such a group of pillars CL connected to the common bit line BL includes pillars CL that are selected, for example, one-by-one from the respective blocks (or finger portions) separated in the Y direction by the separators 60.

The interconnect portion LI is connected to the source line SL via a contact Cs.

FIG. 3 is a sectional view of the middle portion 100b of the semiconductor device according to the first embodiment.

As shown in FIG. 3, the semiconductor substrate 10 includes a first portion 10a and second portions 10b.

The first portion 10a is a P-type silicon area (P-type well) provided on the surface side of the semiconductor substrate 10. The second portions 10b project upward from the top of the first portion 10a. The second portions 10b are provided below the respective pillars CL and each have a columnar shape to correspond to the pillars CL.

The second portions 10b are crystalline layers having epitaxially grown from the first portion 10a. The first portion 10a and the second portions 10b form an integral crystalline area and have substantially the same crystalline orientation. Also, as the first portion 10a, the second portions 10b are P-type silicon areas. The first portion 10a and the second portions 10b contain, for example, boron as a P-type impurity.

An insulation layer 41 is provided on the first portion 10a and around the second portions 10b.

The stack 80 is disposed on the semiconductor substrate 10 via the insulation layer 41. The stack 80 includes multiple conductive layers 70 and multiple insulation layers 72. The conductive layers 70 are stacked in the direction (Z direction) perpendicular to the main face of the semiconductor substrate 10, with the insulation layer (insulator) 72 interposed between the neighboring layers. In other words, the conductive layers 70 and the insulation layers 72 are alternately stacked.

The conductive layers 70 are, for example, metal layers. The conductive layers 70 may be tungsten layers containing tungsten as a main component, or molybdenum layers containing molybdenum as a main component. The insulation layers 72 are, for example, silicon oxide layers containing silicon oxide as a main component.

The pillars CL extend inside the stack 80 in the stacking direction (Z direction). The pillar includes a core layer 40, the aforementioned semiconductor layer 20, and a memory layer 30, which are disposed in this order from the center of pillar (axis in Z direction).

The core layer 40 is provided as a central portion of the pillar CL. The semiconductor layer 20 is provided around the core layer 40. That is, the semiconductor layer 20 is provided between the core layer 40 and the memory layer 30. The semiconductor layer 20 includes a body layer 20b and a cover layer 20a provided around the body layer 20b. The body layer 20b has a lower end connected to the second portion 10b of the semiconductor substrate 10. The memory layer 30 is provided around the semiconductor layer 20. That is, the memory layer 30 is provided between the semiconductor layer 20 and the stack 80.

FIG. 4 is an enlarged partial sectional view showing the stack 80 and the pillar CL of the semiconductor device according to the first embodiment.

As shown in FIG. 4, the memory layer 30 includes a tunnel insulation layer 31, a charge storage layer 32, and a block insulation layer 33.

The tunnel insulation layer 31 is provided between the semiconductor layer 20 and the charge storage layer 32. The charge storage layer 32 is provided between the tunnel insulation layer 31 and the block insulation layer 33. The block insulation layer 33 is provided between the charge storage layer 32 and the conductive layer 70 (as well as the insulation layers 72).

The semiconductor layer 20, the memory layer 30, and the conductive layer 70 form a memory cell MC. The memory cell MC has a vertical transistor structure in which the semiconductor layer 20 is surrounded by the conductive layer 70 via the memory layer 30. The stack 80 includes a multiple of the memory cells MC.

In the memory cell MC of such a vertical transistor structure, the semiconductor layer 20 functions as a channel. The conductive layer 70 functions as a control gate (word line). The charge storage layer 32 functions as a data storage layer that stores charges injected from the semiconductor layer 20.

The memory cells MC are, for example, charge-trap memory cells. The charge storage layer 32 includes a component (e.g. a silicon nitride layer) possessing plenty of trap sites for capturing charges within a layer of an insulating property. The charge storage layer 32 may instead be a conductive floating gate surrounded by an insulator.

The tunnel insulation layer 31 serves as a potential barrier when charges are injected from the semiconductor layer 20 into the charge storage layer 32 or when the charges stored in the charge storage layer 32 are released to the semiconductor layer 20. The tunnel insulation layer 31 includes, for example, a silicon oxide layer.

The block insulation layer 33 prevents the charges stored in the charge storage layer 32 from being released to the conductive layer 70. The block insulation layer 33 also prevents the charges from tunneling back to the pillar CL from the conductive layer 70.

The block insulation layer 33 includes, for example, a silicon oxide layer. The block insulation layer 33 may also have a structure in which a silicon oxide layer and a metal oxide layer are stacked. In this case, the silicon oxide layer is provided between the charge storage layer 32 and the metal oxide layer, and the metal oxide layer is provided between the silicon oxide layer and the conductive layer 70. The metal oxide layer may be, for example, an aluminum oxide layer, a zirconium oxide layer, and a hafnium oxide layer.

Returning to FIG. 2, a drain-side select transistor STD is provided in the upper layer portion of the stack 80. A source-side select transistor STS is provided at the lower layer portion of the stack 80.

Among the multiple conductive layers 70 of the stack 80, at least the uppermost conductive layer 70 functions as a control gate of the drain-side select transistor STD. Among the multiple conductive layers 70 of the stack 80, at least the lowermost conductive layer 70 functions as a control gate of the source-side select transistor STS. The second portion 10b of the semiconductor substrate 10 serves as a channel of the source-side select transistor STS.

The multiple memory cells MC are provided between the drain-side select transistor STD and the source-side select transistor STS. The multiple memory cells MC, the drain-side select transistor STD, and the source-side select transistor STS are connected in series through the semiconductor layer 20 of the pillar CL. Thereby, one memory string is formed. Such memory strings are arranged in, for example, a staggered pattern in a plane direction parallel to the X-Y plane. The multiple memory cells MC are arranged three-dimensionally in the X direction, the Y direction, and the Z direction.

FIG. 5 shows certain aspects of the hock-up area (end portion 100a) of the semiconductor device 1 according to the first embodiment. More specifically, (a) of FIG. 5 is a planar view of the end portion 100a; (b) of FIG. 5 is a sectional view taken along the line A-A' in (a) of FIG. 5; and (c) of FIG. 5 is a sectional view taken along the line B-B' in (a) of FIG. 5.

As shown in views (a) to (c) of FIG. 5, the end portion 100a includes the stack 80 and multiple stacks 90. These stacks 80 and 90 are covered by inter-layer insulation layers (not illustrated). Note that the number of stacked layers in the stacks 80 and 90 are not limited to what is shown in FIG. 5.

The stack 80 is disposed on the semiconductor substrate 10. The stack 80 includes the multiple conductive layers 70 and the multiple insulation layers 72. The conductive layers 70 are stacked in the direction (Z direction) perpendicular to the main face of the semiconductor substrate 10, with the insulation layer 72 interposed between the neighboring layers. In other words, the conductive layers 70 and the insulation layers 72 are alternately stacked.

The stack 80 has a staircase shape in the end portion 100a. More specifically, in the end portion 100a, terraces T (T0 to T5) and steps S (S0 to S5) is formed, one-by-one from the lower side and correspondingly to the respective conductive layers 70. The terraces T each refer to a top face of a portion of the corresponding conductive layer 70, where other conductive layers 70 do not lie directly above. The terraces T are substantially parallel to the X-Y plane. The steps S each refer to a vertical face or an inclined face between two terraces adjacent to each other in the X direction. Each of the steps S is a face formed by, for example, an end face of one conductive layer 70 and an end face of one insulation layer 72. The steps S are substantially parallel to the plane that includes the Y direction.

The multiple stacks 90 are formed on the semiconductor substrate 10 on the external side of the stack 80 in the X direction (opposite to the middle portion 100b), or on the staircase-shaped stack 80. The stacks 90 are arranged in a matrix where they are disposed along the Y direction and the X direction. FIG. 5 shows an arrangement in which three stacks 90 are aligned along the Y direction and two stacks 90 are aligned along the X direction, but the number of the stacks 90 is not limited to this.

The stacks 90 each include the multiple conductive layers 70 and the multiple insulation layers 72. The conductive layers 70 are stacked in the direction (Z direction) perpendicular to the main face of the semiconductor substrate 10, with the insulation layer 72 interposed between the neighboring layers. In other words, the conductive layers 70 and the insulation layers 72 are alternately stacked. In this example, the stacks 90 each include two conductive layers 70 and two insulation layers 72. The stacks 90 are partial divisions from the stack 80. The stacks 90 include the same layers as the stack 80 does, and project upward in the Z direction on both sides of the stack 80 as shown in FIG. 5. The stacks 90 are used as positional references for the resist formation during manufacturing processes, or as positional references for the steps S of the stack 80.

The stacks 90 provided on the semiconductor substrate 10 have substantially flat tops. On the other hand, the stacks 90 provided on the stack 80, where a given step S is located, include respective steps Sa conforming to this step S.

In this example, the steps S1 to S5 of the stack 80 excluding the lowermost step S0 each have an arc shape along the Y direction. More specifically, the steps S1 to S5 of the stack 80 are curved in concave form so that their Y-direction centers are more inside (or closer to the middle portion 100b) than their respective Y-direction both ends. The lowermost step S0 has a planar shape extending in the Y direction.

As such, with reference to the positions of the stacks 90 aligned along the Y direction, the distances A (A1 to A5) from a given stack 90 on the Y-direction end side of the semiconductor substrate 10 to the steps S (S1 to S5) are shorter than the corresponding distances B (B1 to B5) from the stack 90 on the Y-direction center side of the semiconductor substrate 10 to the steps S (S1 to S5). The "distance" here means a linear distance along the X direction. Note that, in this explanation, the stacks 90 formed on the semiconductor substrate 10 on the X-direction external side of the stack 80 have been used as the references for A1 to A3 and B1 to B3, which are the distances to the steps S1 to S3, the stacks 90 formed on the stack 80 have been used as the references for A4 to A5 and B4 to B5, which are the distances to the steps S4 to S5. No limitation is intended by this explanation.

Aside from the lowermost step S0, the lower the steps S, the greater the degree of the concave curve. Accordingly, the differences between the distances B (B1 to B5) and the respective distances A (A1 to A5) are larger in the lower steps S.

Manufacturing Method for First Embodiment

FIG. 6 is a planar view of resist patterns for use in the method for manufacturing the semiconductor device 1 according to the first embodiment.

In the course of the method for manufacturing the semiconductor device 1 according to the first embodiment, resist patterns 50 (as shown in FIG. 6) are formed on the stack 80. The stack 80 is processed by alternately repeating the etching that uses a resist pattern 50 as a mask, and the slimming of the resist pattern 50, so that the end portions 100a of the stack 80 with a staircase shape are formed.

It will be assumed for the first embodiment that the initial shape of the resist patterns 50 includes, when viewed from the Z direction, a concave curve in at least each side face 50S facing in the X direction. For example, the shape of the resist pattern 50 when viewed from the Z direction may be a quadrate with acute corners and with a concave curve in all the side faces. An X-direction length of the Y-direction end portion of the resist pattern S0 is longer than that of the Y-direction center portion of the resist pattern 50. In the following description, an absolute value of the difference in X-direction position between the Y-direction center portion and the Y-direction end portion of the resist pattern 50 will be referred to as a "shape difference D". In the initial state, the shape difference D has a value larger than 0. Note that FIG. 6 overdraws the shape difference D.

When the resist patterns 50 are subjected to the slimming, the recession amount of the side faces 50S inevitably varies within a certain range. An absolute value of the difference between the actual position of the side face 50S after slimming and the design value will be referred to as an "error E". The smaller the sum of the shape difference D and the error E, the higher the shape accuracy of the end portion 100a.

The error E accumulates with every slimming. As such, repeating the slimming of the resist pattern 50 increases the error E. Meanwhile, slimming of the resist pattern 50 causes the end portions of its side face to largely recede as compared to the center portion of the side face. In other words, the corners of the resist pattern 50 are taken off. Accordingly, as the slimming is repeated, the shape of the resist patterns 50 when viewed from the Z direction approaches a rectangle, and the shape difference D becomes small.

Therefore, according to the first embodiment, increase in the error E and decrease in the shape difference D will balance each other out when the slimming has been repeated, so that a good shape accuracy can be maintained on the whole.

The method for manufacturing the semiconductor device 1 according to the first embodiment will be described in more detail.

FIGS. 7 to 18 illustrate the method for manufacturing the end portions 100a of the semiconductor device 1 according to the first embodiment. More specifically, in FIGS. 7 to 18, each view (a) is a planar view of the end portion 100a, each view (b) is a sectional view taken along the line A-A' in the corresponding view (a), and each view (c) is a sectional view taken along the line B-B' in the corresponding view (a).

First, as shown in FIG. 7, the insulation layers 72 and sacrifice layers 71 are alternately stacked on the semiconductor substrate 10 to form the stack 80. The insulation layers 72 are, for example, silicon oxide layers. The sacrifice layers 71 include a material that allows an etching selectivity ratio to be set with respect to the insulation layers 72. The sacrifice layers 71 are, for example, silicon nitride layers.

Thereafter, hard masks 91 are formed on the uppermost sacrifice layer 71. The hard masks 91 are provided at the areas where the respective stacks 90 will be formed. That is, the multiple hard masks 91 are formed in a matrix along the Y direction and the X direction. The hard masks 91 are formed as, for example, silicon nitride layers or silicon oxide layers. The process behind the formation of the hard masks 91 and what constitutes them will be described in detail in the context of the second embodiment and onward.

Figure 8:
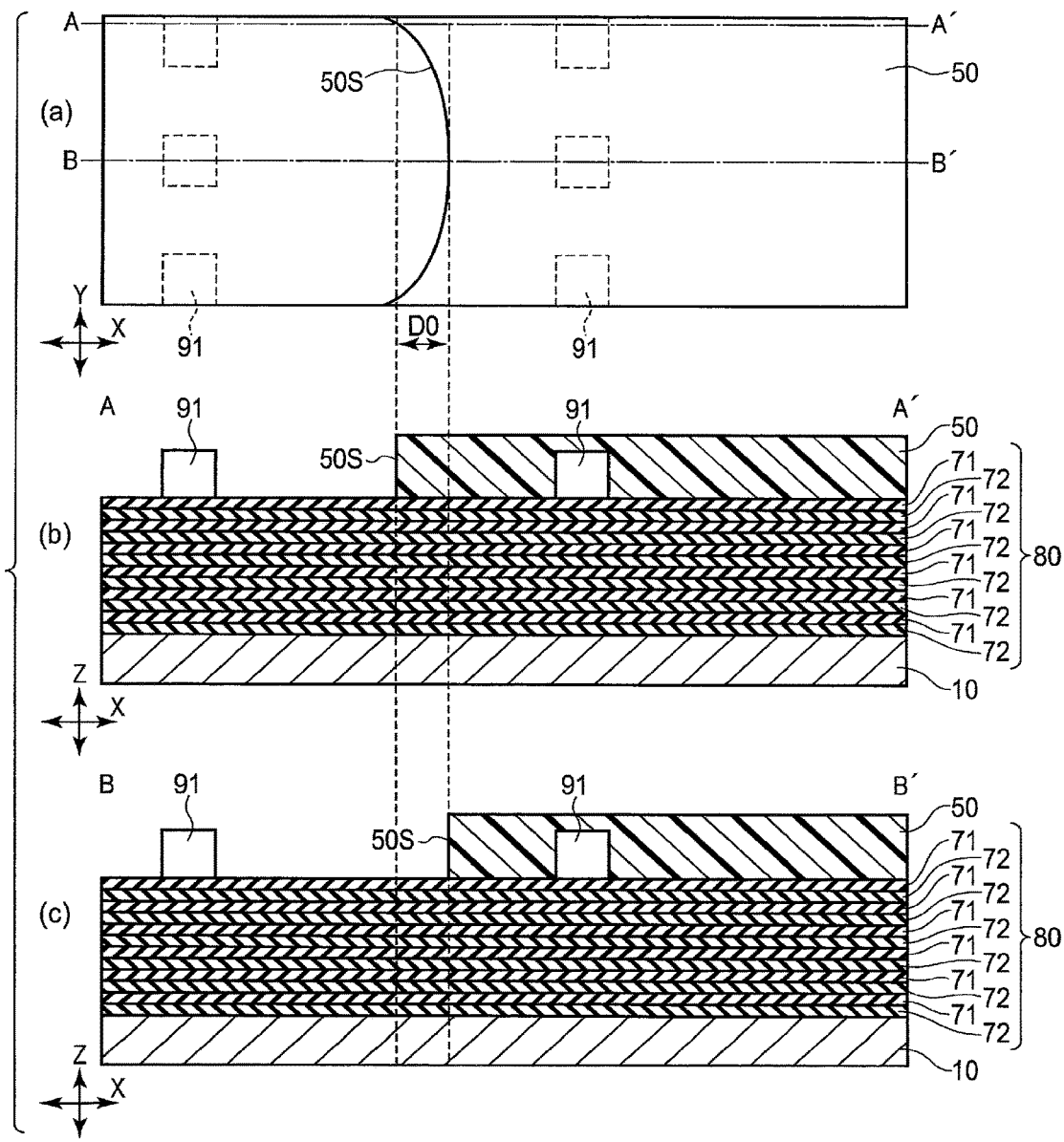

Next, as shown in FIG. 8, the resist pattern 50 is formed on the stack 80. The resist pattern 50 is of a shape, as shown in FIG. 6, having a concave curve in each of the four side faces facing in the X direction or the Y direction and quadrate with acute corners, when viewed from the Z direction. The resist pattern 50 exposes part of the stack 80, and covers the remaining portion of the stack 80. The resist pattern 50 also exposes the hard masks 91 located at the outermost side in the X direction, and covers the other hard masks 91. The resist pattern 50 here has the side face 50S facing in the X direction, and the shape difference of this side face 50S will be referred to as "D0".

At this time, in order to confirm that the side face 50S of the resist pattern 50 has been set at a desired position, the distance from the exposed hard mask 91 to the side face 50S of the resist pattern 50 is measured. If the side face 50S of the resist pattern 50 deviates from the intended position, the resist pattern 50 is removed and formed afresh. When forming the resist pattern 50 afresh, the exposure amount and the exposure position are adjusted so that the dimensional deviation from the intended position is corrected.

Next, as shown in FIG. 9, etching such as reactive ion etching (RIE) is performed using the resist pattern 50 as a mask. This etching removes one sacrifice layer 71 and one insulation layer 72 from the portion of the stack 80 not covered by the resist pattern 50, thereby forming one step S.

Also, the hard masks 91 not covered by the resist pattern 50 are etched to a certain extent as well. At this time, the hard masks 91 are each etched in an amount that corresponds to one sacrifice layer 71 and one insulation layer 72 (that is: if the etching rate is the same as that for the sacrifice layer 71 and the insulation layer 72, the amount equal to the total thickness of one sacrifice layer 71 and one insulation layer 72).

Next, as shown in FIG. 10, the resist pattern 50 is slimmed by, for example, an ashing treatment. This makes the resist pattern 50 smaller by one size. At this time, an error E1 of the slimming occurs. Meanwhile, in the resist pattern 50, the side face 50S facing in the X direction has a shape difference D1 smaller than the initial shape difference D0, since the recession amount of its Y-direction end portions is larger than the recession amount of its Y-direction center portion. Due to the recession of the side face 50S, a new portion of the stack 80 is exposed. Note that, while not clearly illustrated, the ashing treatment has also reduced the Z-direction thickness of the resist pattern 50. The similar thickness reduction of the resist pattern 50 will occur due to the subsequent slimming processes.

Next, as shown in FIG. 11, etching is performed using the resist pattern 50 as a mask. This etching removes one sacrifice layer 71 and one insulation layer 72 from the portion of the stack 80 not covered by the resist pattern 50, thereby forming one new step S. The step S that was formed in the process shown in FIG. 9 is transferred as the lower step by the present etching. Accordingly, two steps S are formed in total.

Also, the hard masks 91 not covered by the resist pattern 50 are subjected to the etching as well. At this time, as in the case of the process shown in FIG. 9, the hard masks 91 are etched in an amount corresponding to one sacrifice layer 71 and one insulation layer 72. As a result, the stacks (projecting stacks) each formed of two sacrifice layers 71 and two insulation layers 72 and projecting upward in the Z direction from the surroundings are left over. The number of layers forming each projecting stack is not limited to this, as this depends on the thickness of the hard mask 91, materials, etc.

Next, as shown in FIG. 12, the resist pattern 50 is slimmed. This makes the resist pattern 50 smaller by a further one size, and exposes a new portion of the stack 80. The slimming also exposes portions of the respective hard masks 91, other than the once-existent hard masks 91 at the outermost side in the X direction. At this time, such slimming creates an error E2 which is cumulative to the last error E1. As such, the error E2 is larger than the error E1. Meanwhile, in the side face 50S, a shape difference D2 is smaller than the shape difference D1.

Next, as shown in FIG. 13, etching is performed using the resist pattern 50 as a mask. This etching removes one sacrifice layer 71 and one insulation layer 72 from the portion of the stack 80 not covered by the resist pattern 50, thereby forming one new step S. Also, the already-formed steps S are transferred as the lower steps. Accordingly, three steps S are formed in total. Furthermore, the pattern based on the projecting stacks is transferred to the lower layer portion.

Further, the portions of the respective hard masks 91 that are not covered by the resist pattern 50 are also etched. At this time, the portions of the hard masks 91 are etched in an amount corresponding to one sacrifice layer 71 and one insulation layer 72, so that the step Sa is formed in each of the hard masks 91.

Next, as shown in FIG. 14, the resist pattern 50 is slimmed. An error E3 is formed at this time, which is cumulative to the last error E2, and therefore, the error E3 is larger than the error E2. Meanwhile, a shape difference D3 is smaller than the shape difference D2.

Figure 15:
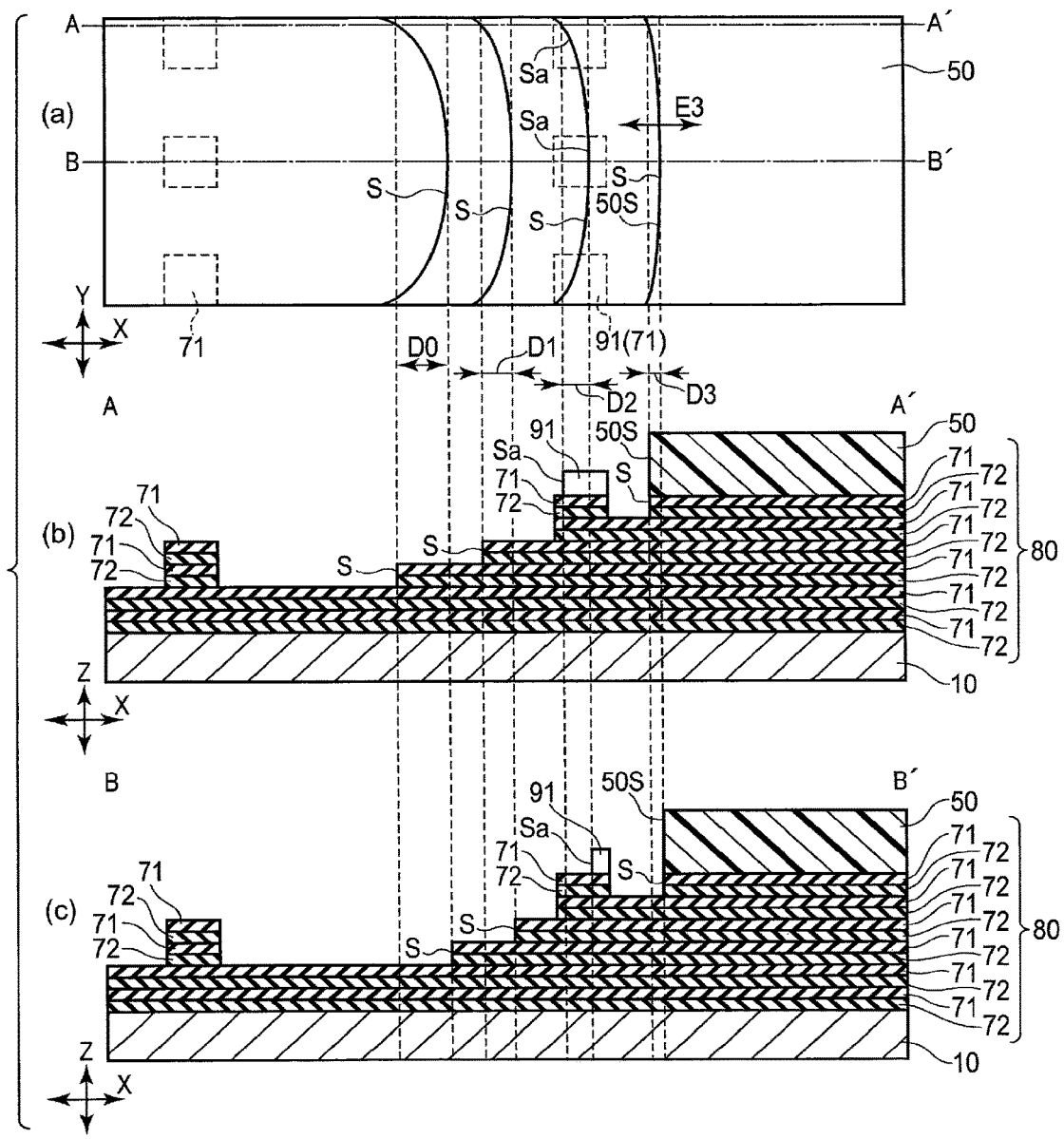

Next, as shown in FIG. 15, etching is performed using the resist pattern 50 as a mask. This forms one new step S, and there are four steps S in total. Also, the projecting stacks and the step Sa are transferred to the lower layer portion.

Next, as shown in FIG. 16, the resist pattern 50 is slimmed. An error E4 is formed at this time, which is cumulative to the last error E3, and therefore, the error E4 is larger than the error E3. That is, the errors are given as E4>E3>E2>E1. Conversely, in the resist pattern 50, a shape difference D4 is smaller than the shape difference D3. That is, the shape differences are given as D4<D3<D2<D1<D0.

Figure 17:
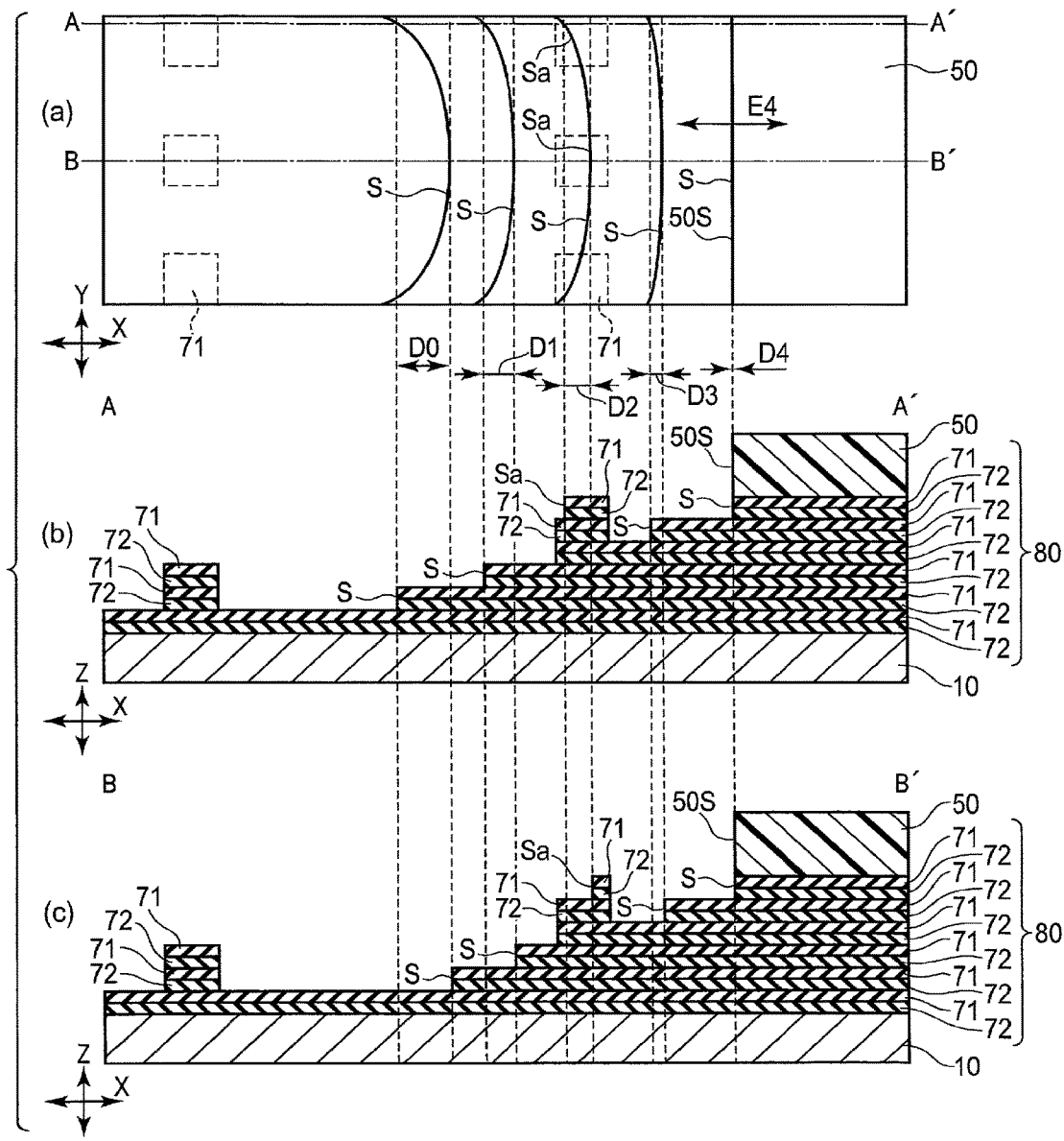

Next, as shown in FIG. 17, etching is performed using the resist pattern 50 as a mask. This forms one new step S, and there are five steps S in total. Also, the projecting stacks and the step Sa are transferred to the lower layer portion. Through the transfer of the step Sa, new stacks each possessing the step Sa (stepped stacks) are formed. These stepped stacks are each formed from two sacrifice layers 71 and two insulation layers 72, as the already-formed projecting stacks.

Next, the resist pattern 50 is removed, and a resist pattern 51 is formed on the stack 80 as shown in FIG. 18. The resist pattern 51 is of a rectangular shape when viewed from the Z direction. The resist pattern 51 is provided to expose the projecting stacks. In other words, a side face 51S facing in the X direction of the resist pattern 51 is positioned between the group of the projecting stacks and the first-formed step S.

Thereafter, etching is performed using this resist pattern 51 as a mask to remove the lowermost sacrifice layer 71 and the lowermost insulation layer 72 which are located at the areas not covered by the resist pattern 51, so that the stack 80 is partitioned from the surroundings as shown in FIG. 5. Together, a step S (step S0) facing in the X direction of this stack 80 is formed. Also, the projecting stacks are transcribed so that the stacks 90 on the semiconductor substrate 10 result. The stepped stacks become the stacks 90 on the step S of the stack 80.

Next, an inter-layer insulation layer (not illustrated) is provided over the whole body. Memory cells are then formed within the stack 80. Subsequently, one or more slits extending in the X direction are formed in the stack 80. This divides the stack 80 into two or more segments in the Y direction. Accordingly, the terraces T, the steps S, and the stacks 90 are also each divided in the Y direction. Then, the sacrifice layers 71 are removed via the slits. Also, via the slits, the conductive layers 70 are buried into the spaces left after the removal of the sacrifice layers 71. In this manner, the semiconductor device 1 according to the first embodiment is manufactured.

Note that the positions of the stacks 90 are not limited to what has been discussed, but may be discretionarily determined. Thus, the slits may not have to divide each stack 90. In other words, the stacks 90 may be located between the slits. In such instances, the sacrifice layers 71 constituting the stacks 90 are not removed via the slits. These sacrifice layers 71 remain in the stacks 90, and each of the stacks 90 is kept as a structure in which the sacrifice layers 71 and the insulation layers 72 are alternately stacked.

Effects of First Embodiment

According to the first embodiment previously described, in the staircase fabrication in an end portion 100a of the stack 80, initial shape in the side faces 50S each facing in the X direction of the resist pattern 50 has a concavely-curved. This allows the increase in the error E—due to the repeated slimming processes for the staircase fabrication—to be balanced out by the decrease in the shape difference D. Consequently, it is possible to suppress the shape variation of the resist pattern 50 as a whole, even in the instances of repeated slimming processes. The stack 80 can therefore be processed into the end portion 100a with high accuracy.

When the resist pattern 50 is used, the lower steps S in the staircase structure of the stack 80 have a greater degree of arc. The terraces T on the respective layers in this staircase area are connected with contacts. In order to position the contacts with the terraces T, it is desirable to accurately comprehend the position of each terrace T defined by two steps S adjacent in the X direction.

To this end, the first embodiment provides the multiple stacks 90 aligned along the Y direction. The positions of these stacks 90 are used as references, and the distances from the stacks 90 to the respective steps S in the staircase structure of the stack 80 are measured. In the first embodiment, the degree of arc in each step S can be estimated accordingly, and the positions of the terraces T can be accurately comprehended. Therefore, the semiconductor device and its manufacturing method according to the first embodiment can realize highly-accurate structural arrangements.

Also according to the first embodiment, structures such as hard masks 91 are formed during the manufacturing processes at the areas where the stacks 90 will be formed. In the first embodiment, the position of the resist pattern 50 formed during the manufacturing processes can be measured using these structures as references. If the position of the side face 50S of the resist pattern 50 deviates from the intended position, the resist pattern 50 is removed and formed afresh. The semiconductor device and its manufacturing method according to the first embodiment can therefore form the resist pattern 50 with accuracy, contributing to the realization of further accurate structural arrangements.

In the description of the first embodiment, the initial shape of each side face 50S of the resist pattern 50 has been assumed to have a concave curve, but the embodiment is not limited to this. Each side face 50S of the resist pattern 50 may have an initial shape that is straight along the Y direction. In this case, repeating the slimming of the resist pattern 50 will form the side face 50S of the resist pattern 50 into a convexly-curved shape. That is, the steps S in the staircase structure will also have a convex curve in accordance with the resist pattern 50, with a greater convex-curve degree accompanying the higher steps S. The first embodiment, even in this case, enables the degree of arc in each step S to be estimated with reference to the positions of the multiple stacks 90 aligned along the Y direction, so that the positions of the terraces T can be accurately comprehended. Also in the context of the first embodiment as discussed above, the position of the resist pattern 50 formed during the manufacturing processes can be measured using, as references, the structures such as the hard masks 91 formed at the areas where the stacks 90 will be formed.

Second Embodiment

A semiconductor device according to a second embodiment will be described with reference to FIGS. 19 to 52. In the context of the second embodiment, the processes behind the formation of hard masks of the first embodiment and what constitutes them will be described in more detail. Note that the second embodiment uses an insulation layer 75 and a stopper layer 76, as each of the hard masks.

In the second embodiment, a number of resist patterns, as discussed in the first embodiment and as shown in FIG. 6, are used during the staircase fabrication in the stack. More specifically, a resist pattern is removed when, for example, the repeated slimming has reduced the thickness of the resist pattern, and also when the shape of the resist pattern approaches a rectangle when viewed from the Z direction. A resist pattern of sufficient thickness to serve as a mask is newly formed with its side faces curved concavely. Then, the etching of the stack using this new resist pattern as a mask, and the slimming of the resist pattern, are repeated again. For the second embodiment, descriptions overlapping with the first embodiment will be omitted. Descriptions will focus mainly on the features, etc. which differ from the first embodiment.

Configurations for Second Embodiment

Figure 19:
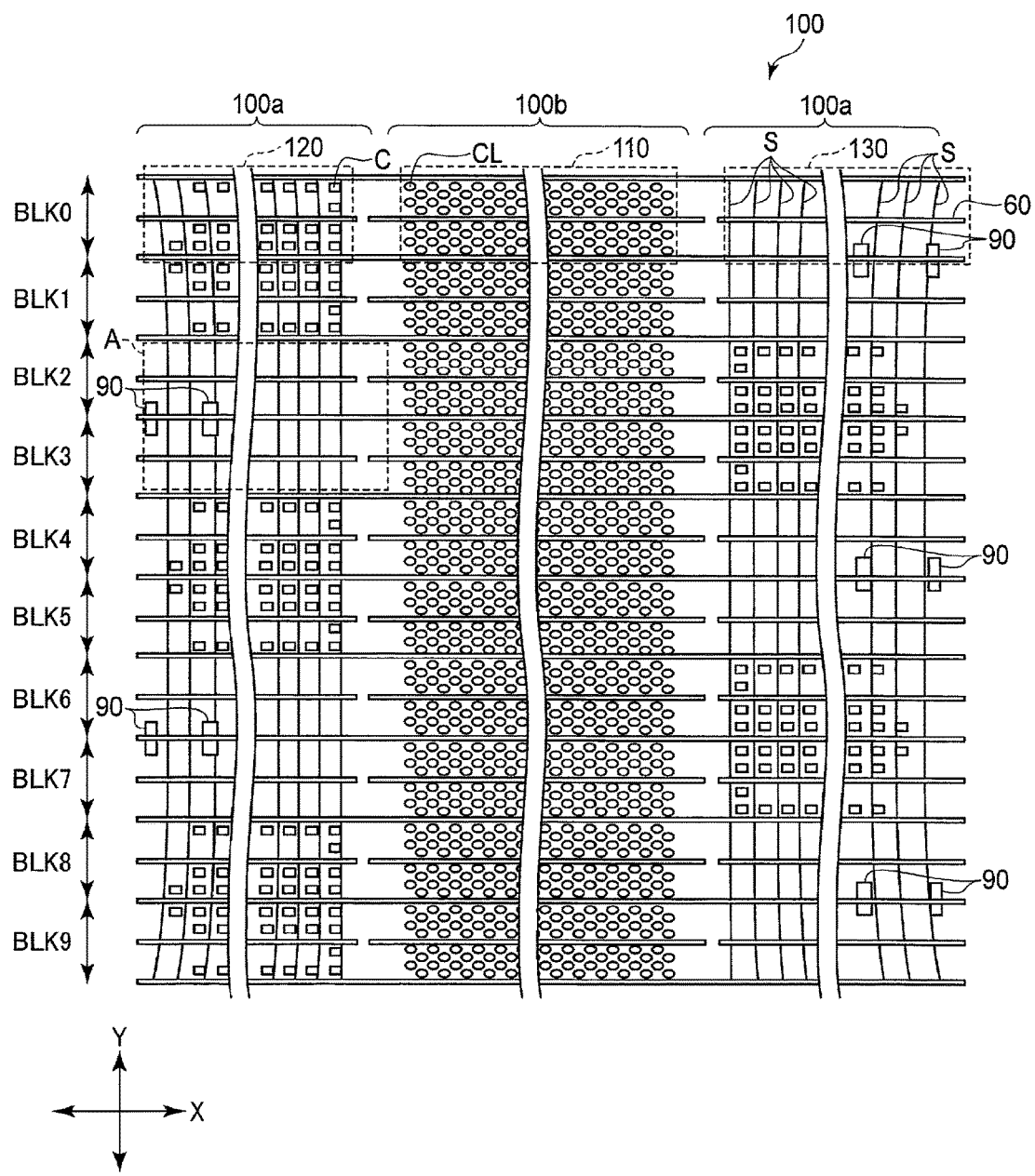
FIG. 19 is a planar view of a stack structure of a semiconductor device according to a second embodiment.

FIG. 19 is a planar view of a stack structure 100 of the semiconductor device 1 according to the second embodiment.

As shown in FIG. 19, the stack structure 100 includes blocks BLK (BLK0 to BLK9) aligned along the Y direction. Separators 60 extending in the X direction are provided in the Y-direction center portions of the respective blocks BLK.

The separator 60 is also provided between the blocks BLK. Each of the separators 60 provided in the Y-direction center portions of the respective blocks BLK has a gap nearby each boundary between the middle portion 100b and the end portion 100a. As such, while each layer is split between two adjacent blocks BLK, each layer within one block is not split. The number of the blocks BLK is not limited.

The blocks BLK each include a memory cell array area 110 in the middle portion 100b. Also, the blocks BLK each include a staircase area 120 in one end portion 100a, and a staircase area 130 in the other end portion 100a.

The memory cell array area 110 includes the multiple pillars CL. The pillars CL are aligned in the X direction and the Y direction. Two pillars CL, which are adjacent in the X direction (or the Y direction), are disposed with a half-pitch displacement. In other words, the multiple pillars CL are arranged in a staggered pattern in the X direction and the Y direction.

The staircase area 120 includes the multiple steps S and the multiple terraces T aligned in the X direction. The steps S include an arc shape along the Y direction. The staircase area 120 includes also steps and three terraces aligned in the Y direction, although not illustrated. Contacts C are connected to the respective terraces, and word lines corresponding to the respective layers are led out.

The staircase area 130 includes the multiple steps S and the multiple terraces T aligned in the X direction. The steps S include an arc shape along the Y direction. The staircase area 130 includes also steps and three terraces aligned in the Y direction, although not illustrated. The layout of these steps and terraces is symmetrical to the staircase area 120 with respect to a line along the Y direction. Also, the staircase area 130 includes the stacks 90 aligned in the X direction. The stacks 90 are formed at the Y-direction end portions of the respective blocks BLK. Note that the positions of the stacks 90 are not limited to this, but may be discretionarily determined. In particular, when the stacks 90 are not divided by the separator 60, the stacks 90 are each formed as a structure in which the sacrifice layers 71 and the insulation layers 72 are stacked, as discussed for the first embodiment.

The layouts of two blocks BLK adjacent in the Y direction are symmetrical to each another with respect to a line along the separator 60 therebetween. FIG. 19 shows that the block BLK0 and the block BLK1 are symmetrical to each other with respect to the line along the separator 60 therebetween. Similarly, the blocks BLK2 and BLK3, the blocks BLK4 and BLK5, the blocks BLK6 and BLK7, and the blocks BLK8 and BLK9 are each in a symmetrical relationship with respect to the line along the in-between separator 60.

Thus, the stacks 90 in two blocks BLK adjacent in the Y direction are consecutively provided with the separator 60 interposed. Accordingly, the stacks 90 in two blocks BLK adjacent in the Y direction are formed using the same hard mask 91.

Also, the staircase areas 120 and the staircase areas 130 are provided on opposite sides of the memory cell array area 110 every two blocks BLK. More specifically, the blocks BLK0, BLK1, BLK4, BLK5, BLK8, and BLK9 each have the staircase area 120 in one end portion 100a (shown on the left in the figure) and the staircase area 130 in the other end portion 100a (shown on the right in the figure). On the other hand, the blocks BLK2, BLK3, BLK6, and BLK7 each have the staircase area 130 in one end portion 100a (shown on the left in the figure) and the staircase area 120 in the other end portion 100a (shown on the right in the figure).

That is, the end portions 100a provide an arrangement in which word lines are led out to both sides by the contacts C, alternately in the units of two blocks. The stacks 90 are provided in the Y direction in the respective areas of the end portions 100a, where the contact C is not provided for leading the word line out. As such, the stacks 90 formed using the same hard mask 91 (that is: the stacks 90 in the two blocks BLK adjacent in the Y direction) are disposed every four blocks BLK (that is: every width of four blocks BLK) along the Y direction.

Note that the arrangements of the staircase areas 120 and the staircase areas 130 are not limited to those which have already been discussed, but may be discretionarily set. For example, the staircase areas 120 and the staircase areas 130 may be provided on opposite sides of the memory cell array area 110, for every one block BLK or every three or more blocks BLK. Then, the stacks 90 may be provided on both sides of the memory cell array area 110 and, for example, within any staircase areas 130 where the contact C is not provided for leading the word line out. In this instance, the stacks 90 (the stacks 90 in the two blocks BLK adjacent in the Y direction) may be disposed on every predetermined number of blocks BLK (every width of the predetermined number of blocks BLK) along the Y direction. Moreover, the stacks 90 may be provided at the positions within the staircase areas 120, where the stacks 90 would not interfere with the contact C for leading the word line out.

FIG. 20 is an enlarged view of the broken-line part A in FIG. 19, and gives a planar view of a layout of the staircase area 130 in the semiconductor device 1 according to the second embodiment. In the figure, two adjacent blocks BLK are shown, and the steps S are drawn without their arc profiles.

As shown in FIG. 20, the staircase area 130 includes the multiple terraces T aligned in the X direction and the Y direction. The figure shows the terraces T0 to T55 sequentially from the lower side. The terraces T0 to T55 are aligned in one row or three rows along the X direction. Note that the rows of the terraces T0 to T55 are not limited to three rows along the X direction, but the terraces T0 to T55 may be aligned in one row, two rows, or four or more rows. The following detailed explanation will assume the instance where the terraces T0 to T55 are aligned in one row or three rows along the X direction.

The lowermost terrace is the terrace T0, with respect to which the terrace T1 is aligned on the X-direction inside (side of the middle portion 100b). With respect to the terrace T1, the terraces T2 and T3 are aligned one by one in the Y direction. That is, the terraces T1 to T3 are aligned in three rows. With respect to these terraces T1 to T3 aligned in three rows, the terraces T2 to T4 are aligned in three rows on the X-direction inside. Note, therefore, that there are two terraces T2 and two terraces T3. With respect to the terraces T2 to T4 aligned in three rows, the terraces T5 to T49 are aligned one-by-one in three rows.

With respect to the terraces T47 to T49 aligned in three rows, the terraces T50 to T52 are aligned in three rows on the X-direction inside. Also, the terraces T51 and T52 are aligned one-by-one on the X-direction inside with respect to the terrace T50. That is, the terraces T51 and T52 each have a shape of L. Further, the terraces T53 to T55 are aligned one-by-one in a single row on the X-direction inside with respect to the terrace T52.

The staircase area 130 is divided into areas R0 to R7 along the X direction from the upper side. The areas are each formed using the common resist pattern in the manufacturing process, as will be described.

The area R0 includes three steps S aligned in the X direction and each extending in the Y direction. The area R1 includes two steps S aligned in the X direction and each extending in the Y direction. The area R2 includes six steps S aligned along the X direction and each extending in the Y direction. The area R3 includes five steps S aligned along the X direction and each extending in the Y direction. The area R4 includes five steps S aligned along the X direction and each extending in the Y direction. The area R5 includes two steps S aligned along the X direction and each extending in the Y direction. The area R6 includes one step S aligned along the X direction and extending in the Y direction.

The areas R1 to R5 each include two steps S aligned in the Y direction and each extending in the X direction. The number of areas set for the staircase area 130, as well as the number of steps S in each area may be discretionarily determined.

As will be discussed, the steps S included in each area and extending in the Y direction are formed using a common single resist pattern. Among them, the steps S in the areas R0 to R5 are formed using a resist pattern that has a concave curve in its side face facing in the X direction, as described for the first embodiment. Thus, while not illustrated, the lowermost one of the steps S formed in the areas R0 to R5 is concavely curved so as to have the largest shape difference D, and the upper steps have a gentler curve and a smaller shape difference D.

Also, the stack 90 is provided on the X-direction external side of the lowermost terrace T0 (opposite to the middle portion 100b). The stack 90 is formed also on the terraces T (on the terraces T23 and T26 in the figure). These stacks 90 are aligned along the X direction. The stacks 90 have a position in the Y direction, which corresponds to the position of the lowermost terraces T among the three rows of the terraces aligned in the Y direction.

Figure 21:
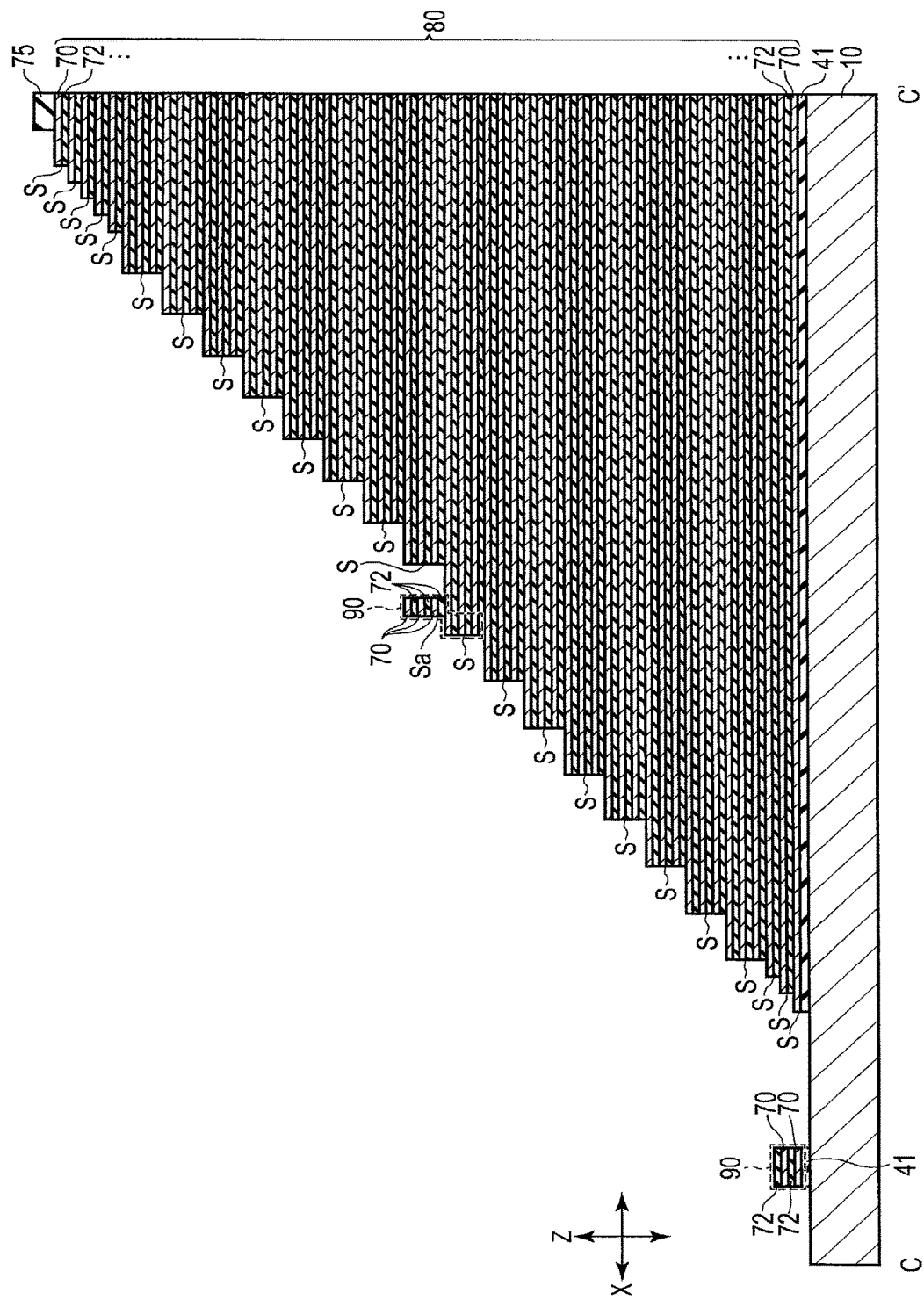
FIG. 21 is a sectional view of the staircase area in the semiconductor device according to the second embodiment.

FIG. 21 is a sectional view taken along the line C-C' in FIG. 20, and shows the section of the staircase area 130 in the semiconductor device 1 according to the second embodiment.

As shown in FIG. 21, the staircase area 130 includes the stack 80 and the multiple stacks 90. These stacks 80 and 90 are covered by inter-layer insulation layers (not illustrated). Note that the numbers of stacked layers in the stacks 80 and 90 are not limited to what is shown in FIG. 21.

The stack 80 is provided on the semiconductor substrate 10 via the insulation layer 41. The insulation layer 41 is, for example, a silicon oxide layer. The stack 80 includes the multiple conductive layers 70 and the multiple insulation layers 72. The conductive layers 70 are stacked in the direction (Z direction) perpendicular to the main face of the semiconductor substrate 10, with the insulation layer 72 interposed between the neighboring layers. The insulation layer 75 that may be, for example, a tetra ethyl ortho silicate (TEOS) layer, is formed on the stack 80.

In the staircase area 130, the terraces T and the steps S are formed one-by-one from the lower side and correspondingly to the conductive layers 70. The steps S include steps each corresponding to one conductive layer 70 and one insulation layer 72, and steps each corresponding to three conductive layers 70 and three insulation layers 72. The step S provided for the lowermost conductive layer 70 corresponds to one conductive layer 70 and one insulation layer 41.

The multiple stacks 90 are formed on the insulation layer 41 on the external side of the stack 80 (opposite to the middle portion 100b), or on the staircase-shaped stack 80. The stack 90 on the external side of the stack 80 includes two conductive layers 70 and two insulation layers 72. The stack 90 on the stack 80 includes three conductive layers 70 and three insulation layers 72. The stacks 90 are partial divisions from the stack 80, and include the same layers as the stack 80.

The stack 90 provided on the insulation layer 41 has a substantially flat top. On the other hand, the stack 90 provided on a step S of the stack 80 includes the steps Sa in a location conforming to the step S.

Manufacturing Method for Second Embodiment

FIGS. 22 to 52 illustrate the method for manufacturing the staircase area 130 in the semiconductor device 1 according to the second embodiment. More specifically, FIGS. 23, 25, 27, 29, 31, 33, 35, 37, 39, 41, 43, 45, 47, 49, and 51 are planar views of the staircase area 130. Also, FIGS. 22, 24, 26, 28, 30, 32, 34, 36, 38, 40, 42, 44, 46, 48, 50, and 52 are sectional views each taken along the line C-C' in the corresponding planar view. The description about the arc profile of the steps S will be omitted.

Figure 22:
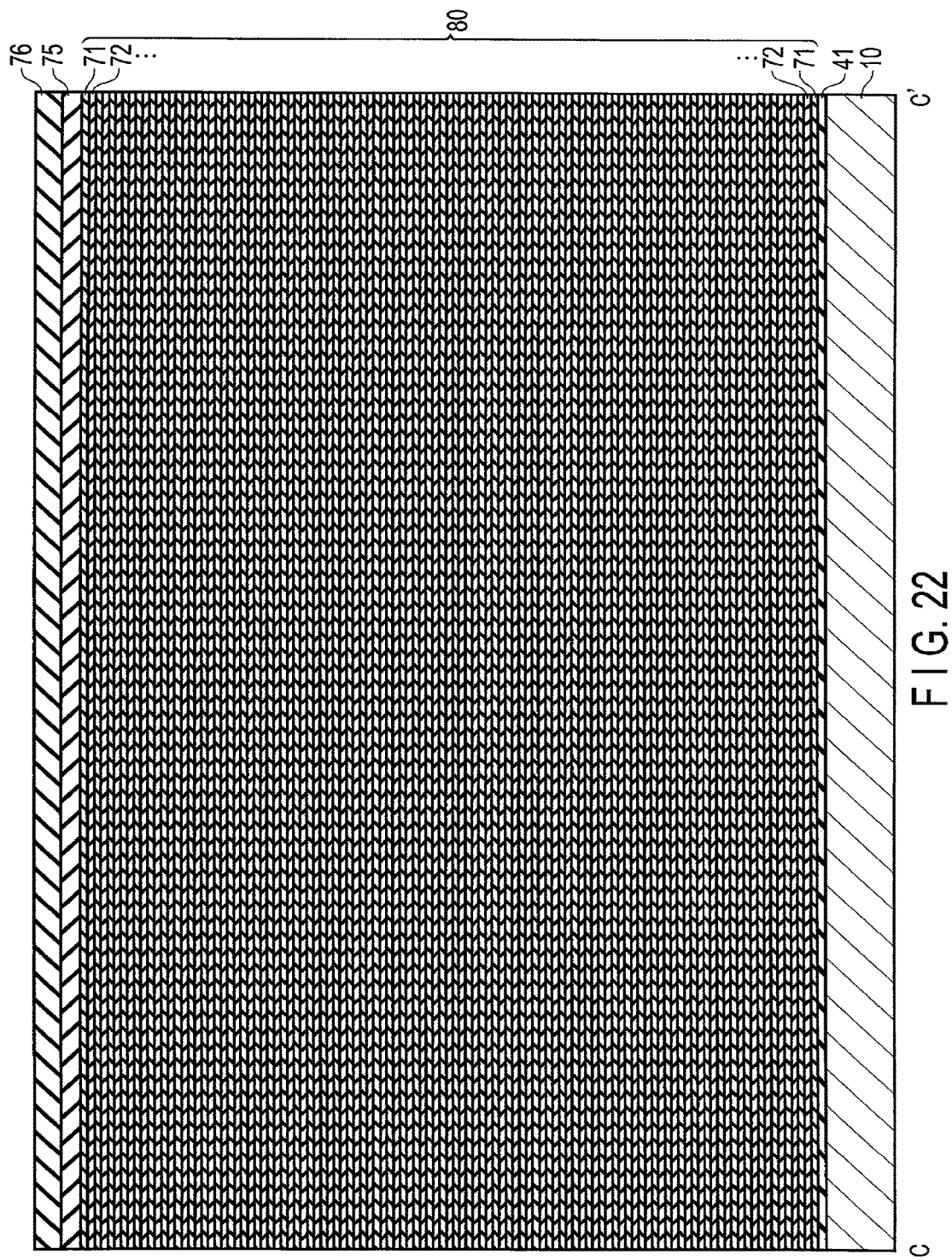
FIG. 22 is a sectional view illustrating a method for manufacturing the staircase area in the semiconductor device according to the second embodiment.

First, as shown in FIG. 22, the insulation layer 41 is formed on the semiconductor substrate 10. The insulation layer 41 is, for example, a silicon oxide layer. The sacrifice layers 71 and the insulation layers 72 are alternately stacked on this insulation layer 41 so that the stack 80 is formed. The insulation layers 72 are, for example, silicon oxide layers. The sacrifice layers 71 include a material that allows an etching selectivity ratio to be set with respect to the insulation layers 72. The sacrifice layers 71 are, for example, silicon nitride layers.

Also, the insulation layer 75 and then the stopper layer 76 are sequentially formed on the uppermost sacrifice layer 71. The insulation layer 75 is, for example, a TEOS layer, and the stopper layer 76 is, for example, a silicon nitride layer. The insulation layer 75 has a thickness corresponding to, for example, one sacrifice layer 71 and one insulation layer 72. The stopper layer 76 has a thickness corresponding to, for example, two sacrifice layers 71 and two insulation layers 72.

Figure 23:
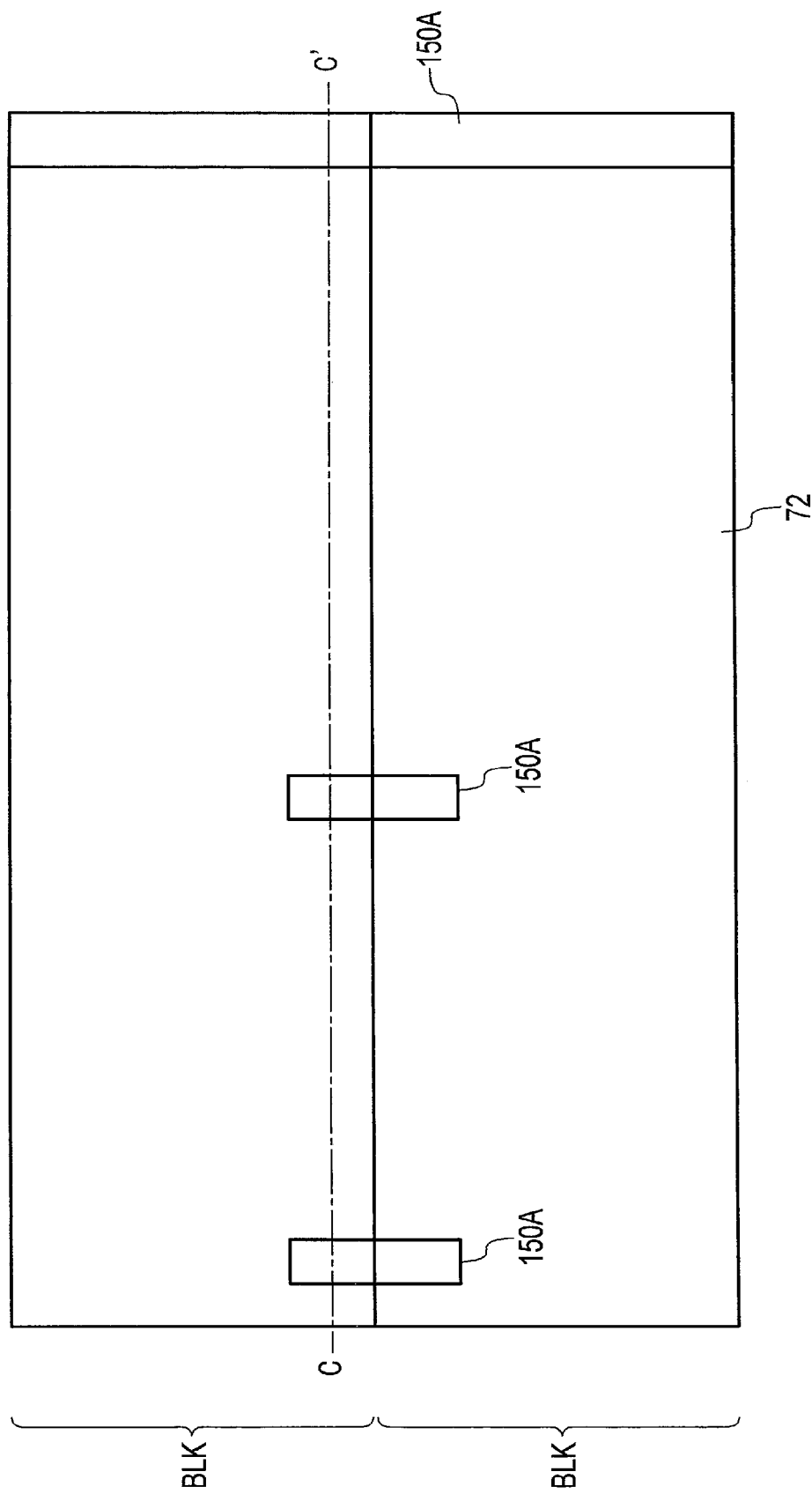
FIG. 23 is a planar view illustrating the method for manufacturing the staircase area in the semiconductor device according to the second embodiment.
Figure 24:
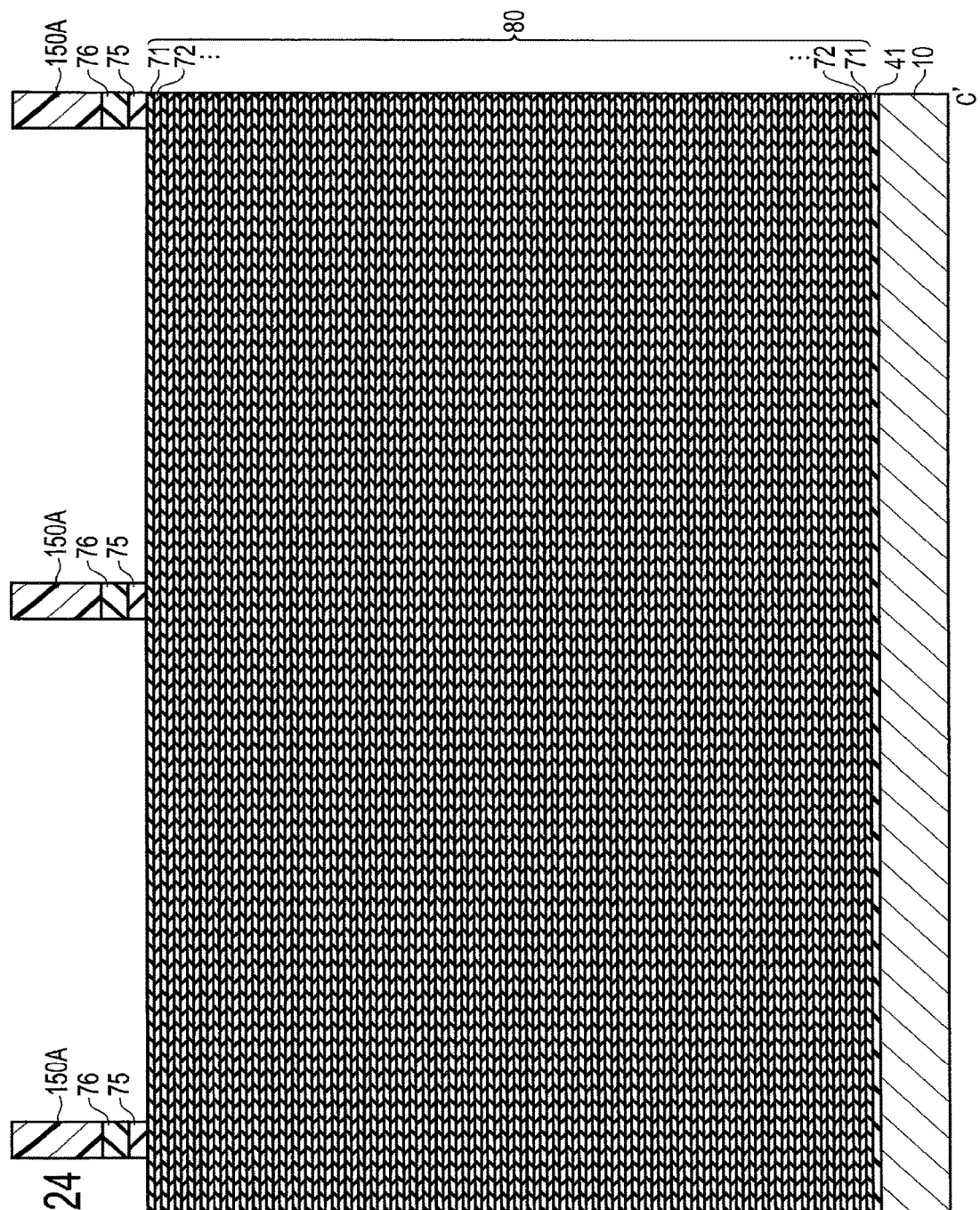
FIG. 24 is a sectional view illustrating the method for manufacturing the staircase area in the semiconductor device according to the second embodiment.

Next, as shown in FIGS. 23 and 24, a resist pattern 150A is formed on the stopper layer 76. The resist pattern 150A exposes part of the stopper layer 76, and covers the remaining portion of the stopper layer 76. For example, the resist pattern 150A is formed to cover the portion beside the middle portion 100b and the areas where the stacks 90 will be formed.

Subsequently, etching such as RIE is performed using the resist pattern 150A as a mask. This process removes the stopper layer 76 and the insulation layer 75 from the portions not covered by the resist pattern 150A. Here, the stopper layer 76 and the insulation layer 75, which remain at the areas for forming the stacks 90, serve as the hard masks 91 discussed with respect to the first embodiment. The resist pattern 150A is then removed.

Figure 25:
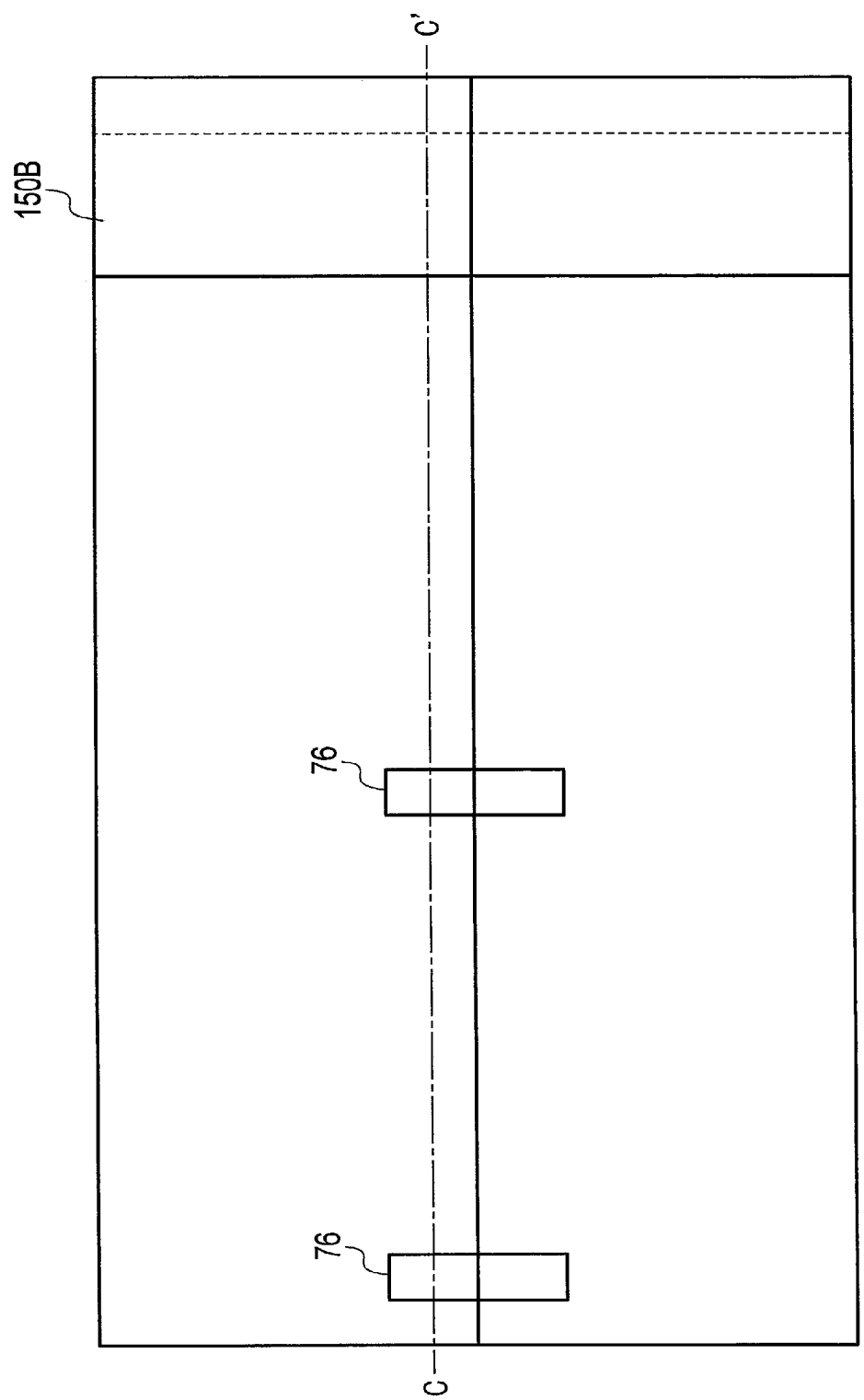
FIG. 25 is a planar view illustrating the method for manufacturing the staircase area in the semiconductor device according to the second embodiment.
Figure 26:
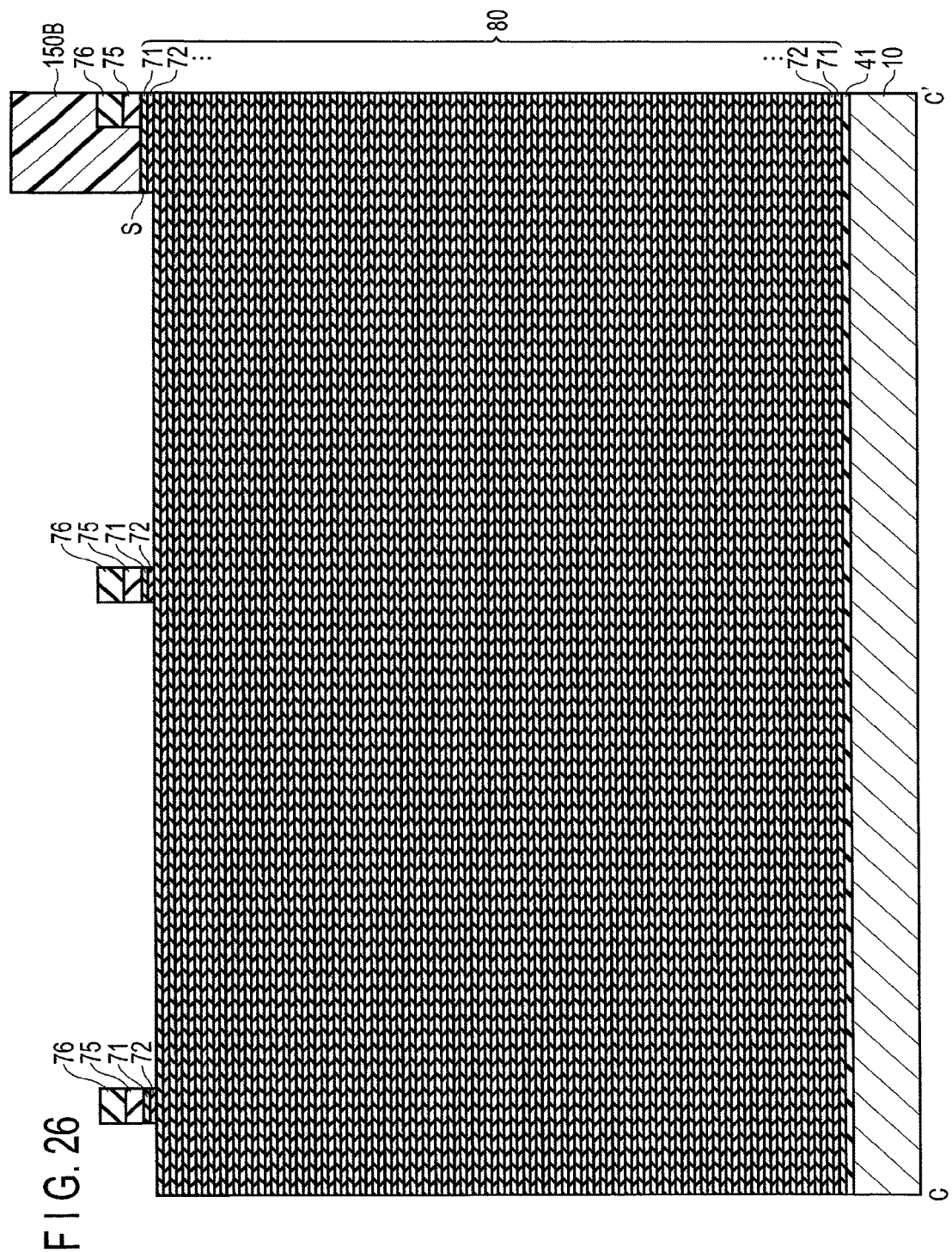
FIG. 26 is a sectional view illustrating the method for manufacturing the staircase area in the semiconductor device according to the second embodiment.

Next, as shown in FIGS. 25 and 26, a resist pattern 150B is formed on the stack 80 and the stopper layer 76. The resist pattern 150B is of a quadrate with acute corners and a concave curve in each of the four side faces facing in the X direction or the Y direction when viewed from the Z direction, as shown in FIG. 6. The resist pattern 150B exposes part of the stack 80 and covers the remaining portion of the stack 80. Also, the resist pattern 150B exposes the aforementioned hard masks. A shape difference D (c.f., FIG. 6) of the side face facing in the X direction in the resist pattern 150B is larger than 0.

At this time, in order to confirm that the side face of the resist pattern 150B has been set at a desired position, the distance from the exposed hard mask to the side face of the resist pattern 150B is measured. If the side face of the resist pattern 150B deviates from the intended position, the resist pattern 150B is removed and formed afresh. When forming the resist pattern 150B afresh, the exposure amount and the exposure position are adjusted so that the dimensional deviation from the intended position is corrected.

Etching is then performed using the resist pattern 150B as a mask. This removes one sacrifice layer 71 and one insulation layer 72 from the portion of the stack 80 not covered by the resist pattern 150B, thereby forming one step S. Hereinafter, such a step S will be called "mono-step S".

Also, the hard masks not covered by the resist pattern 150B are etched to a certain extent as well. At this time, the hard masks are each etched in an amount that corresponds to one sacrifice layer 71 and one insulation layer 72 (that is: if the etching rate is the same as that for the sacrifice layer 71 and the insulation layer 72, the amount equal to the total thickness of one sacrifice layer 71 and one insulation layer 72).

Figure 28:
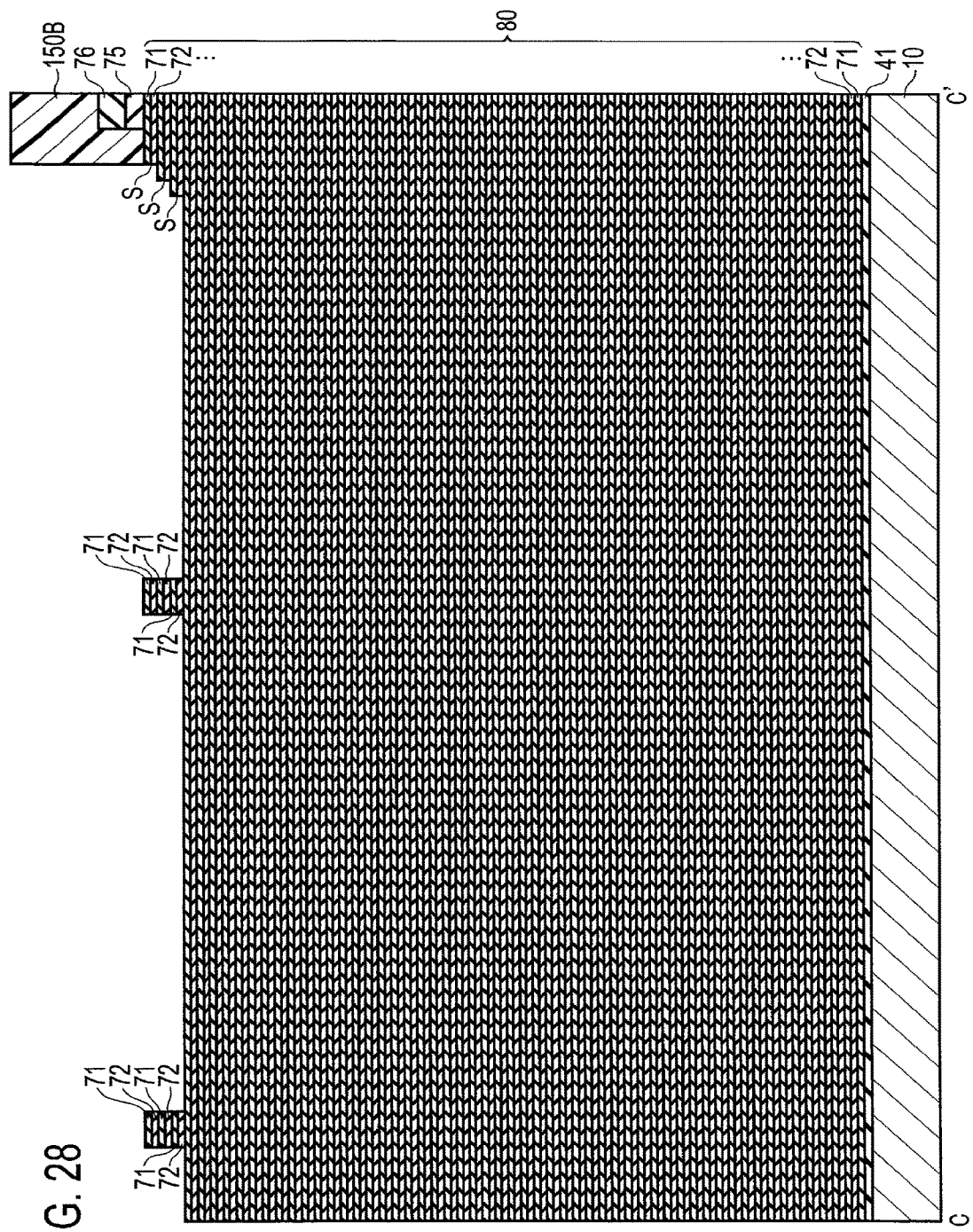
FIG. 28 is a sectional view illustrating the method for manufacturing the staircase area in the semiconductor device according to the second embodiment.

Next, as shown in FIGS. 27 and 28, slimming processes for the resist pattern 150B and etching processes using the resist pattern 150B as a mask are repeated alternately. Two slimming processes and two etching processes are performed here. With each etching, one sacrifice layer 71 and one insulation layer 72 are removed. Accordingly, three mono-steps S are formed in the area R0. As the slimming is repeated, the shape difference D of the resist pattern 150B becomes smaller, and the error E becomes larger.

Also, the hard masks not covered by the resist pattern 150B are also etched. With each etching, the hard masks are etched in an amount corresponding to one sacrifice layer 71 and one insulation layer 72. As a result, the stacks each formed of three sacrifice layers 71 and three insulation layers 72 remain. The number of layers forming the stacks is not limited to this, as it depends on the thickness of the hard masks, materials, etc. The resist pattern 150B is then removed.

Figure 29:
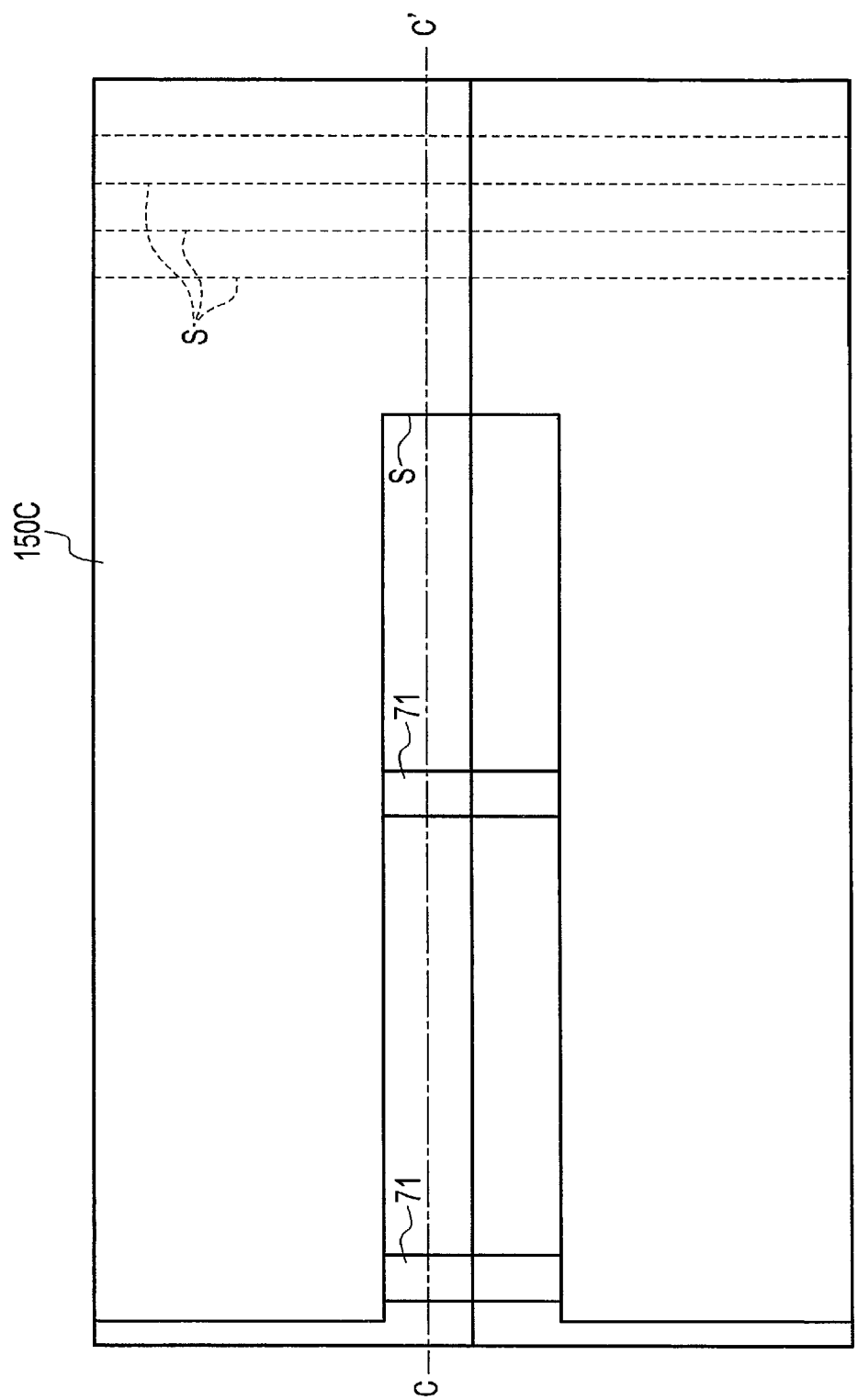
FIG. 29 is a planar view illustrating the method for manufacturing the staircase area in the semiconductor device according to the second embodiment.
Figure 30:
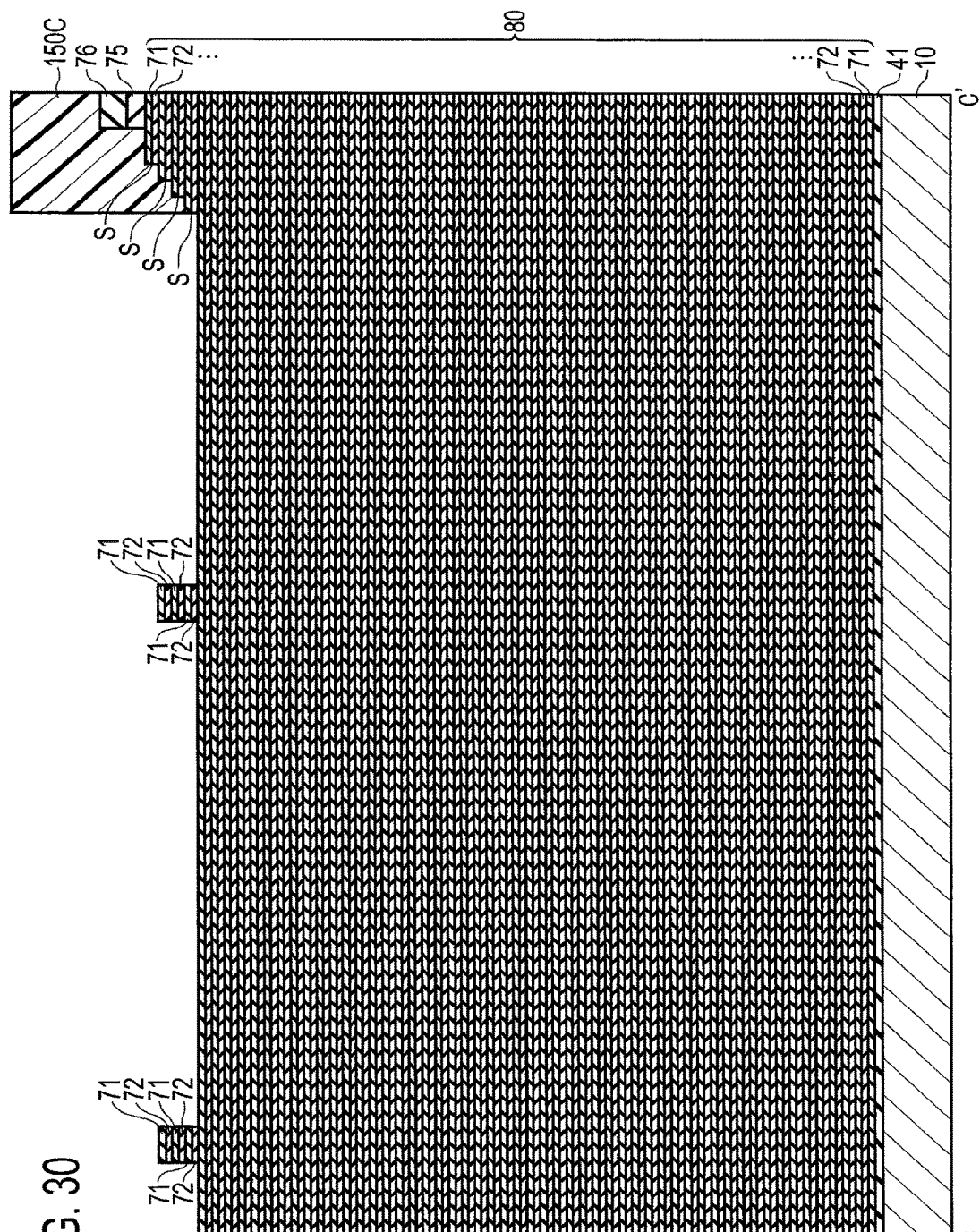
FIG. 30 is a sectional view illustrating the method for manufacturing the staircase area in the semiconductor device according to the second embodiment.

Next, as shown in FIGS. 29 and 30, a resist pattern 150C is formed on the stack 80 and the stopper layer 76. The resist pattern 150C is of a comb shape. Specifically, the resist pattern 150C includes a base part extending in the Y direction, and multiple tooth parts extending in the X direction from the base part. The base part covers the portion beside the middle portion 100b. Assuming that each block BLK is partitioned into three row portions in the Y direction, each of the tooth parts covers a center portion (the center row portion) in the Y direction and one side end portion (one side row portion) in the Y direction. The stacks formed using the hard masks are exposed.

At this time, the position of the side face of the resist pattern 150C may be checked with reference to the stacks formed using the hard masks, and the resist pattern 150C may be formed afresh as needed.

Etching is then performed using the resist pattern 150C as a mask. This removes one sacrifice layer 71 and one insulation layer 72 from the portion of the stack 80 not covered by the resist pattern 150C, thereby forming one mono-step S. Also, the stacks formed using the hard masks (patterns based on these stacks) are transferred to the lower layer portion.

Figure 32:
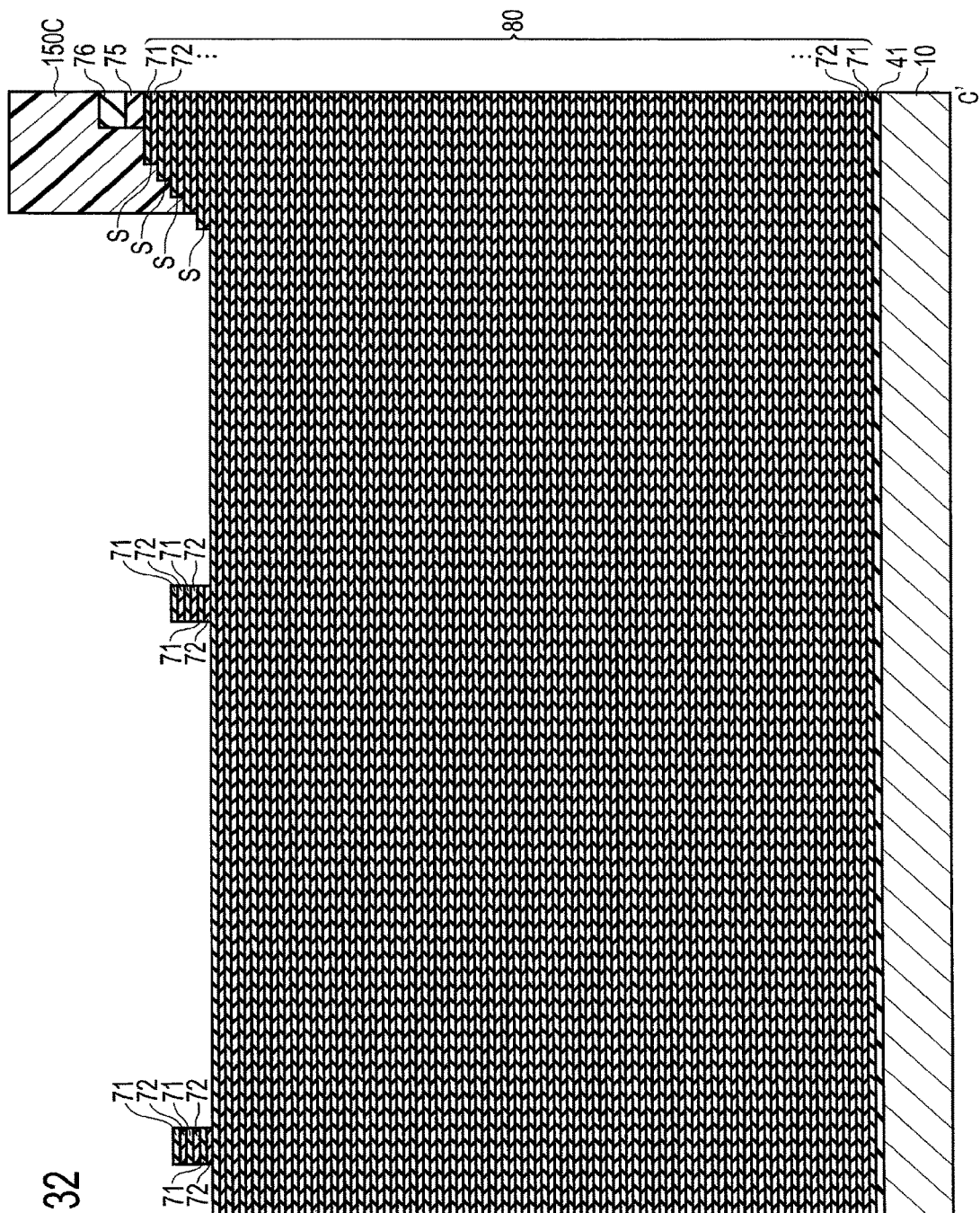
FIG. 32 is a sectional view illustrating the method for manufacturing the staircase area in the semiconductor device according to the second embodiment.

Next, as shown in FIGS. 31 and 32, the resist pattern 150C is slimmed. The slimming allows the side face of the resist pattern 150C to recede. The base part of the resist pattern 150C recedes in the X direction. Also, the tooth parts of the resist pattern 150C each recede in the Y direction so that the tooth parts cover the respective side row portions in the Y direction.

Etching is then performed using the resist pattern 150C as a mask. This removes one sacrifice layer 71 and one insulation layer 72 from the portion of the stack 80 not covered by the resist pattern 150C. As a result, two mono-steps S are formed in the area R1. This also forms two mono-steps S each extending in the X direction, across the areas R1 to R5. The stacks formed using the hard masks are transferred to the lower layer portion, as well. The resist pattern 150C is then removed.

Figure 33:
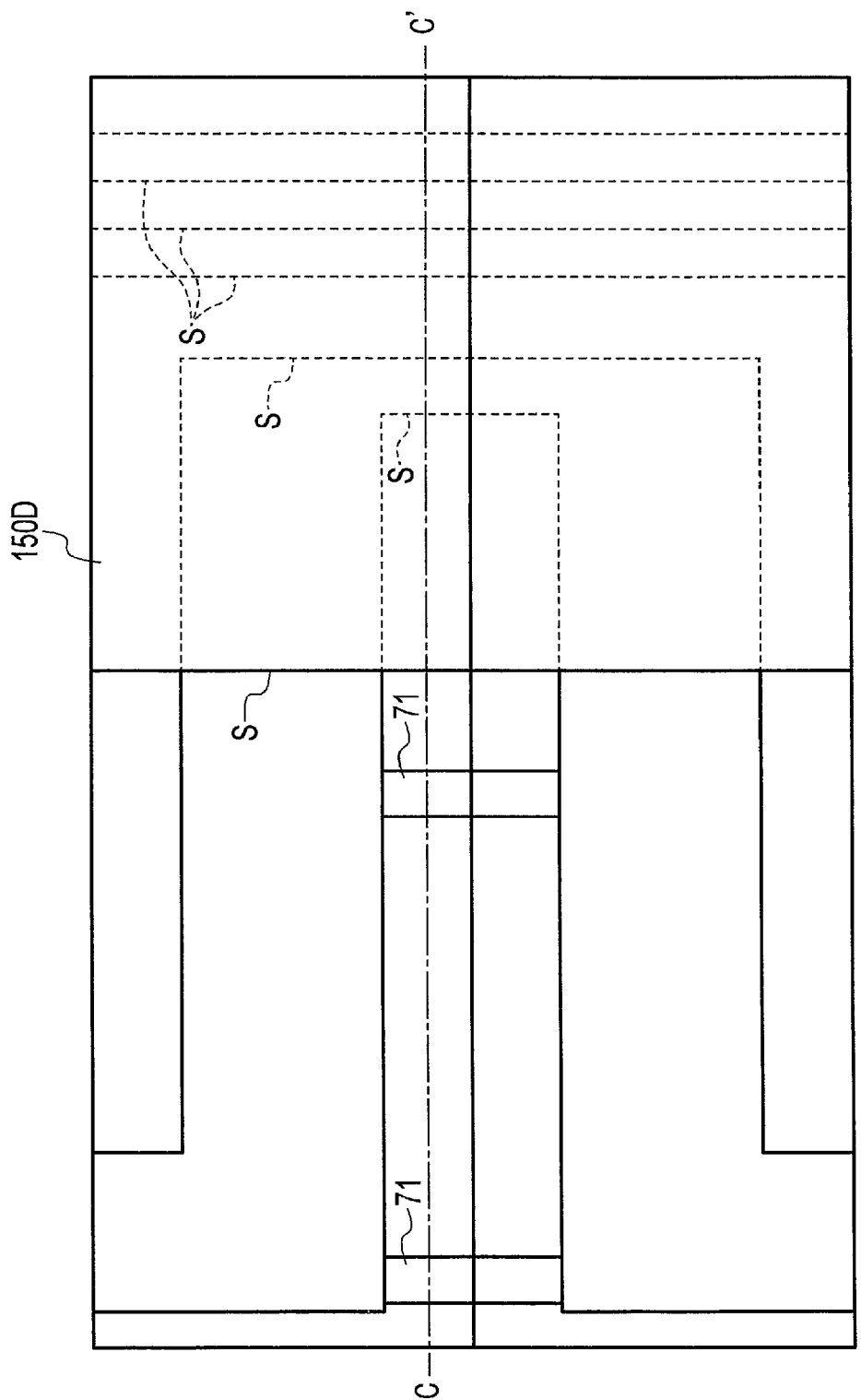
FIG. 33 is a planar view illustrating the method for manufacturing the staircase area in the semiconductor device according to the second embodiment.
Figure 34:
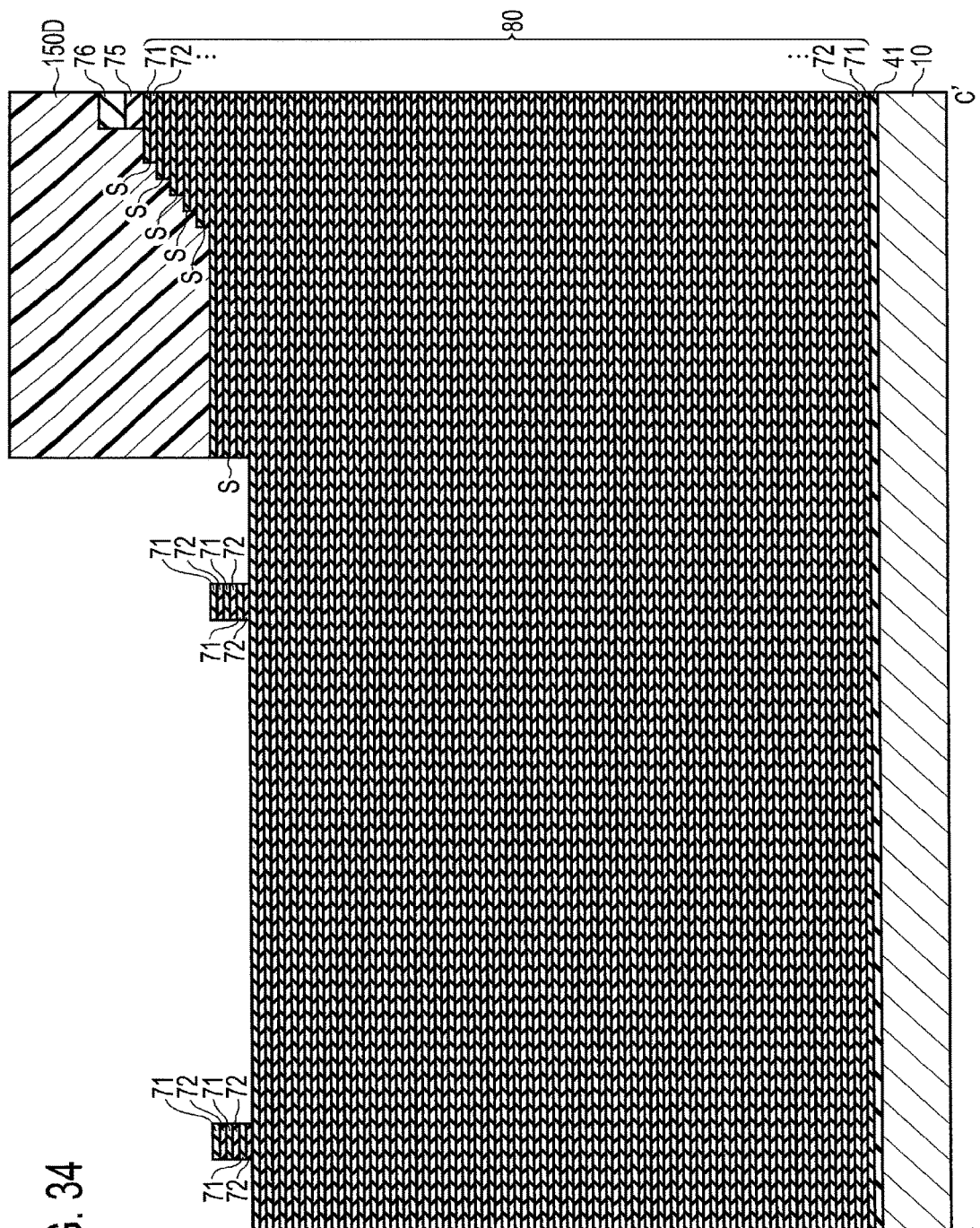
FIG. 34 is a sectional view illustrating the method for manufacturing the staircase area in the semiconductor device according to the second embodiment.

Next, as shown in FIGS. 33 and 34, a resist pattern 150D is formed on the stack 80 and the stopper layer 76. The resist pattern 150D adopts a shape of a quadrate with acute corners. The resist pattern 150D exposes part of the stack 80 and covers the remaining portion of the stack 80. Also, the resist pattern 150D exposes the stacks formed using the hard masks. A shape difference D of the side face facing in the X direction of the resist pattern 150D is larger than 0.

At this time, the position of the side face of the resist pattern 150D may be checked with reference to the stacks formed using the hard masks, and the resist pattern 150D may be formed afresh as needed.

Subsequently, etching is performed using the resist pattern 150D as a mask. This removes three sacrifice layers 71 and three insulation layers 72 from the portion of the stack 80 not covered by the resist pattern 150D, thereby forming one step S. Hereinafter, such a step S will be called "tri-step S". Also, the stacks formed using the hard masks are transferred to the lower layer portion.

Figure 35:
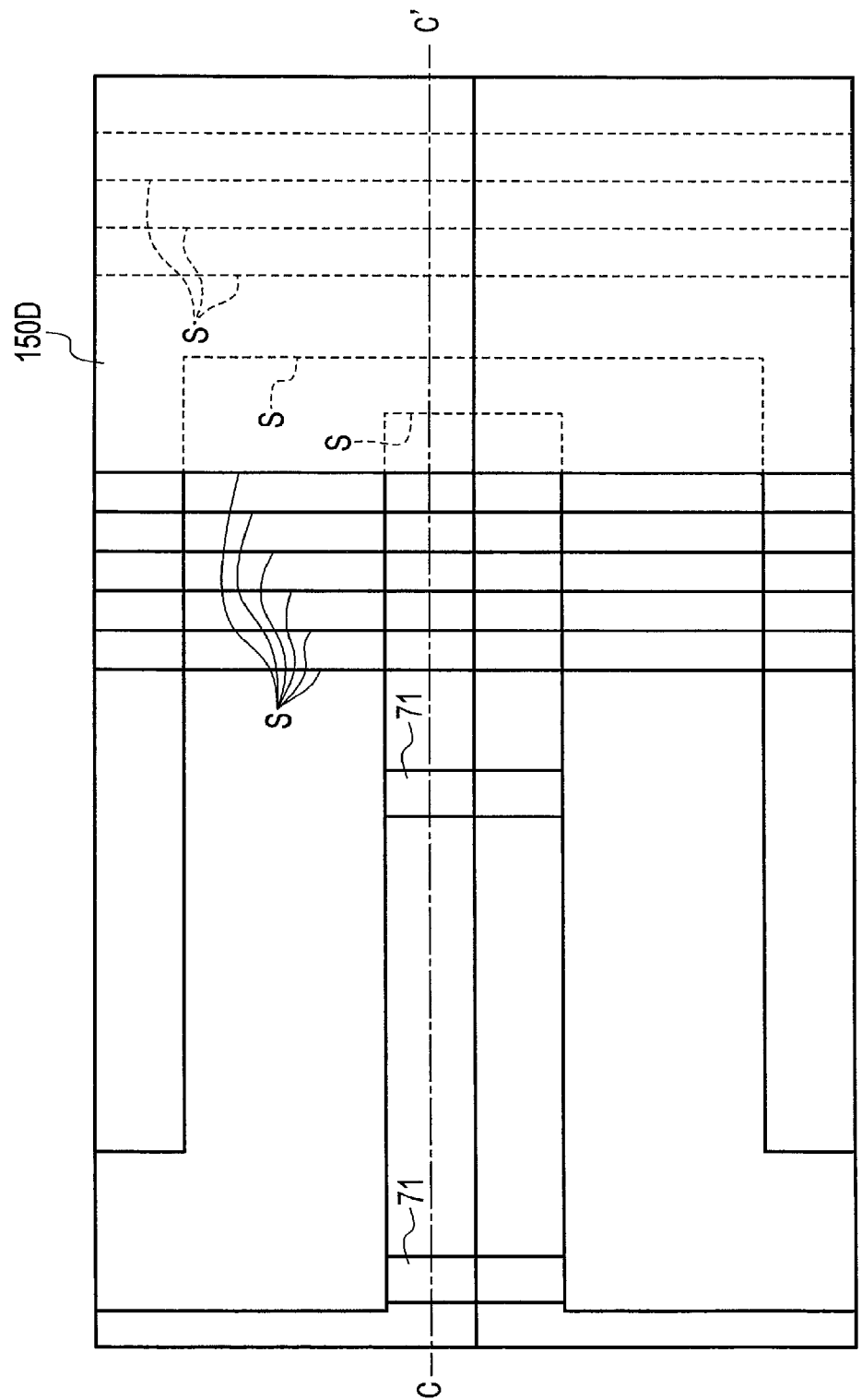
FIG. 35 is a planar view illustrating the method for manufacturing the staircase area in the semiconductor device according to the second embodiment.
Figure 36:
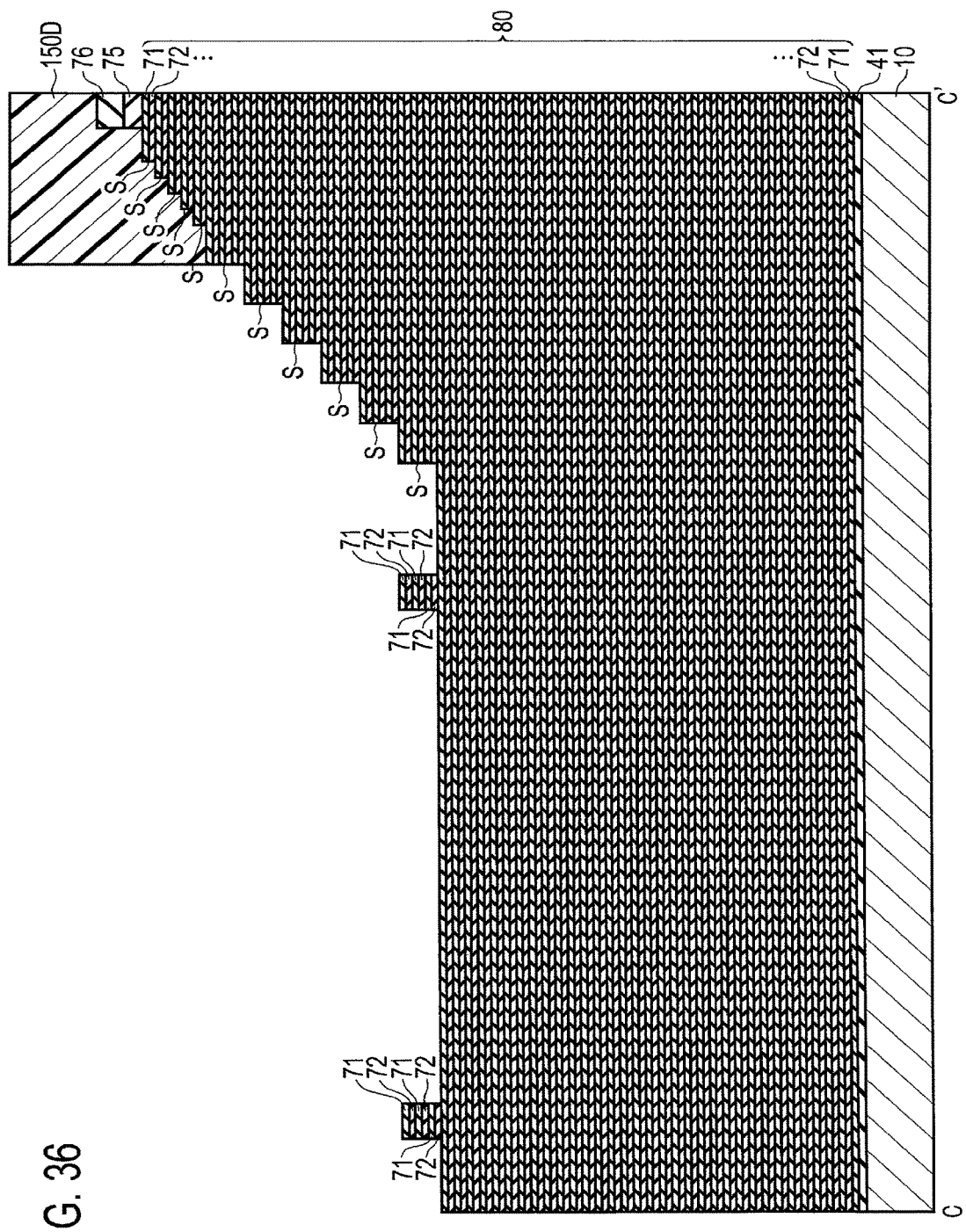
FIG. 36 is a sectional view illustrating the method for manufacturing the staircase area in the semiconductor device according to the second embodiment.

Next, as shown in FIGS. 35 and 36, slimming processes for the resist pattern 150D and etching processes using the resist pattern 150D as a mask are alternately repeated. Five slimming processes and five etching processes are performed here. With each etching, three sacrifice layers 71 and three insulation layers 72 are removed. Accordingly, six tri-steps S are formed in the area R2. As the slimming is repeated, the shape difference D of the resist pattern 150D becomes smaller, and the error E becomes larger. Also, the stacks formed using the hard masks are transferred to the lower layer portion. The resist pattern 150D is then removed.

Figure 38:
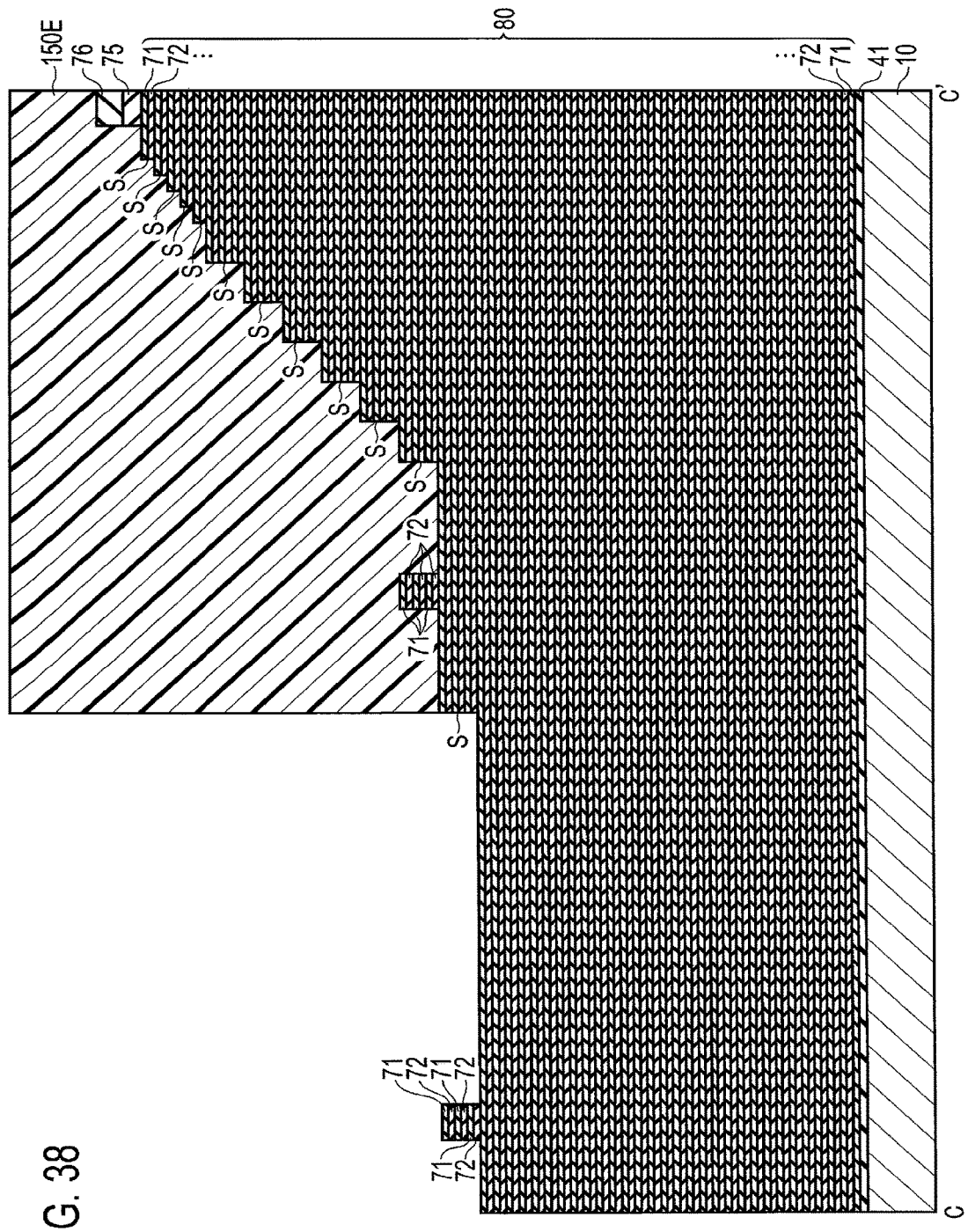
FIG. 38 is a sectional view illustrating the method for manufacturing the staircase area in the semiconductor device according to the second embodiment.

Next, as shown in FIGS. 37 and 38, a resist pattern 150E is formed on the stack 80 and the stopper layer 76. The resist pattern 150E adopts a shape of a quadrate with acute corners. The resist pattern 150E exposes part of the stack 80 and covers the remaining portion of the stack 80. Also, the resist pattern 150E exposes the stack formed using the hard mask, which is the outermost stack in the X direction (projecting stack), while covering the other stack formed using the hard mask (stepped stack). The resist pattern 150E here has the side face facing in the X direction having a shape difference D that is larger than 0.

At this time, the position of the side face of the resist pattern 150E may be checked with reference to the X-direction outermost stack formed using the hard mask. The resist pattern 150E may be formed afresh as needed.

Etching is then performed using the resist pattern 150E as a mask. This removes three sacrifice layers 71 and three insulation layers 72 from the portion of the stack 80 not covered by the resist pattern 150E, thereby forming one tri-step S. Also, the projecting stack is transferred to the lower layer portion.

Figure 39:
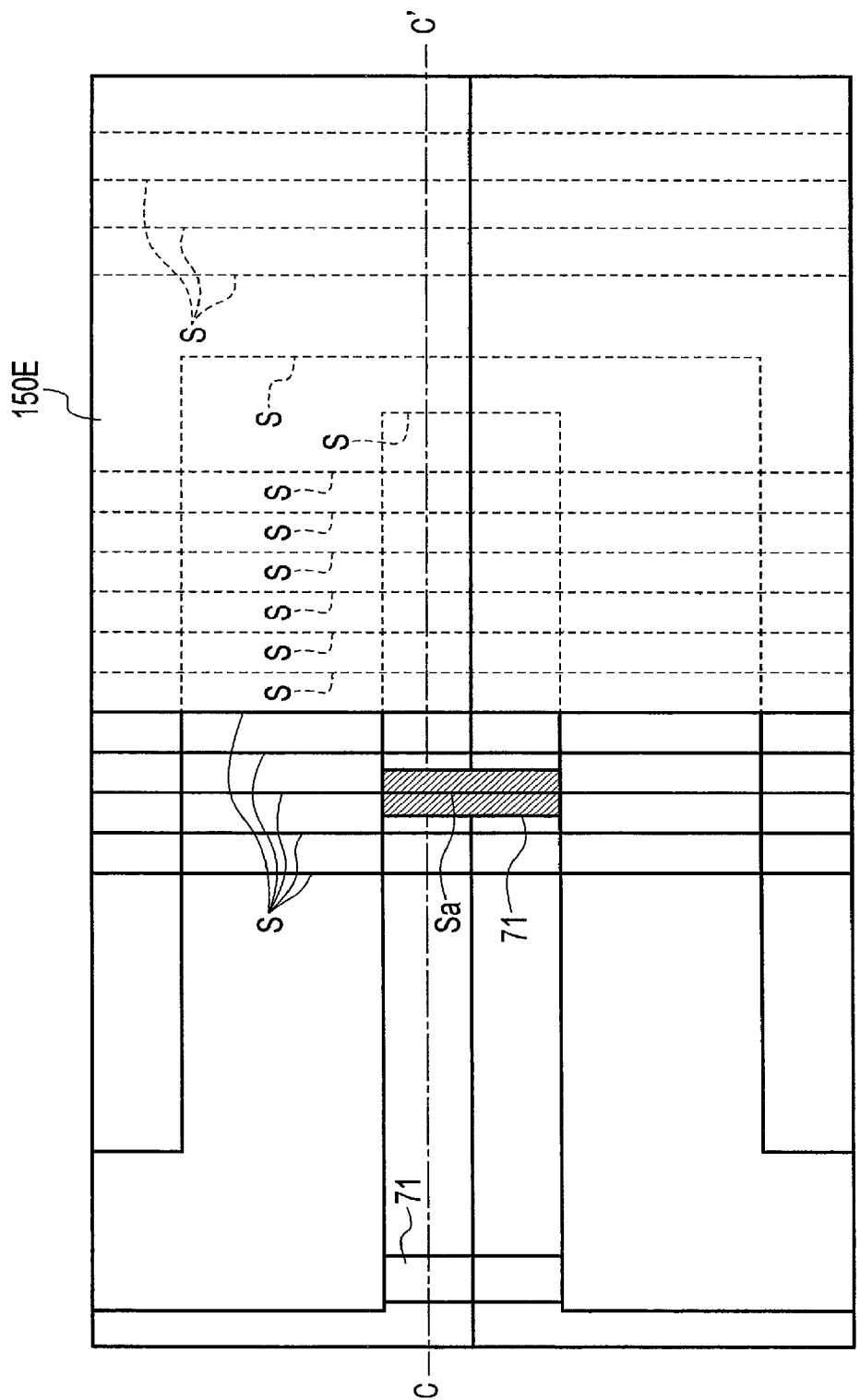
FIG. 39 is a planar view illustrating the method for manufacturing the staircase area in the semiconductor device according to the second embodiment.
Figure 40:
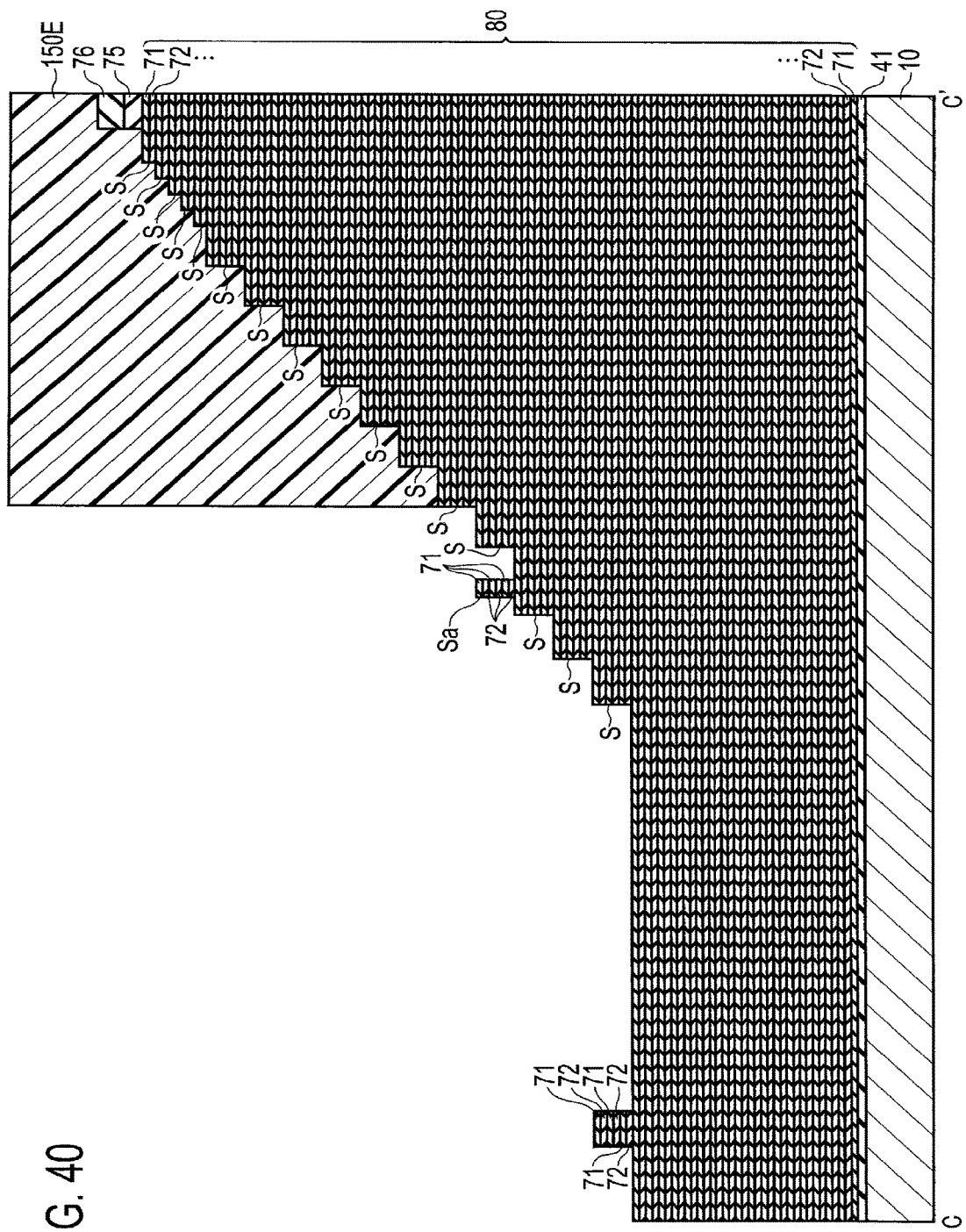
FIG. 40 is a sectional view illustrating the method for manufacturing the staircase area in the semiconductor device according to the second embodiment.

Next, as shown in FIGS. 39 and 40, slimming processes for the resist pattern 150E and etching processes using the resist pattern 150E as a mask are repeated alternately. Four slimming processes and four etching processes are performed here. With each etching, three sacrifice layers 71 and three insulation layers 72 are removed. Accordingly, five tri-steps S are formed in the area R3. As the slimming is repeated, the shape difference D of the resist pattern 150E becomes smaller. This results in an increase of the error E. Also, a tri-step Sa is formed in the stepped stack, and the shape of the tri-step Sa is transferred to the lower layer portion. Furthermore, the shape of the projecting stack is transferred to the lower layer portion. The resist pattern 150E is then removed.

Figure 41:
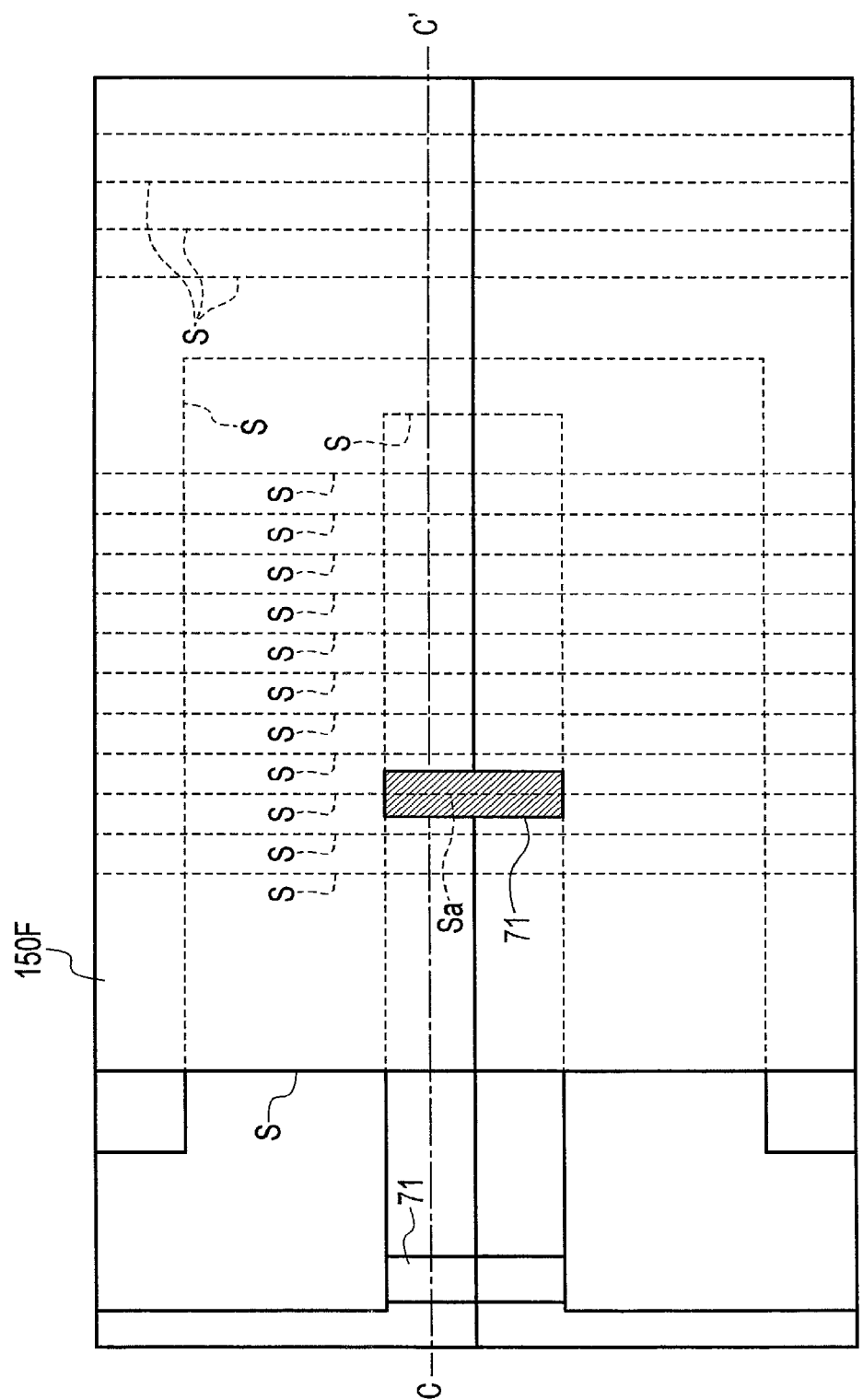
FIG. 41 is a planar view illustrating the method for manufacturing the staircase area in the semiconductor device according to the second embodiment.
Figure 42:
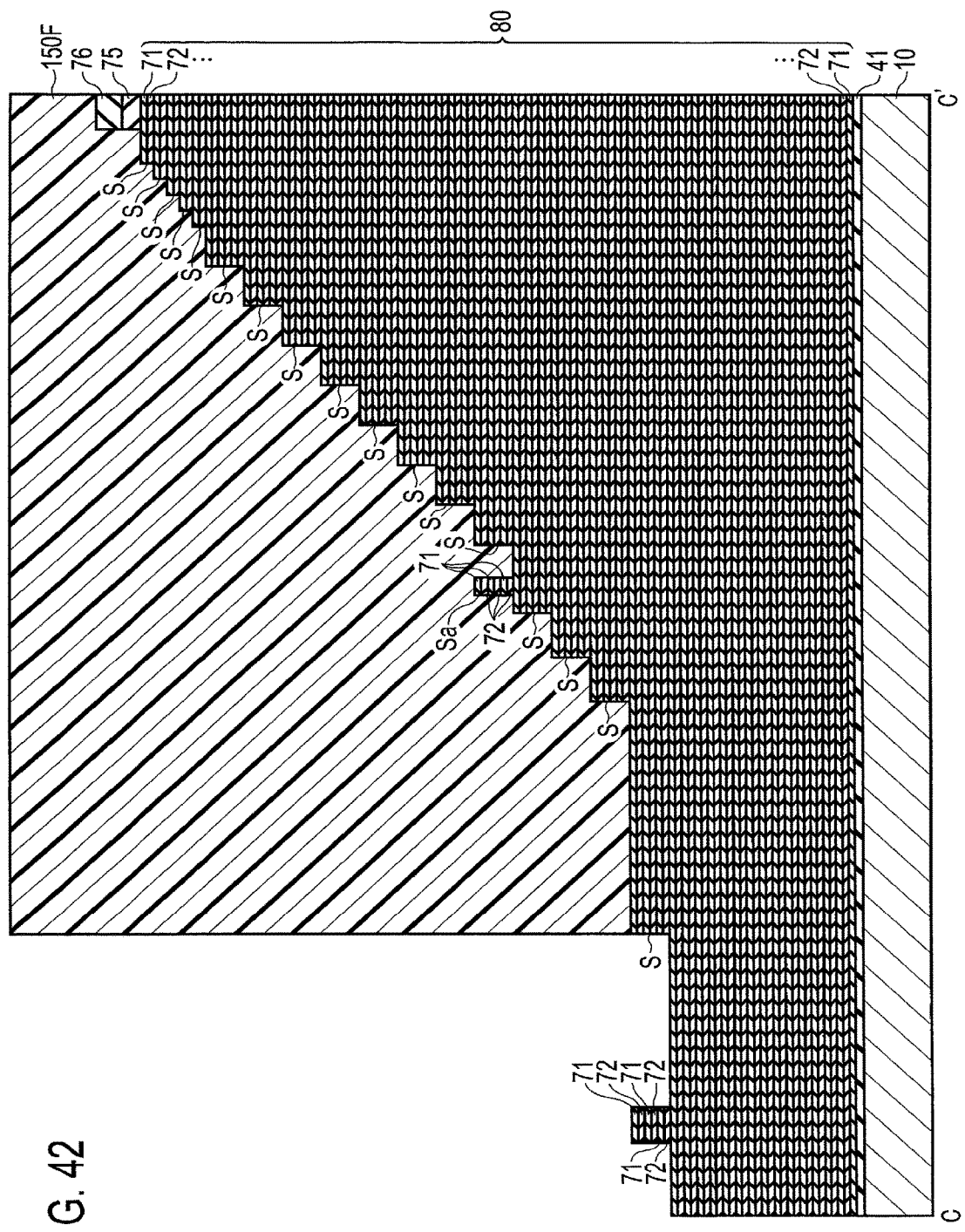
FIG. 42 is a sectional view illustrating the method for manufacturing the staircase area in the semiconductor device according to the second embodiment.

Next, as shown in FIGS. 41 and 42, a resist pattern 150F is formed on the stack 80 and the stopper layer 76. The resist pattern 150F adopts a shape of a quadrate with acute corners. The resist pattern 150F exposes part of the stack 80 and covers the remaining portion of the stack 80. The resist pattern 150F exposes the projecting stack, while covering the stepped stack. The resist pattern 150F here has the side face facing in the X direction having a shape difference D that is larger than 0.

At this time, the position of the side face of the resist pattern 150F may be checked with reference to the projecting stack, and the resist pattern 150F may be formed afresh as needed.

Subsequently, etching is performed using the resist pattern 150F as a mask. This removes three sacrifice layers 71 and three insulation layers 72 from the portion of the stack 80 not covered by the resist pattern 150F, thereby forming one tri-step S. Also, the shape of the projecting stack is transferred to the lower layer portion.

Figure 43:
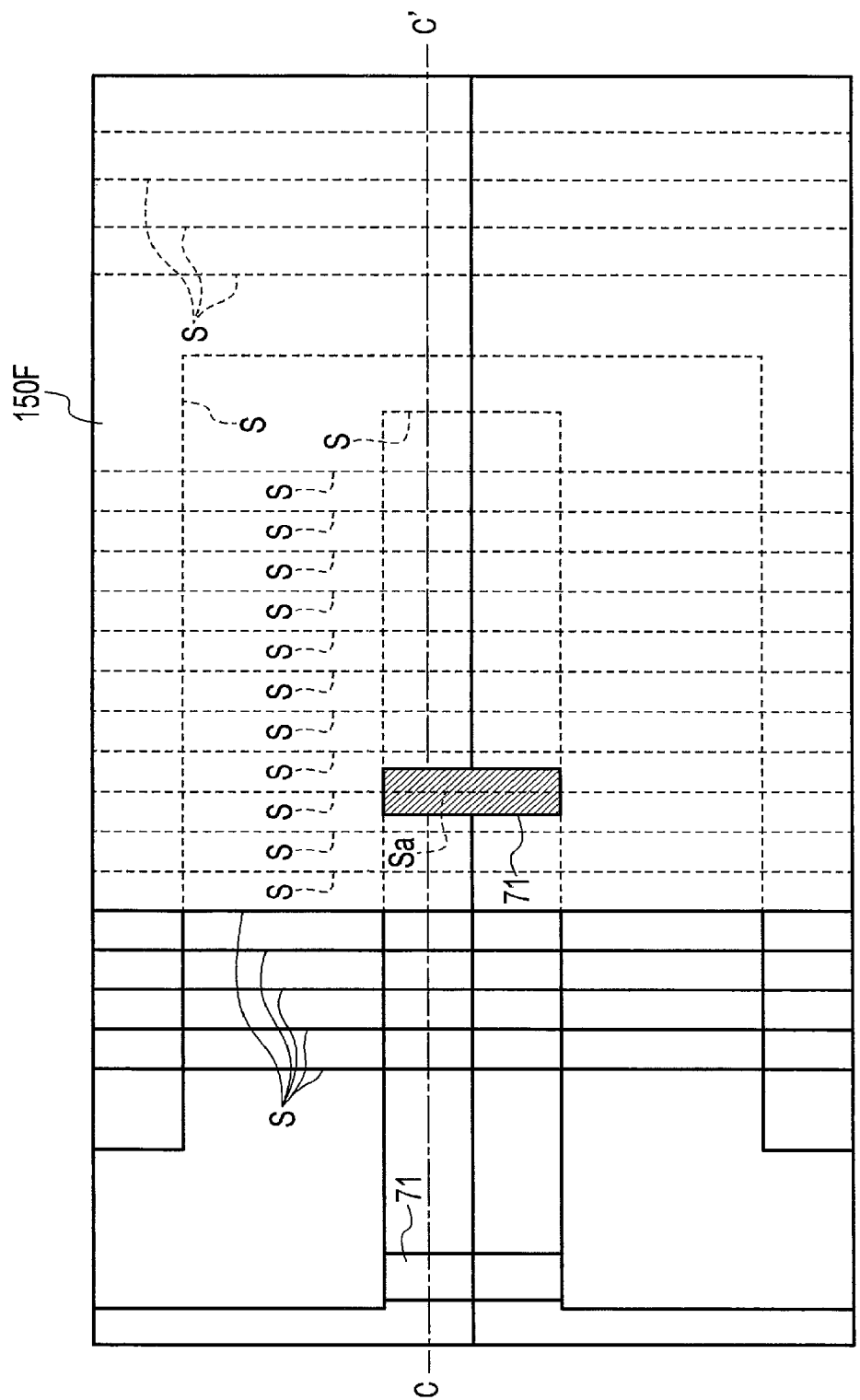
FIG. 43 is a planar view illustrating the method for manufacturing the staircase area in the semiconductor device according to the second embodiment.
Figure 44:
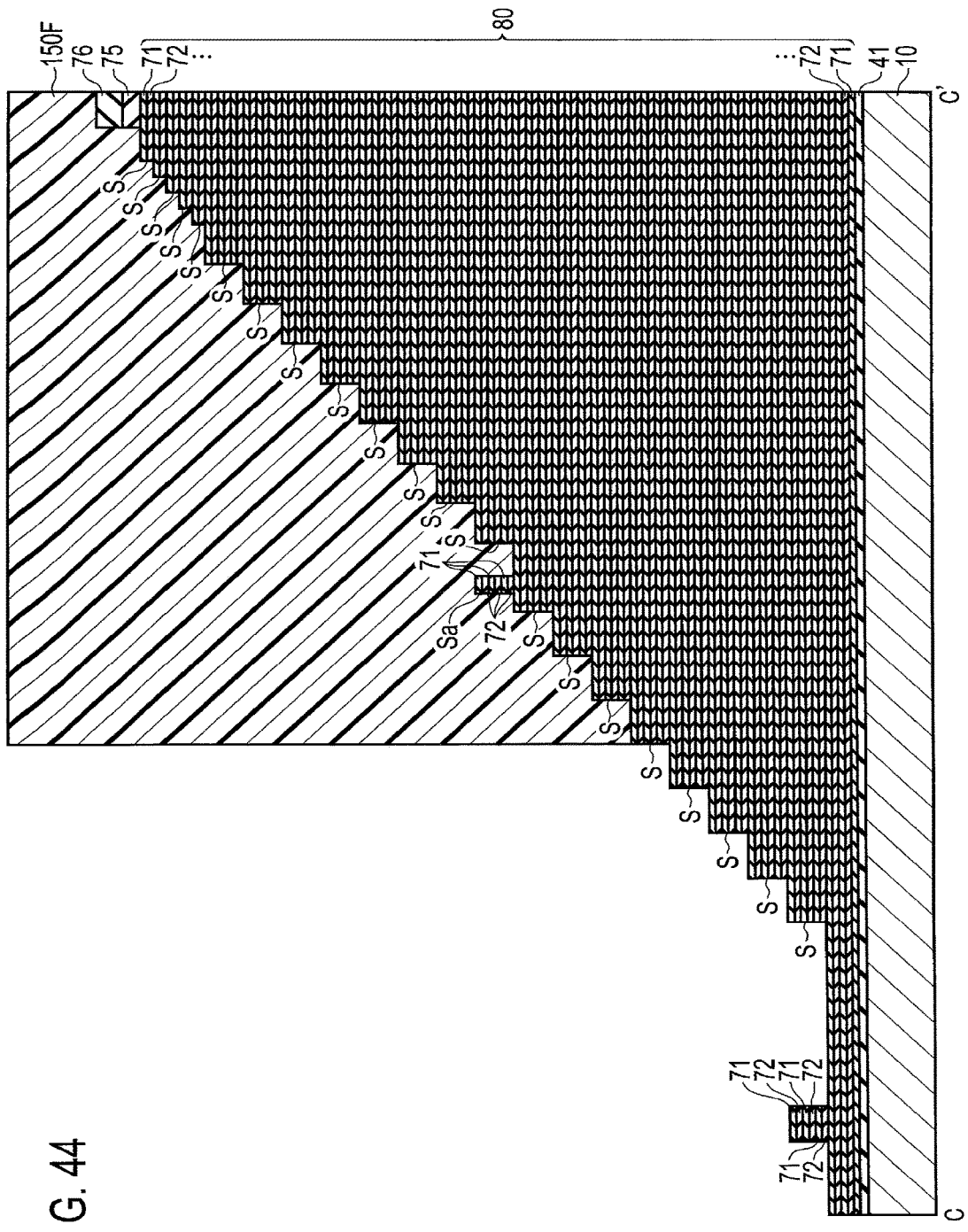
FIG. 44 is a sectional view illustrating the method for manufacturing the staircase area in the semiconductor device according to the second embodiment.

Next, as shown in FIGS. 43 and 44, slimming processes for the resist pattern 150F and etching processes using the resist pattern 150F as a mask are repeated alternately. Four slimming processes and four etching processes are performed here. With each etching, three sacrifice layers 71 and three insulation layers 72 are removed. Accordingly, five tri-steps S are formed in the area R4. As the slimming is repeated, the shape difference D of the resist pattern 150F becomes smaller, resulting in an increase of the error E. Also, the shape of the projecting stack is transferred to the lower layer portion. The resist pattern 150F is then removed.

Figure 45:
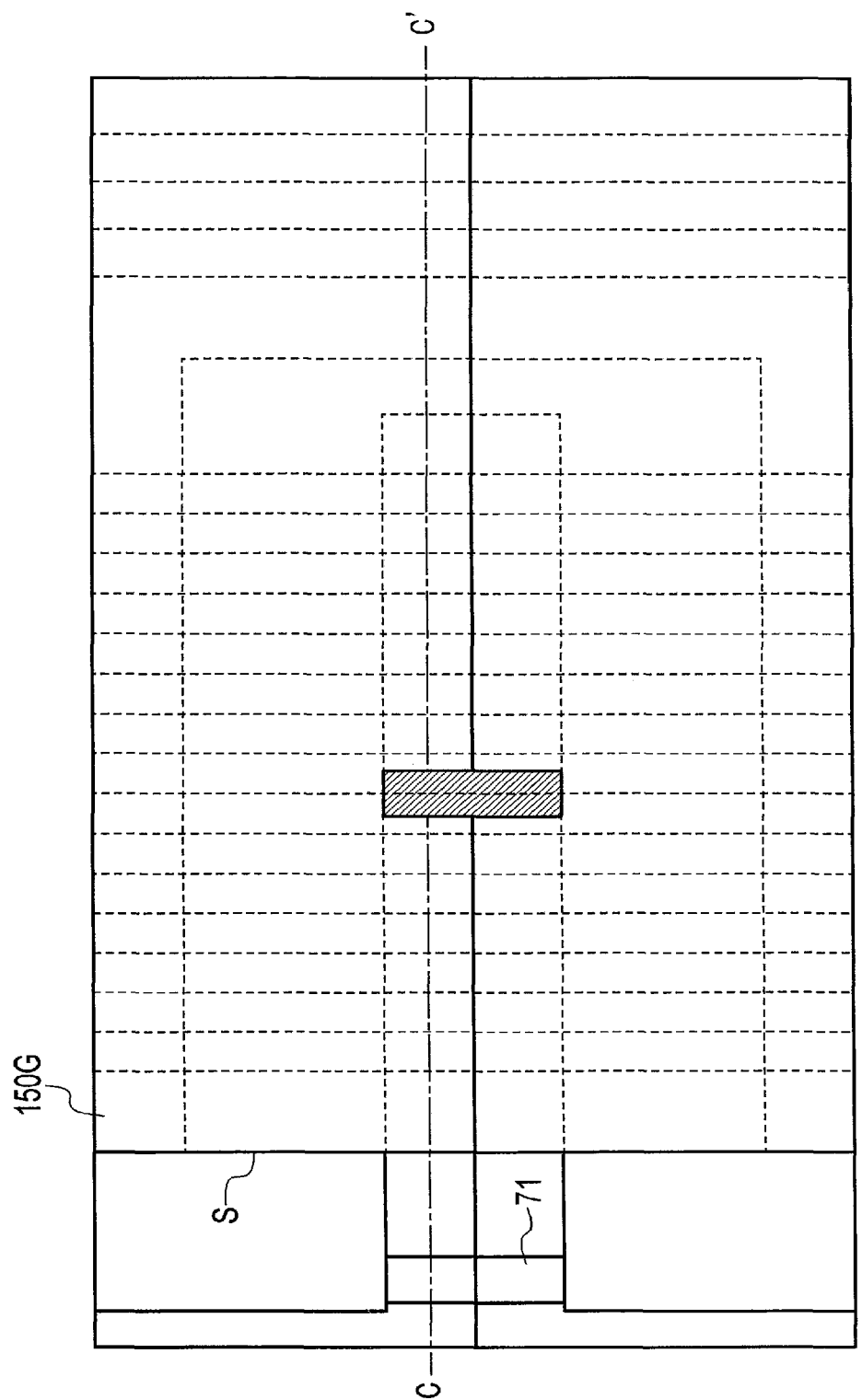
FIG. 45 is a planar view illustrating the method for manufacturing the staircase area in the semiconductor device according to the second embodiment.
Figure 46:
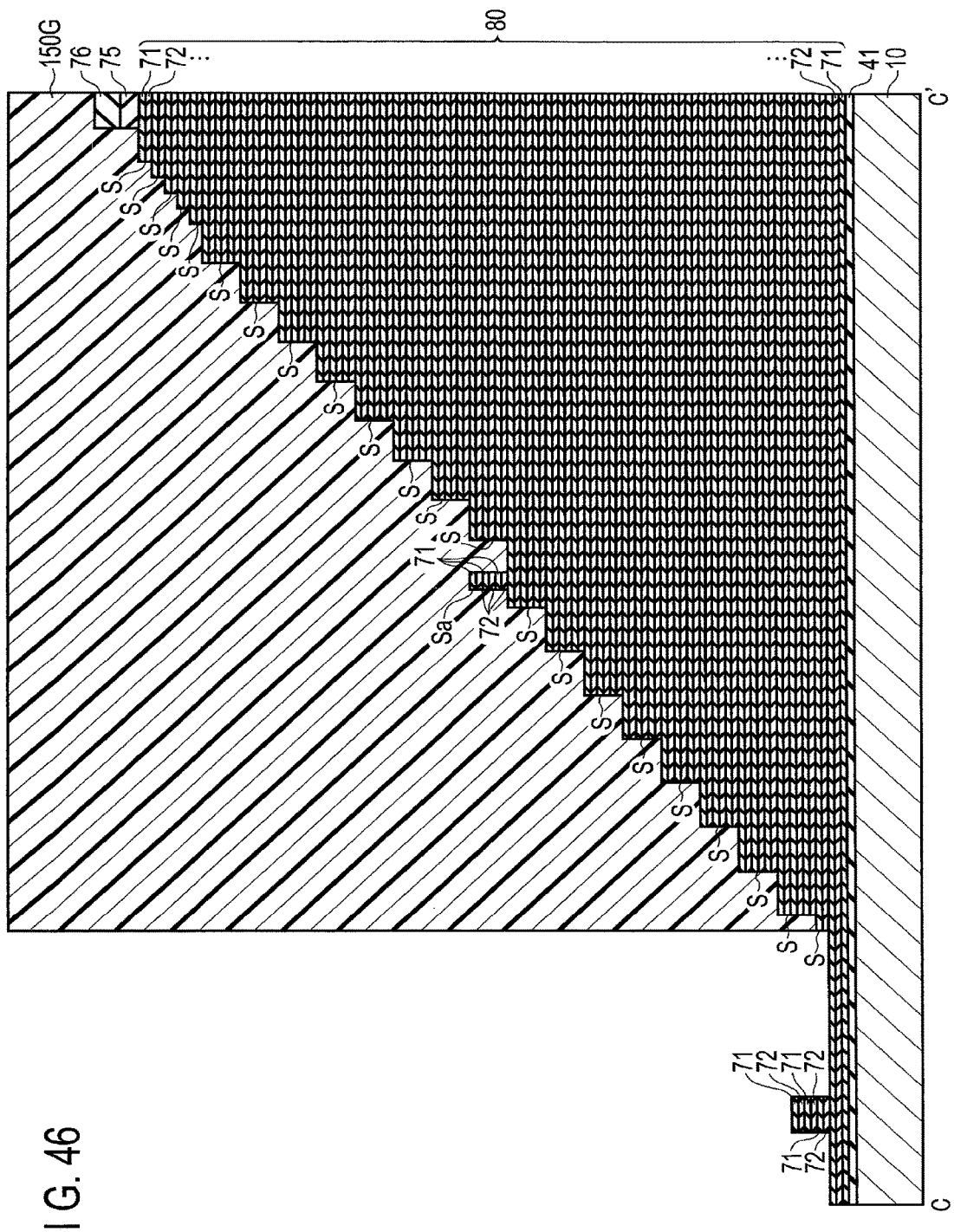
FIG. 46 is a sectional view illustrating the method for manufacturing the staircase area in the semiconductor device according to the second embodiment.

Next, as shown in FIGS. 45 and 46, a resist pattern 150G is formed on the stack 80 and the stopper layer 76. The resist pattern 150G adopts a shape of a quadrate with acute corners. The resist pattern 150G exposes part of the stack 80 and covers the remaining portion of the stack 80. The resist pattern 150G exposes the projecting stack, while covering the stepped stack. The resist pattern 150G here has the side face facing in the X direction with a shape difference D that is larger than 0.

At this time, the position of the side face of the resist pattern 150G may be checked with reference to the projecting stack, and the resist pattern 150G may be formed afresh as needed.

Subsequently, etching is performed using the resist pattern 150G as a mask. This removes one sacrifice layer 71 and one insulation layer 72 from the portion of the stack 80 not covered by the resist pattern 150G, thereby forming one mono-step S. Also, the shape of the projecting stack is transferred to the lower layer portion.

Figure 48:
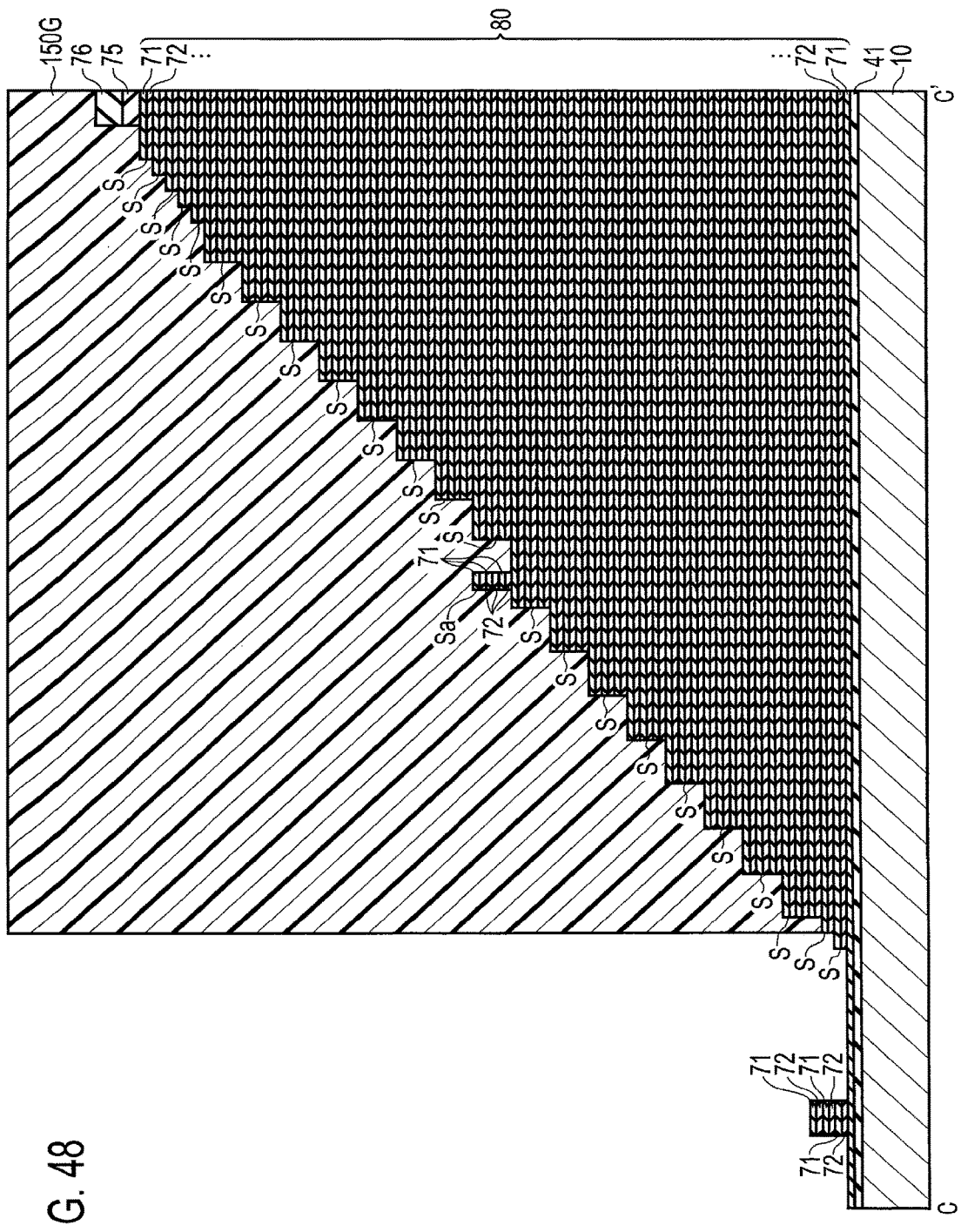
FIG. 48 is a sectional view illustrating the method for manufacturing the staircase area in the semiconductor device according to the second embodiment.

Next, as shown in FIGS. 47 and 48, slimming the resist pattern 150G and etching with the resist pattern 150G as a mask are performed. By the etching, one sacrifice layer 71 and one insulation layer 72 are removed. Accordingly, two mono-steps S are formed in the area R5. Along with the slimming, the shape difference D of the resist pattern 150G becomes smaller, and the error E becomes larger. Also, the shape of the projecting stack is transferred to the lower layer portion. The resist pattern 150G is then removed.

Figure 49:
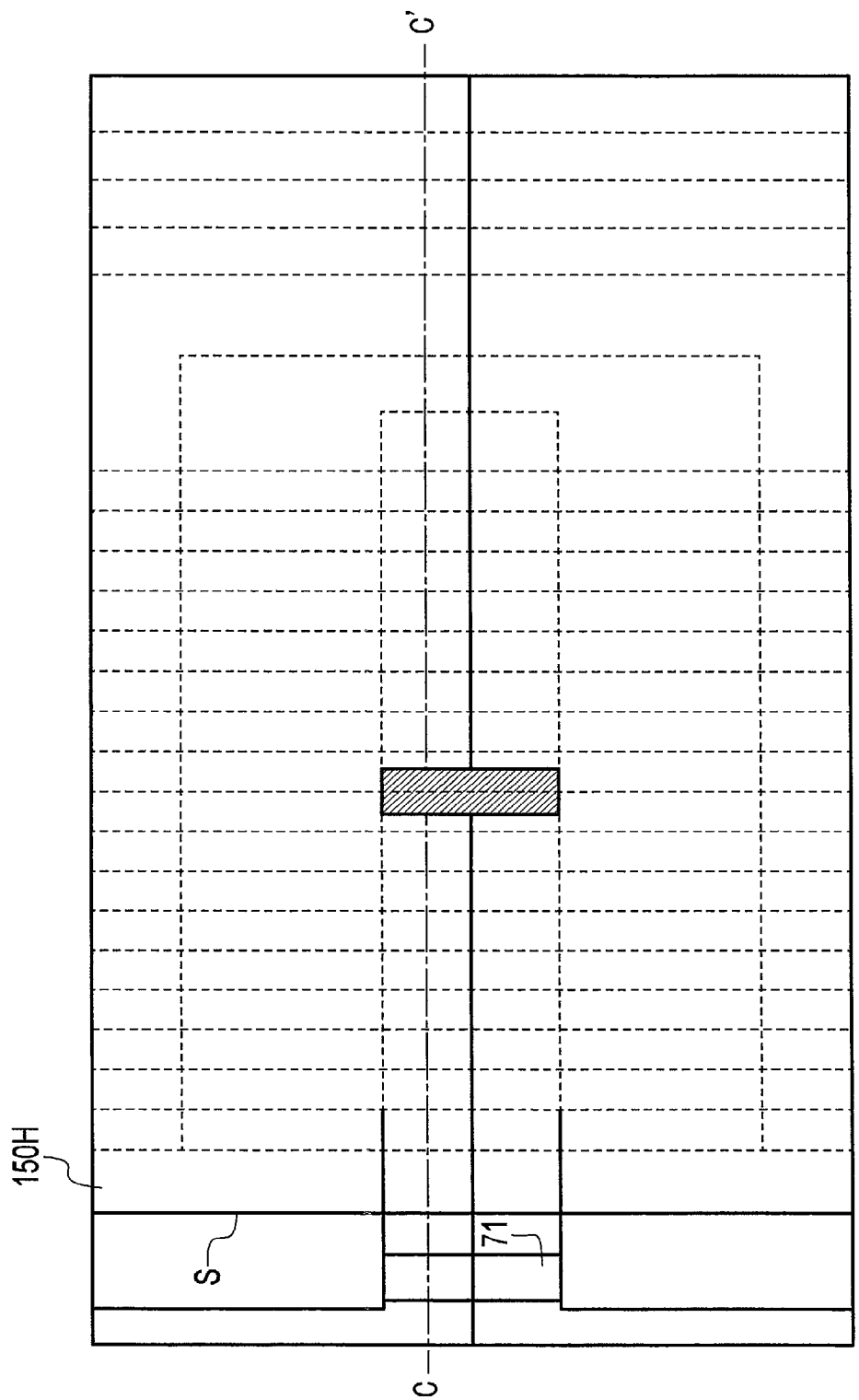
FIG. 49 is a planar view illustrating the method for manufacturing the staircase area in the semiconductor device according to the second embodiment.
Figure 50:
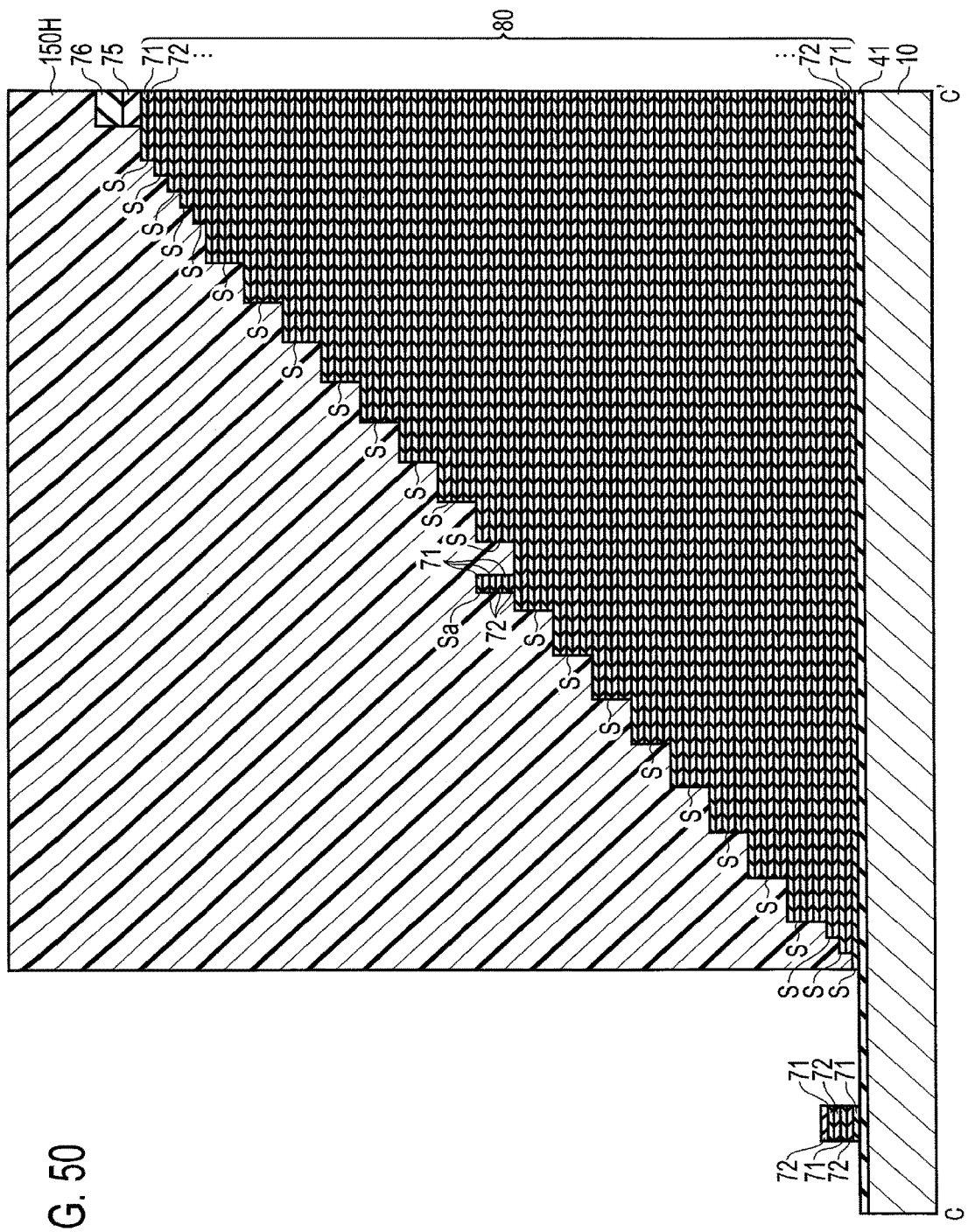
FIG. 50 is a sectional view illustrating the method for manufacturing the staircase area in the semiconductor device according to the second embodiment.

Next, as shown in FIGS. 49 and 50, a resist pattern 150H is formed on the stack 80 and the stopper layer 76. The resist pattern 150H is of a quadrate shape. The resist pattern 150H covers the stack 80. Also, the resist pattern 150H exposes the projecting stack, while covering the stepped stack. In other words, a side face facing in the X direction of the resist pattern 150H positions between the projecting stack and the step S that is the lowermost step in the area R5.

At this time, the position of the side face of the resist pattern 150H may be checked with reference to the projecting stack, and the resist pattern 150H may be formed afresh as needed.

Subsequently, etching is performed using the resist pattern 150H as a mask. This removes one sacrifice layer 71 from the portion of the stack 80 not covered by the resist pattern 150H, thereby forming one mono-step S. Consequently, among the sacrifice layers 71 and the insulation layers 72 shown in FIG. 22, the portions not covered by any of the resist patterns 150A to 150H have all been removed, and the insulation layer 41 is exposed between the stack 80 covered by the resist pattern 150H and the projecting stack. Furthermore, the shape of the projecting stack is transferred to the lower layer portion.

Figure 51:
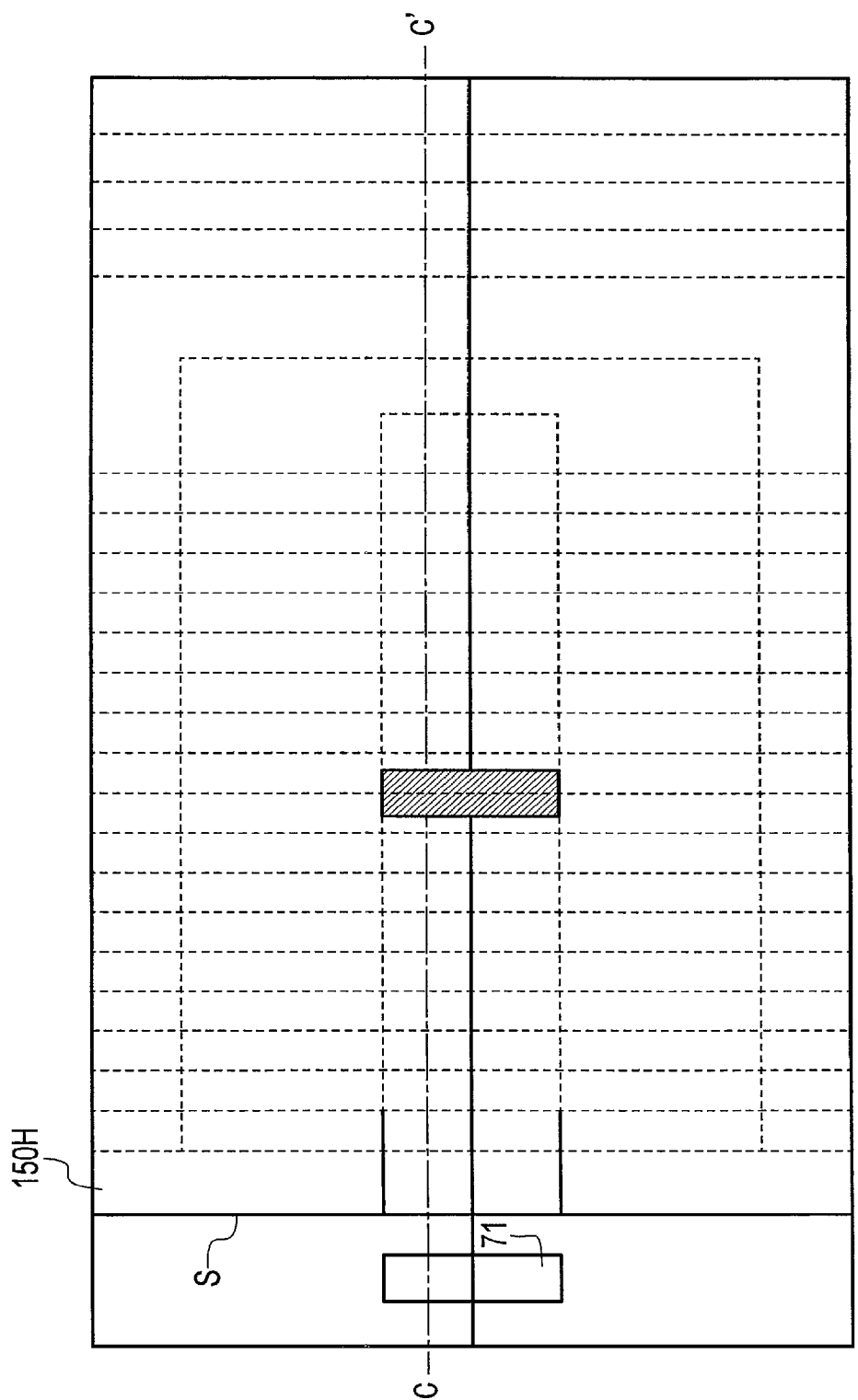
FIG. 51 is a planar view illustrating the method for manufacturing the staircase area in the semiconductor device according to the second embodiment.
Figure 52:
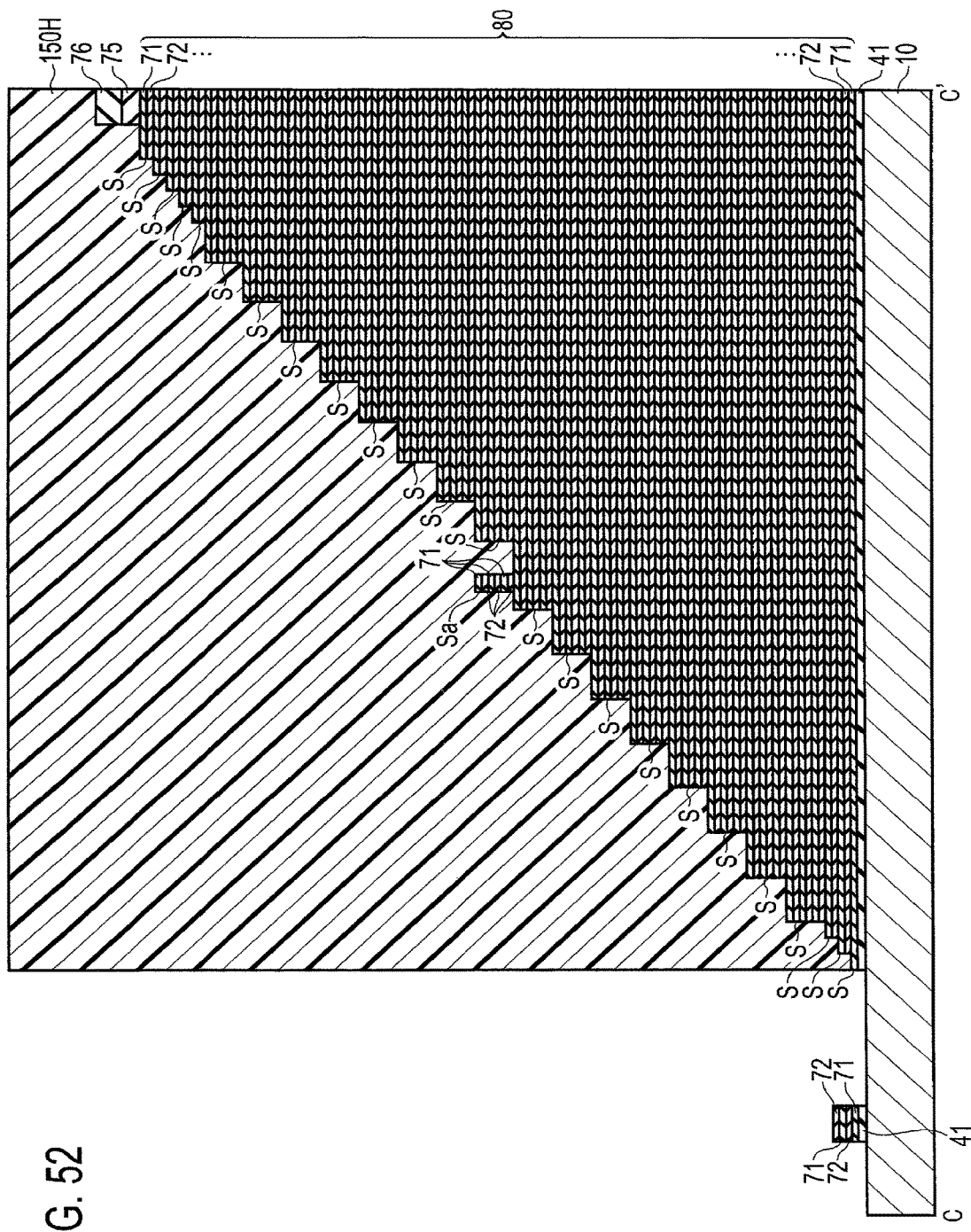
FIG. 52 is a sectional view illustrating the method for manufacturing the staircase area in the semiconductor device according to the second embodiment.

Now, as shown in FIGS. 51 and 52, further etching is performed using the resist pattern 150H as mask. This removes the lowermost sacrifice layer 71 and the lowermost insulation layer 72 surviving at the portion once covered by the resist pattern 150C in the process shown in FIG. 29 on the X-direction external side of the side face of the resist pattern 150H. The stack 80 is thereby partitioned from the surroundings. Also, the insulation layer 41 is removed and the semiconductor substrate 10 is exposed between the stack 80 covered by the resist pattern 150H and the projecting stack. At this time, one insulation layer 72 and one sacrifice layer 71 are also removed from the projecting stack so that the stack 90 including two insulation layers 72 and two sacrifice layers 71 is formed on the semiconductor substrate 10 via the insulation layer 41. Also, the stepped stack becomes the stack 90 on the step S of the stack 80.

Next, an inter-layer insulation layer (not illustrated) is provided over the whole body. This inter-layer insulation layer is flattened using the stopper layer 76 as a stopper. The stopper layer 76 is then removed, and memory cells are formed within the stack 80. Subsequently, a slit or slits extending in the X direction are formed in the stack 80. This divides the stack 80 into two or more segments in the Y direction. Accordingly, the terraces T, the steps S, and the stacks 90 are also each divided in the Y direction. Then, the sacrifice layers 71 are removed via the slits. Also, via the slits, the conductive layers 70 are buried into the spaces which are left after the removal of the sacrifice layers 71. In this manner, the semiconductor device 1 according to the second embodiment is manufactured.

Note that the positions of the stacks 90 are not limited to what have been discussed, but may be discretionarily determined. Accordingly, the slits may not have to divide each stack 90. In such instances, the sacrifice layers 71 of the stacks 90 are not removed via the slits, and these sacrifice layers 71 remain in the stacks 90. As such, the stacks 90 are each retained as a structure in which the sacrifice layers 71 and the insulation layers 72 are alternately stacked.

Effects of Second Embodiment

According to the second embodiment already described, the insulation layer 75 and the stopper layer 76, formed on the stack 80, are used as the hard mask discussed for the first embodiment. This allows for the formation of the stacks 90 as the positional references, and the same effects as in the first embodiment can be obtained.

Third Embodiment

A semiconductor device according to a third embodiment will be described with reference to FIGS. 53 to 56. The third embodiment uses, as the hard masks, portions of the insulation layer 75 and the stopper layer 76 formed on the stack 80.

For the third embodiment, descriptions overlapping with the second embodiment will be omitted. Descriptions will be provided mainly of the features, etc., which differ from the second embodiment.

Configurations for Third Embodiment

Figure 53:
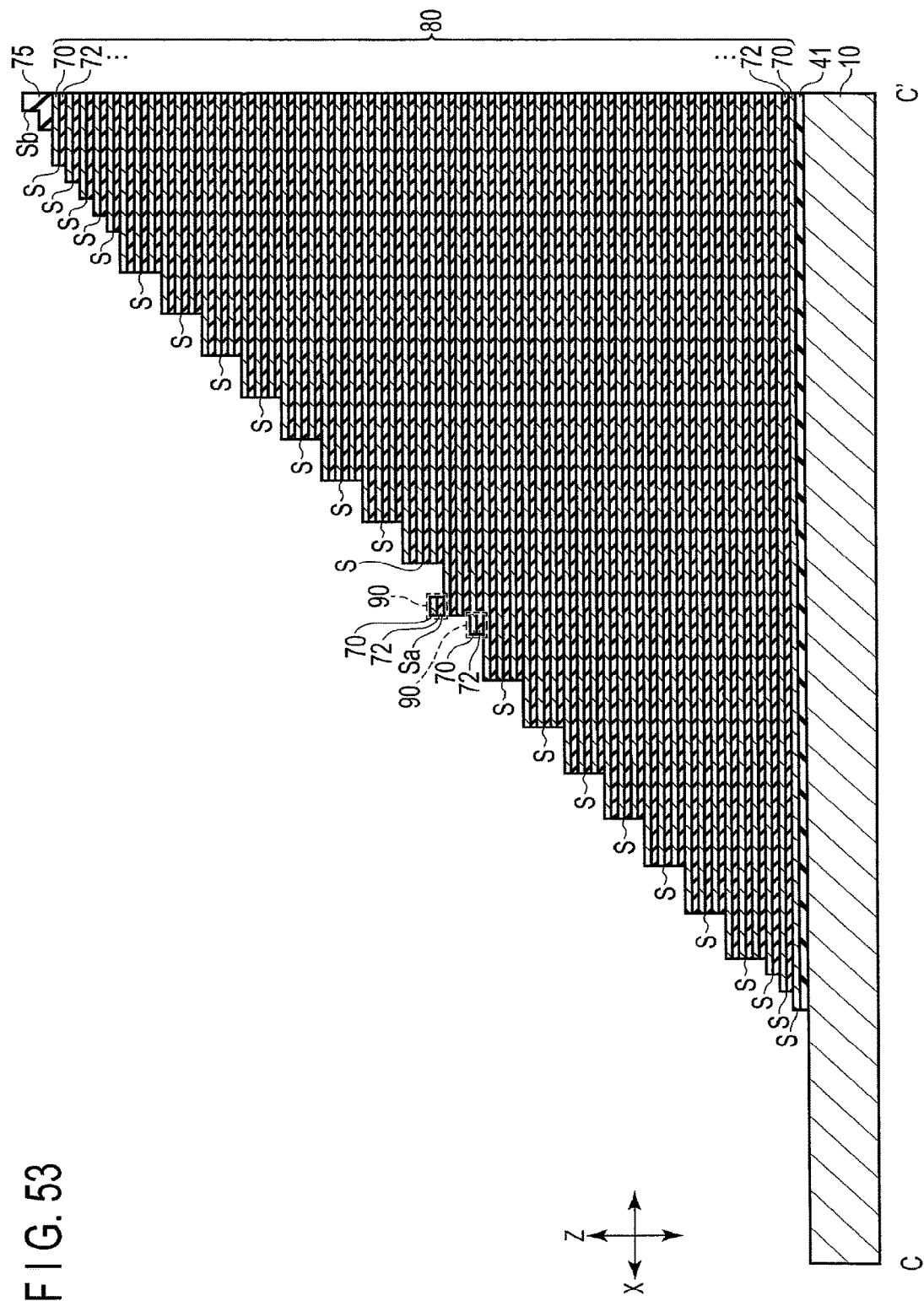
FIG. 53 is a sectional view of a staircase area in a semiconductor device according to a third embodiment.

FIG. 53 is a sectional view taken along the line C-C' in FIG. 20, and shows the section of the staircase area 130 in the semiconductor device 1 according to the third embodiment.

As shown in FIG. 53, the third embodiment differs from the second embodiment in terms of the thickness of the multiple stacks 90.

The stacks 90 (stepped stack) on the stack 80 each include one conductive layer 70 and one insulation layer 72. Each stack 90 is a partial division from the stack 80, and includes the same layers as the stack 80 does. Note that this embodiment does not have a stack (projecting stack) located outside the stack 80. That is, as will be discussed in relation to the manufacturing processes, the projecting stack outside the stack 80 is formed during the staircase fabrication in the stack 80 for the end portion 100a, but the layers constituting this projecting stack will also be etched and removed when the stack 80 is delimited from the surroundings by the etching with a final resist pattern for the staircase fabrication as a mask.

Also, the insulation layer 75 that may be, for example, a TEOS layer, is formed on the stack 80. The insulation layer 75 in the example below has a thickness corresponding to two conductive layers 70 and two insulation layers 72. The insulation layer 75 in this case includes a step Sb. However, the thickness of the insulation layer 75 is not limited to this.

Manufacturing Method for Third Embodiment

Figure 54:
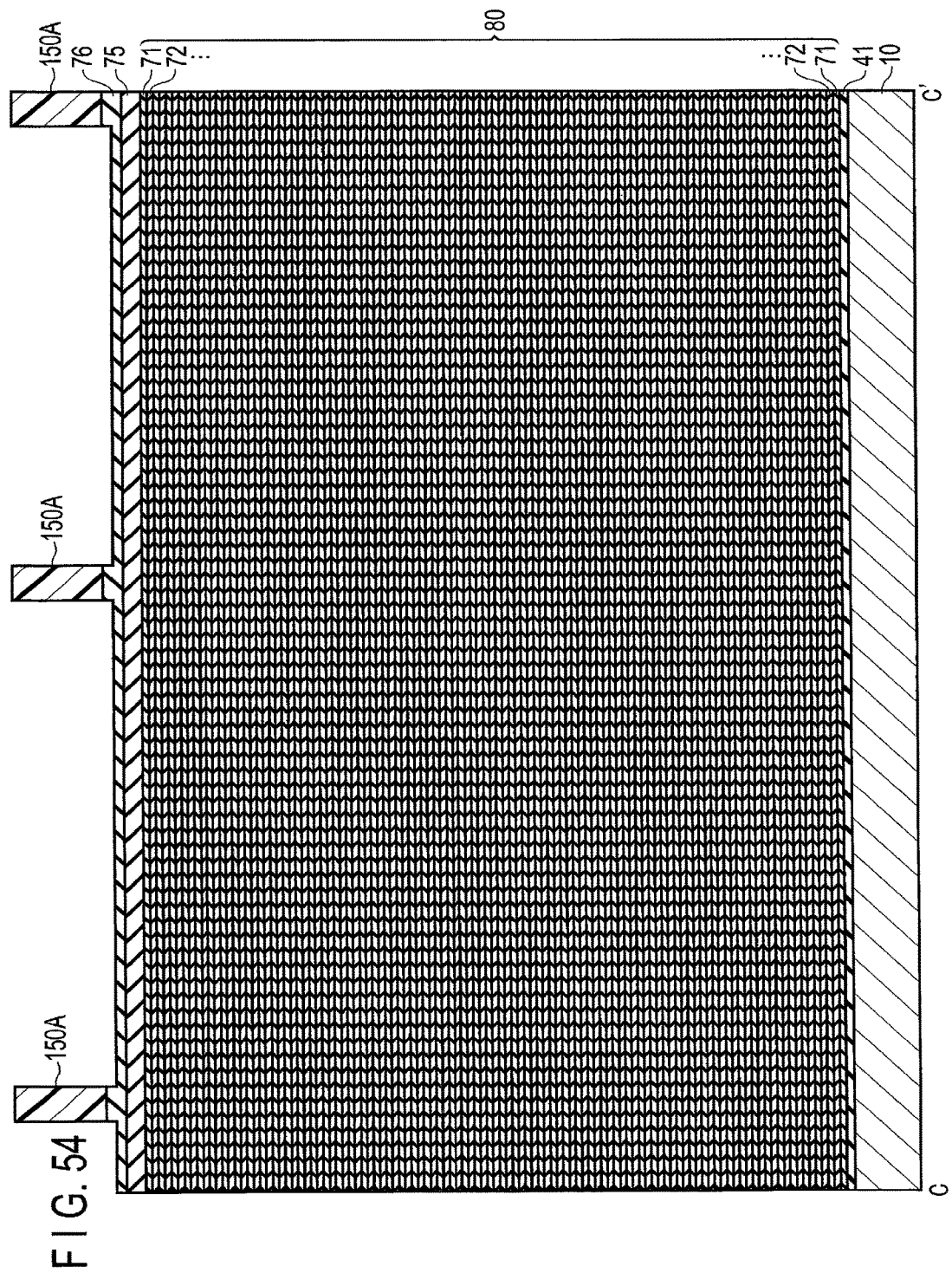
FIGS. 54, 55, and 56 are sectional views illustrating a method for manufacturing the staircase area in the semiconductor device according to the third embodiment.
Figure 55:
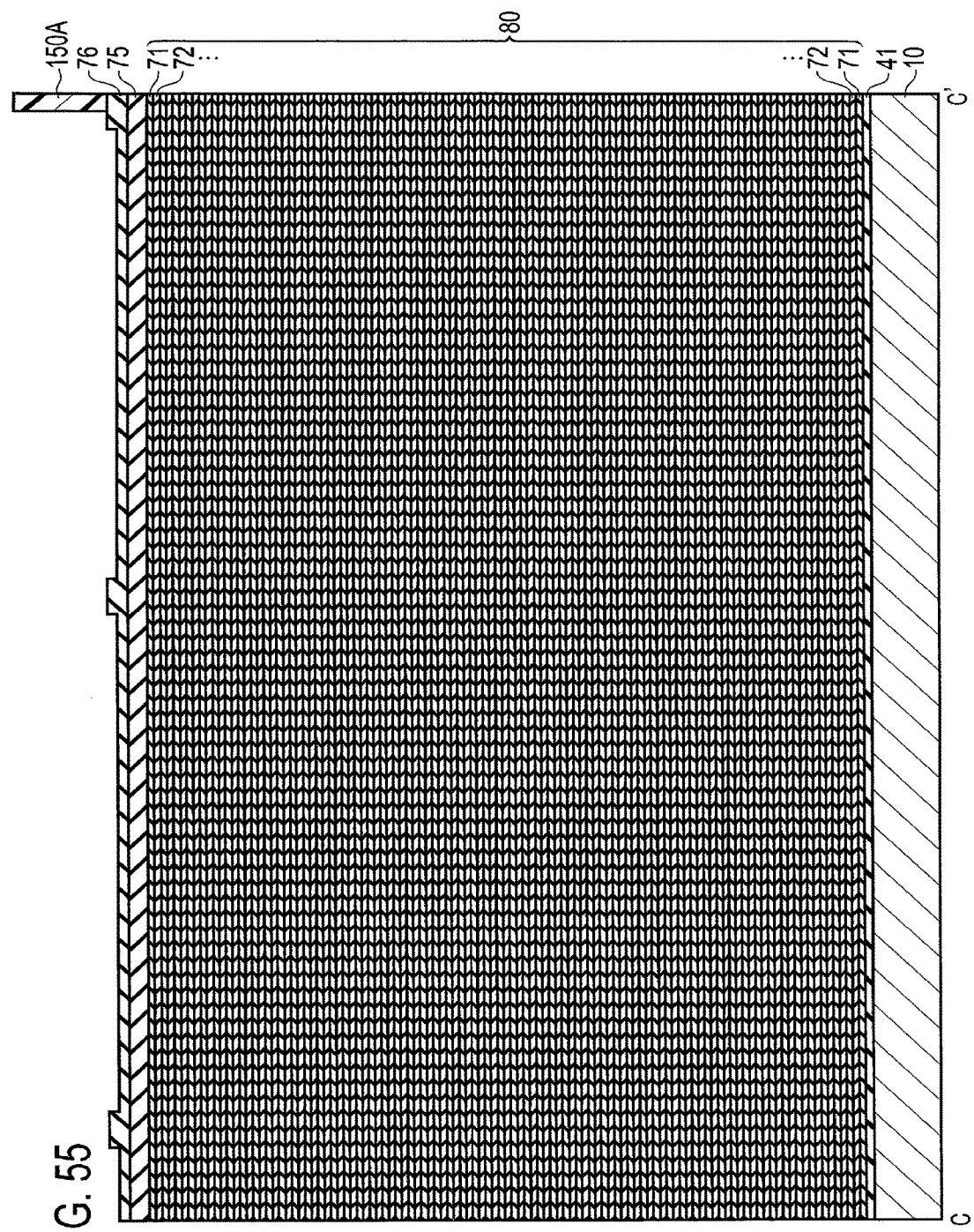
Figure 56:
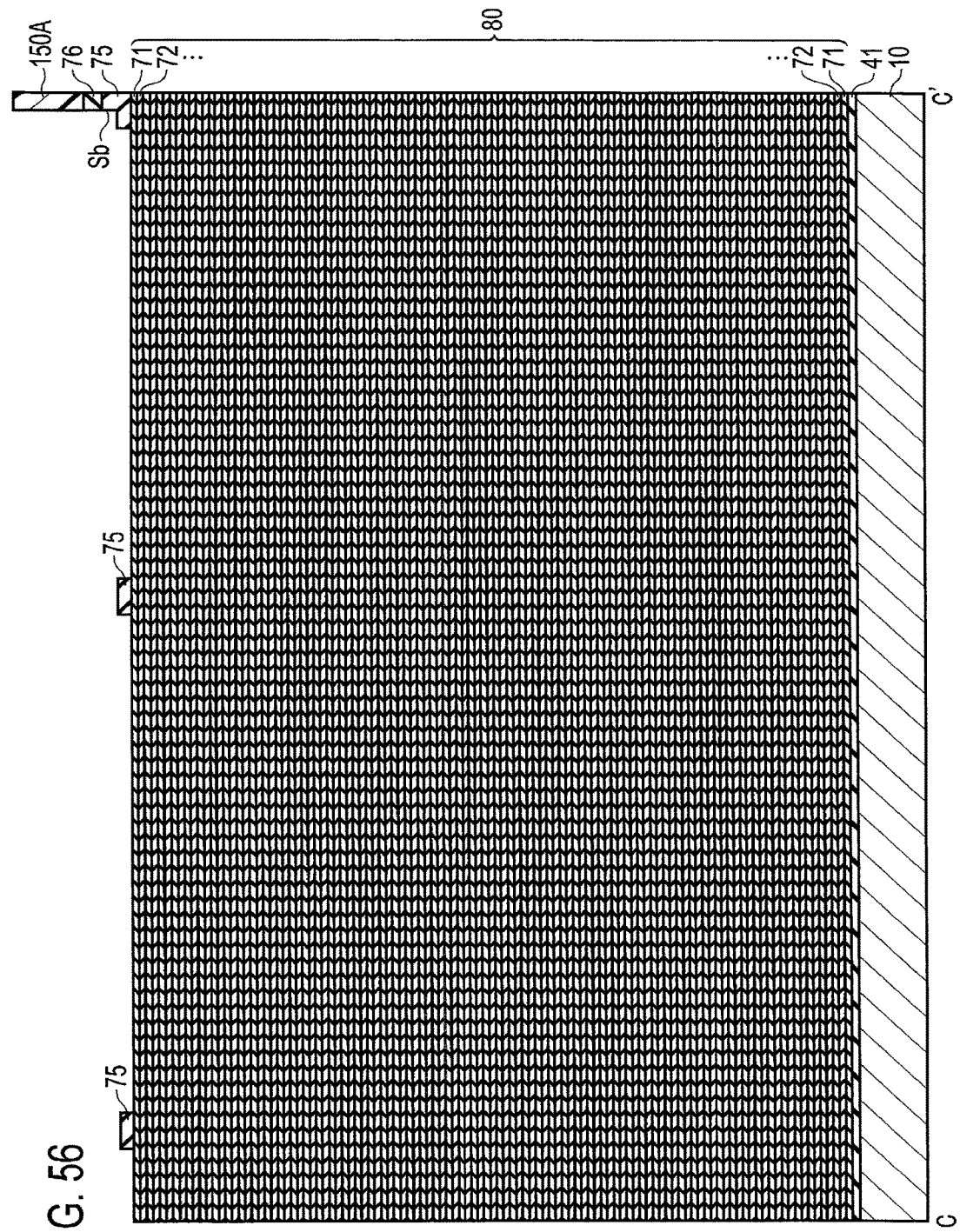

FIGS. 54 to 56 are sectional views taken along the line C-C' in the planar view, and each show the section of method for a manufacturing the staircase area 130 in the semiconductor device 1 according to the third embodiment. The description of the arc profile of the steps S will be omitted.

First, in a similar manner to the second embodiment as shown in FIG. 22, the insulation layer 41, the stack 80, the insulation layer 75, and the stopper layer 76 are formed sequentially on the semiconductor substrate 10. The insulation layer 75 has a thickness corresponding to, for example, two sacrifice layers 71 and two insulation layers 72. The stopper layer 76 has a thickness corresponding to, for example, two sacrifice layers 71 and two insulation layers 72.

Next, as shown in FIG. 54, a resist pattern 150A is formed on the stopper layer 76. The resist pattern 150A exposes part of the stopper layer 76 and covers the remaining portion of the stopper layer 76. For example, the resist pattern 150A is formed to cover the portion beside the middle portion 100*b* and the areas where the stacks 90 will be formed.

Subsequently, etching is performed using the resist pattern 150A as a mask. This process partially removes an upper portion of the stopper layer 76 not covered by the resist pattern 150A. For example, the stopper layer 76 is etched in an amount that corresponds to one sacrifice layer 71 and one insulation layer 72 (that is: if the etching rate is the same as that for the sacrifice layer 71 and the insulation layer 72, the amount equal to the total thickness of one sacrifice layer 71 and one insulation layer 72). On the other hand, the portions of the stopper layer 76 covered by the resist pattern 150A each remain in the form of a projection.

Next, as shown in FIG. 55, the resist pattern 150A is slimmed. This removes the resist pattern 150A at the areas where the stacks 90 will be formed. Also, the side face of the resist pattern 150A beside the middle portion 100*b* recedes.

Next, as shown in FIG. 56, etching is performed using the resist pattern 150A as a mask. This removes the stopper layer 76 and the insulation layer 75 from the portions not covered by the resist pattern 150A. On the other hand, at the areas where the stacks 90 will be formed, the insulation layer 75 remains, while the stopper layer 76 is removed. This insulation layer 75, remaining at the areas for forming the stacks 90, serves as the hard masks 91 discussed with respect to the first embodiment. The step Sb is formed in the insulation layer 75 remaining beside the middle portion 100*b*. The resist pattern 150A is then removed.

Thereafter, the same processes as discussed with reference to FIGS. 25 to 50 for the second embodiment are performed so that the stacks 90 are formed. At this point, similar to that which is shown in FIG. 50, the stacks (stepped stack and projecting stack) 90 including one sacrifice layer 71 are disposed on the stack 80 and outside the stack 80, respectively. Subsequently, the same processes as discussed with reference to FIGS. 51 and 52 for the second embodiment are performed to delimit the stack 80 from the surroundings. During these processes, etching of the lowermost sacrifice layer 71 and the lowermost insulation layer 72 that constitute the projecting stack exposed from the resist pattern proceeds, and the projecting stack consequently disappears. In this manner, the semiconductor device 1 according to the third embodiment is manufactured.

Effects of Third Embodiment

There are instances where the stack 90 as a positional reference is formed with a large thickness to give a large aspect ratio. In such instances, forming an inter-layer insulation layer over the entire face could create a void near the stack 90. This may result in problems in device durability, electric characteristics, etc.

According to the third embodiment having been described, the insulation layer 75 formed below the stopper layer 76 on the stack 80 is used as the hard mask discussed for the first embodiment. The third embodiment therefore allows for the formation of the stacks 90 with a small thickness, providing a solution to these problems.

In the third embodiment as shown in FIG. 53, the semiconductor device 1 does not have the outside stacks 90. In this case, the positions of the stacks 90 on the stack (on the steps) are used as references so that the degree of arc in each step S—which is lower than these stacks 90—can be estimated, and the positions of the terraces T can be accurately comprehended.

Also, although the outside stacks 90 are eventually removed, they are present as projecting stacks during the manufacturing processes. In the third embodiment, therefore, the positions of the resist patterns formed during the manufacturing processes can be measured using the projecting stacks.

Additionally, the lowermost step S is formed using the resist pattern 150H as shown in FIG. 50, and this resist pattern 150H is rectangular and not subjected to slimming. As such, the lowermost step S directly reflects the side face of the resist pattern 150H. In the third embodiment, therefore, the positions of the lowermost step S and the lowermost terrace T can be accurately grasped by positioning the resist pattern 150H using the projecting stacks.

Fourth Embodiment

A semiconductor device according to a fourth embodiment will be described with reference to FIGS. 57 to 74. The hard masks in the fourth embodiment are formed using the resist pattern 150C for forming the steps S extending in the X direction.

For the fourth embodiment, descriptions overlapping with the second embodiment will be omitted. Descriptions will be provided mainly of the features, etc., which differ from the second embodiment.

Configurations for Fourth Embodiment

Figure 57:
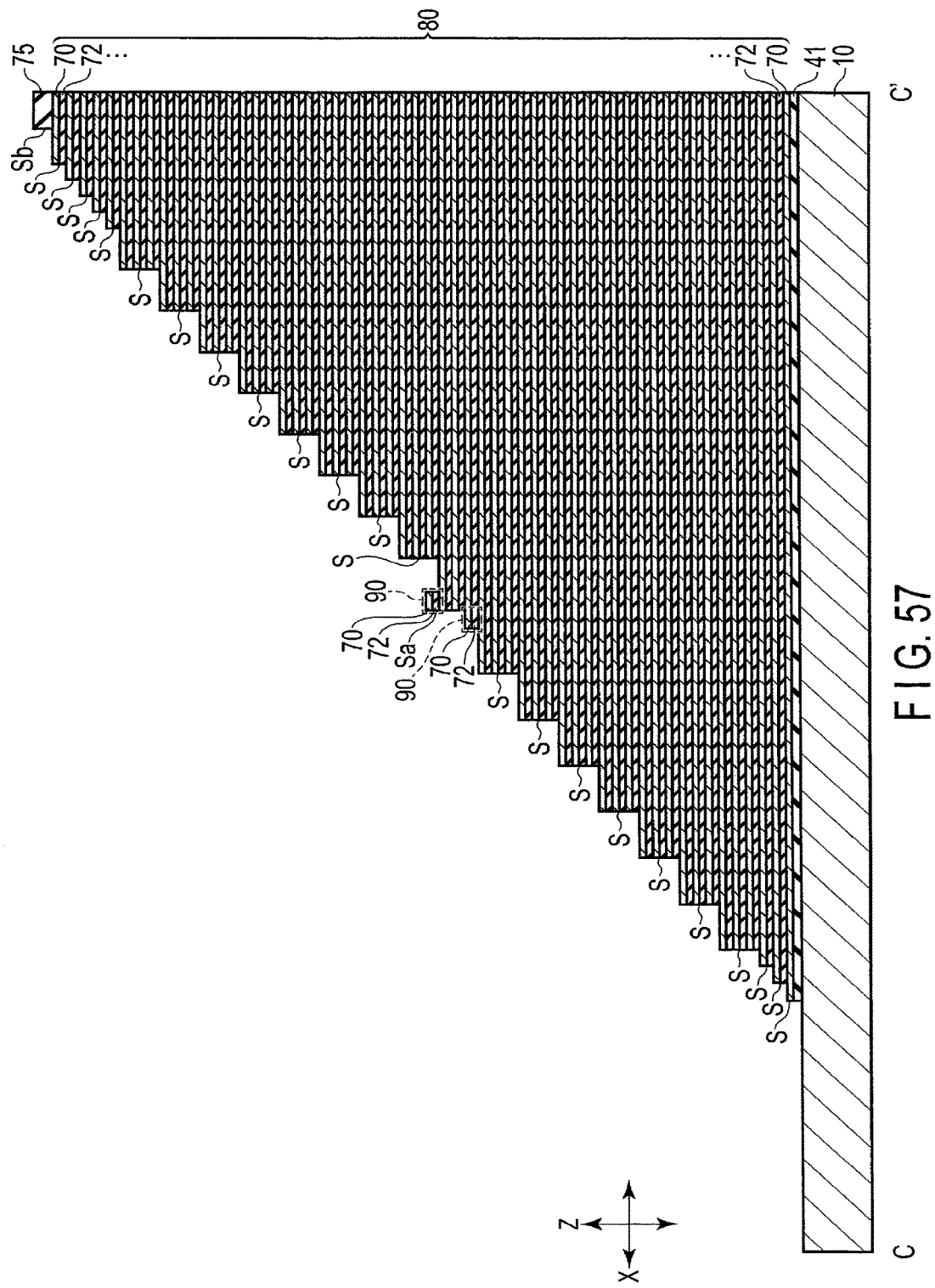
FIG. 57 is a sectional view of a staircase area in a semiconductor device according to a fourth embodiment.

FIG. 57 is a sectional view taken along the line C-C' in FIG. 20, and shows the section of the staircase area 130 in the semiconductor device 1 according to the fourth embodiment.

As shown in FIG. 57, the fourth embodiment differs from the second embodiment in terms of the thickness of the multiple stacks 90.

The stacks 90 on the stack 80 each include one conductive layer 70 and one insulation layer 72. Each stack 90 is a partial division from the stack 80 and includes the same layers as the stack 80. Note that, as in the third embodiment, this embodiment does not have the stacks 90 located outside the stack 80, either.

Manufacturing Method for Fourth Embodiment

FIGS. 58 to 65 illustrate the method for manufacturing the staircase area 130 in the semiconductor device 1 according to the fourth embodiment. More specifically, FIGS. 58, 60, 62, and 64 are planar views of the end portion 100*a*. Also, FIGS. 59, 61, 63, and 65 are sectional views each taken along the line C-C' in the corresponding planar view. The description of the arc profile of the steps S will be omitted.

First, in a similar manner to the second embodiment as shown in FIG. 22, the insulation layer 41, the stack 80, the insulation layer 75, and the stopper layer 76 are formed sequentially on the semiconductor substrate 10. The insulation layer 75 has a thickness corresponding to, for example, one sacrifice layer 71 and one insulation layer 72. Also, the stopper layer 76 has a thickness corresponding to, for example, two sacrifice layers 71 and two insulation layers 72.

Figure 58:
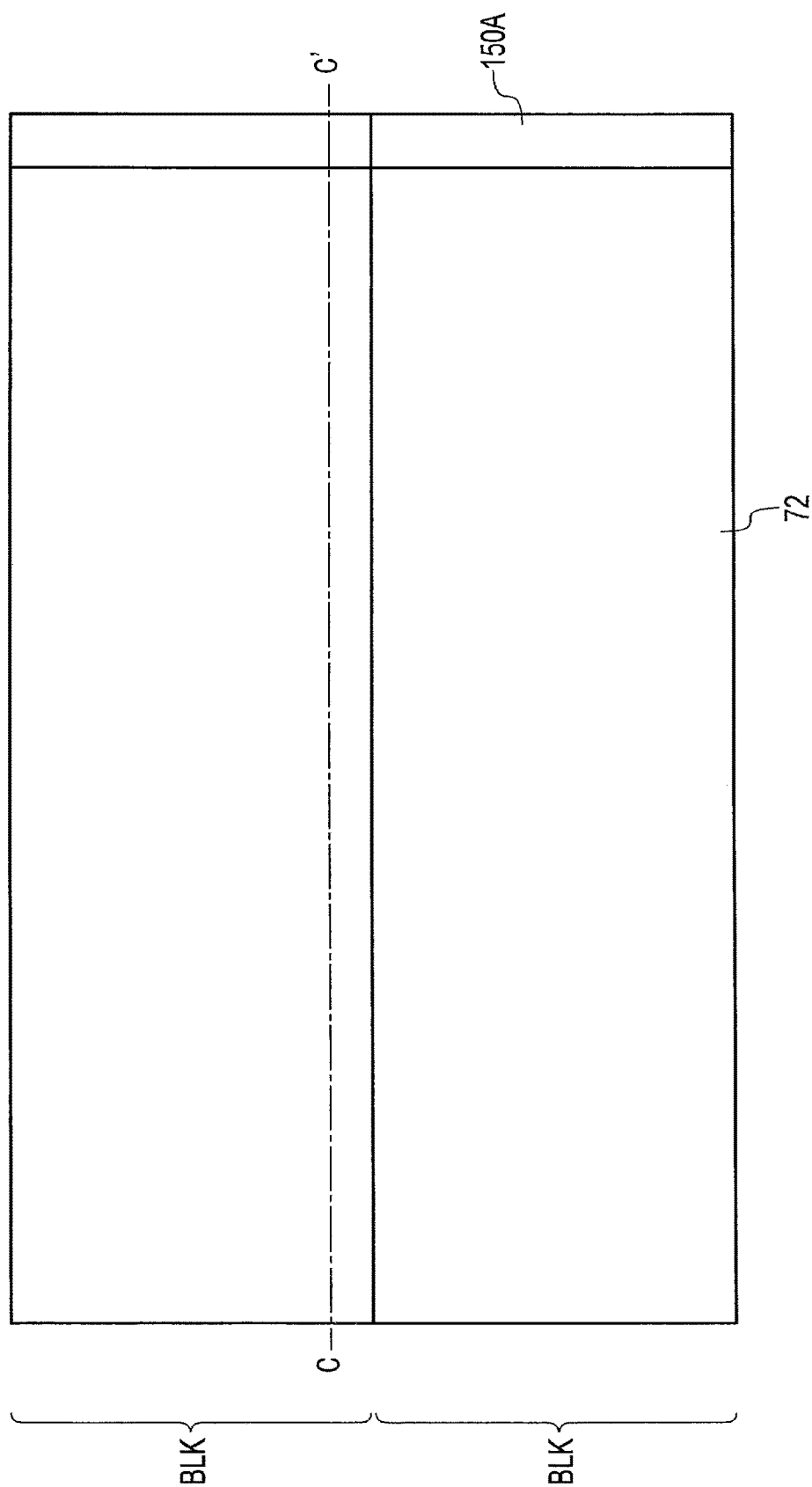
FIG. 58 is a planar view illustrating a method for manufacturing the staircase area in the semiconductor device according to the fourth embodiment.
Figure 59:
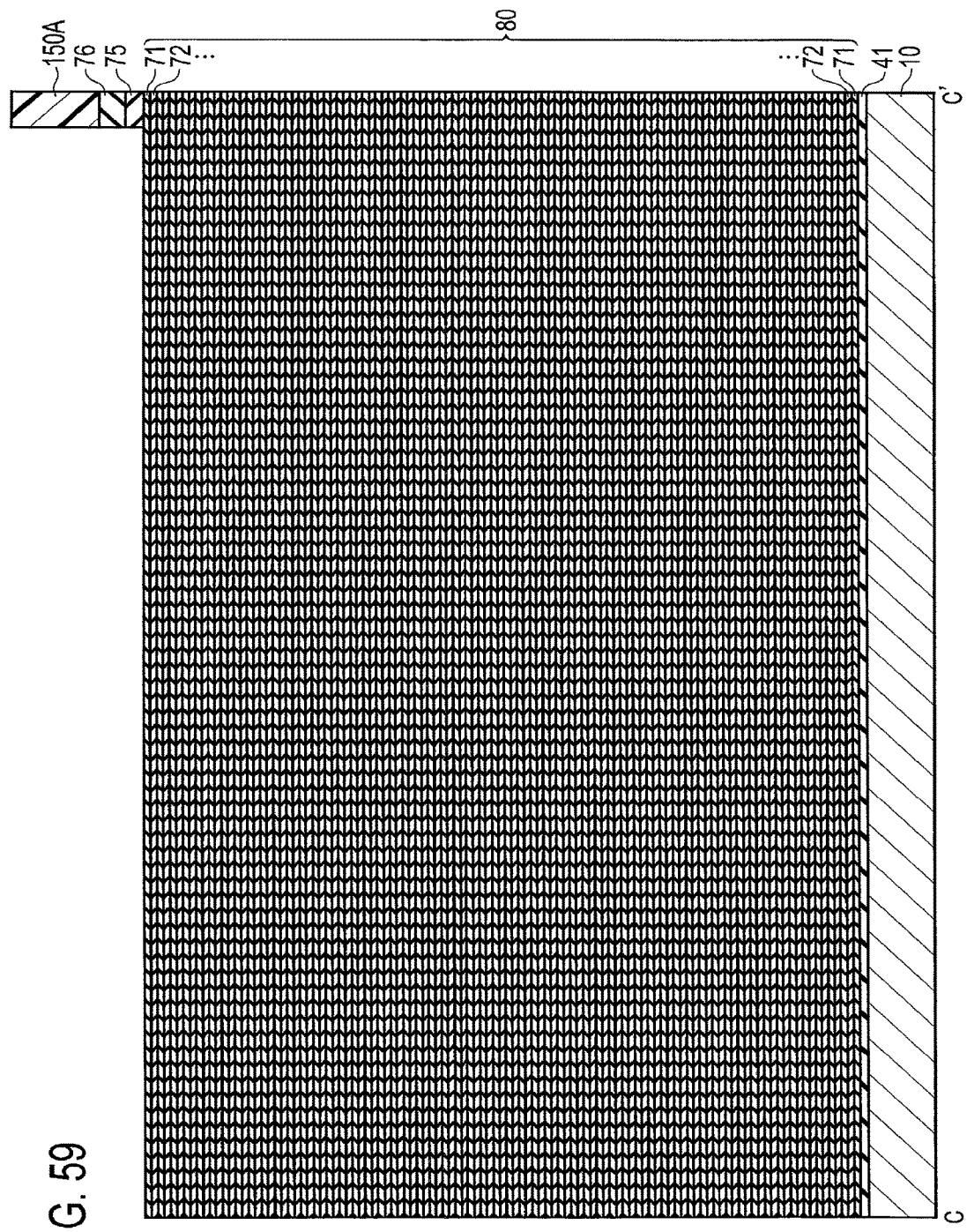
FIG. 59 is a sectional view illustrating the method for manufacturing the staircase area in the semiconductor device according to the fourth embodiment.

Next, as shown in FIGS. 58 and 59, a resist pattern 150A is formed on the stopper layer 76. The resist pattern 150A exposes part of the stopper layer 76 and covers the remaining portion of the stopper layer 76. For example, the resist pattern 150A is formed to cover the portion beside the middle portion 100*b*.

Subsequently, etching is performed using the resist pattern 150A as a mask. This process removes the stopper layer 76 and the insulation layer 75 from the portions not covered by the resist pattern 150A. The resist pattern 150A is then removed.

Figure 61:
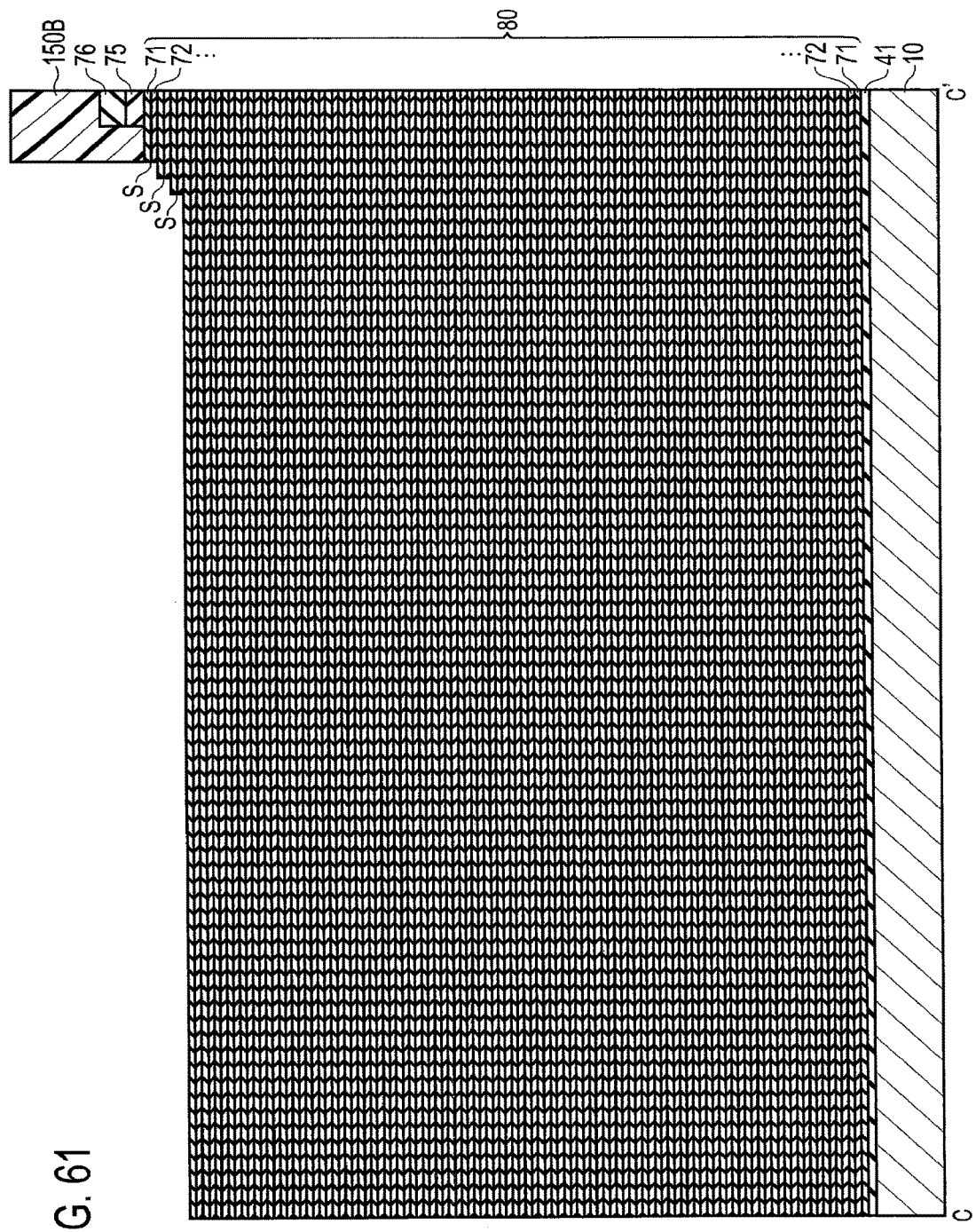
FIG. 61 is a sectional view illustrating the method for manufacturing the staircase area in the semiconductor device according to the fourth embodiment.

Next, as shown in FIGS. 60 and 61, a resist pattern 150B is formed on the stack 80 and the stopper layer 76. As shown in FIG. 6, the resist pattern 150B adopts a shape of a quadrate with acute corners. The resist pattern 150B exposes part of the stack 80 and covers the remaining portion of the stack 80.

Following this, etching processes using the resist pattern 150B as a mask and slimming processes for the resist pattern 150B are repeated alternately. Three etching processes and two slimming processes are performed here. With each etching, one sacrifice layer 71 and one insulation layer 72 are removed. Accordingly, three mono-steps S are formed in the area R0. As the slimming is repeated, the shape difference D of the resist pattern 150B becomes smaller, and the error E becomes larger. The resist pattern 150B is then removed.

Figure 63:
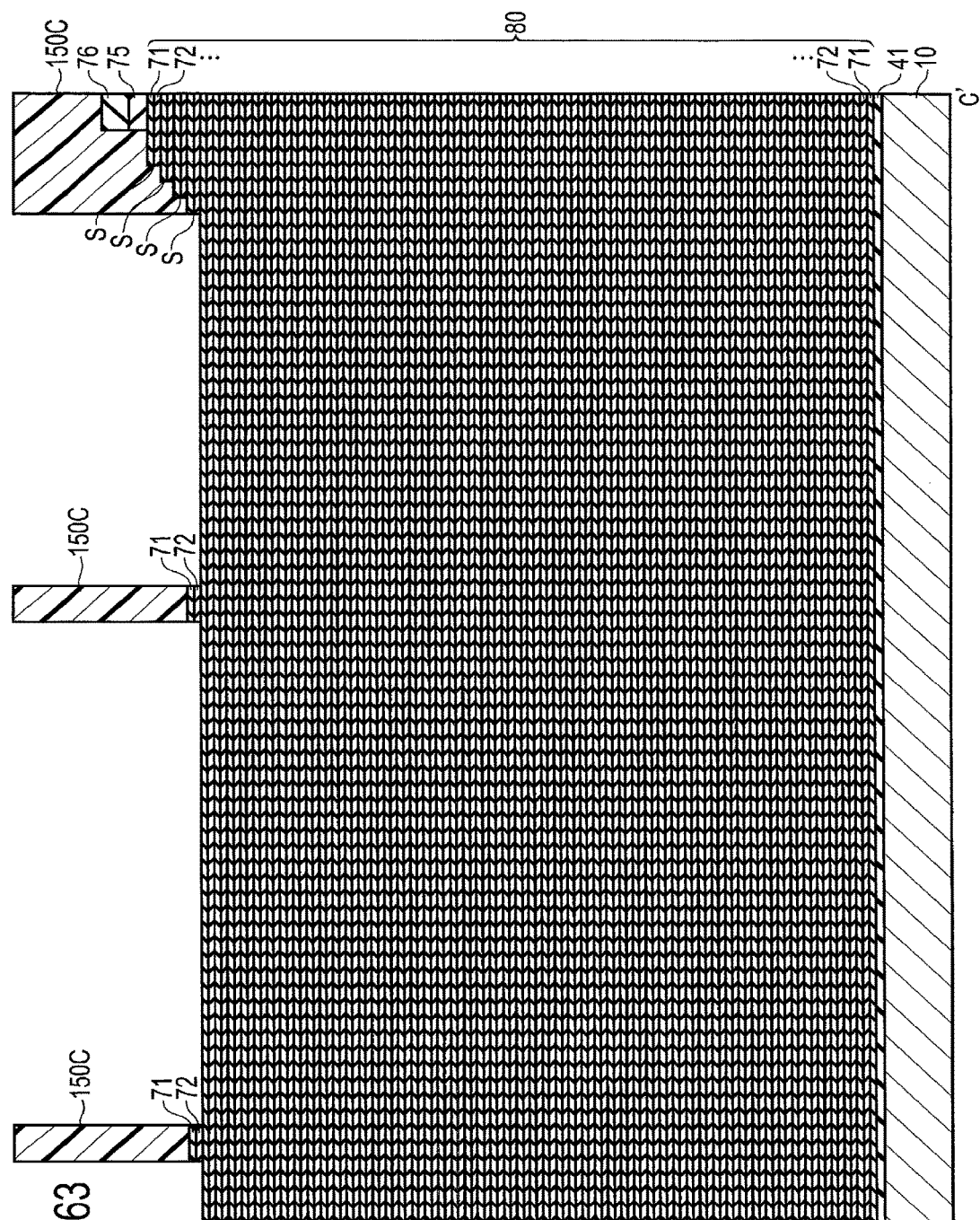
FIG. 63 is a sectional view illustrating the method for manufacturing the staircase area in the semiconductor device according to the fourth embodiment.

Next, as shown in FIGS. 62 and 63, a resist pattern 150C is formed on the stack 80 and the stopper layer 76. The resist pattern 150C is of a comb shape. Specifically, the resist pattern 150C includes a base part extending in the Y direction, and multiple tooth parts extending in the X direction from the base part. The base part covers the portion beside the middle portion 100b. Assuming that each block BLK is partitioned into three row portions in the Y direction, each of the tooth parts covers the center portion in Y direction and the one side end portion in Y direction. The resist pattern 150C is formed so that it bridges between the tooth parts and covers the areas where the stacks 90 will be formed.

Subsequently, etching is performed using the resist pattern 150C as a mask. This removes one sacrifice layer 71 and one insulation layer 72 from the portion of the stack 80 not covered by the resist pattern 150C, thereby forming one mono-step S. At this time, one sacrifice layer 71 and one insulation layer 72, which remain at the areas for forming the stacks 90, serve as the hard masks 91 discussed for the first embodiment.

Figure 64:
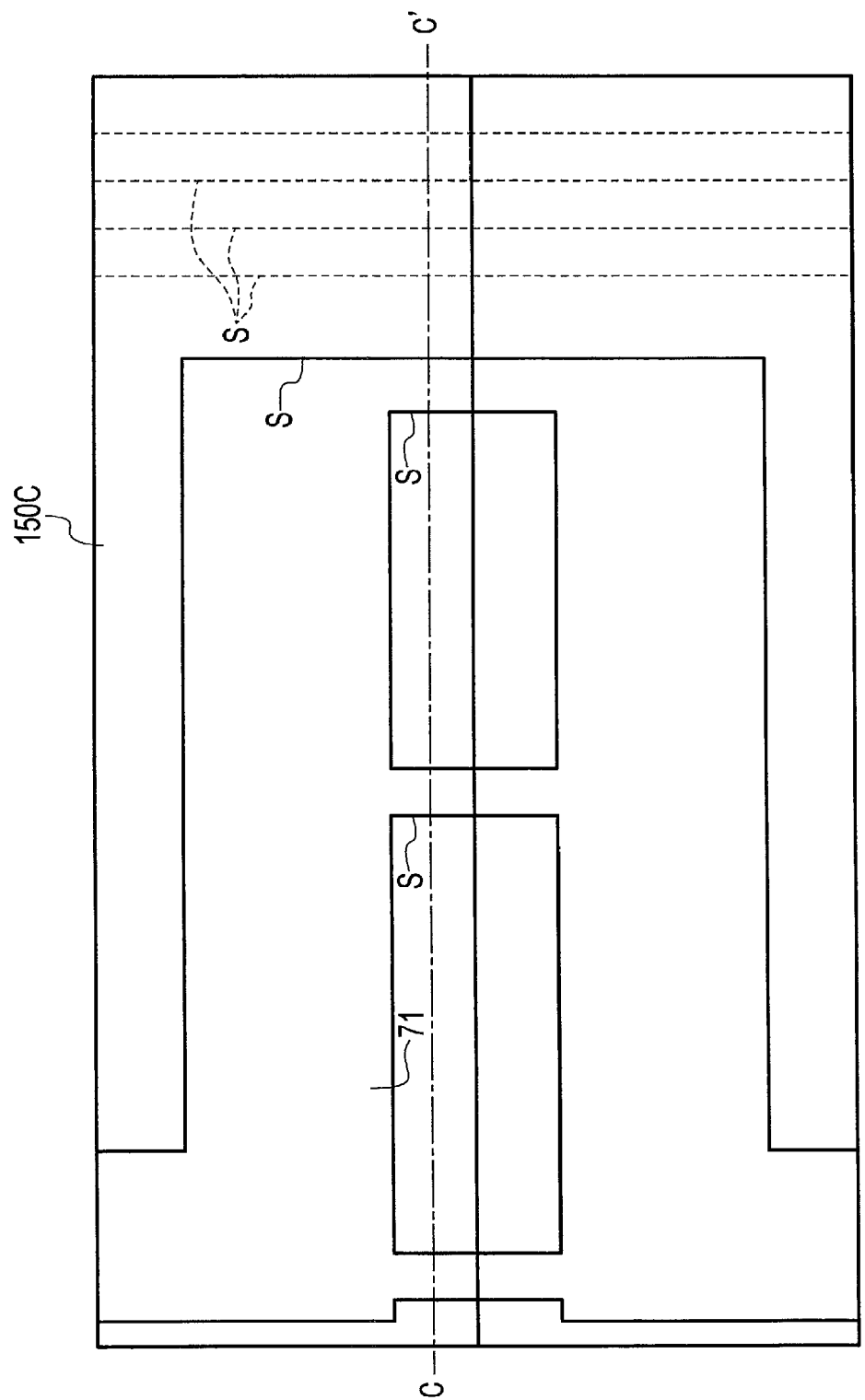
FIG. 64 is a planar view illustrating the method for manufacturing the staircase area in the semiconductor device according to the fourth embodiment.
Figure 65:
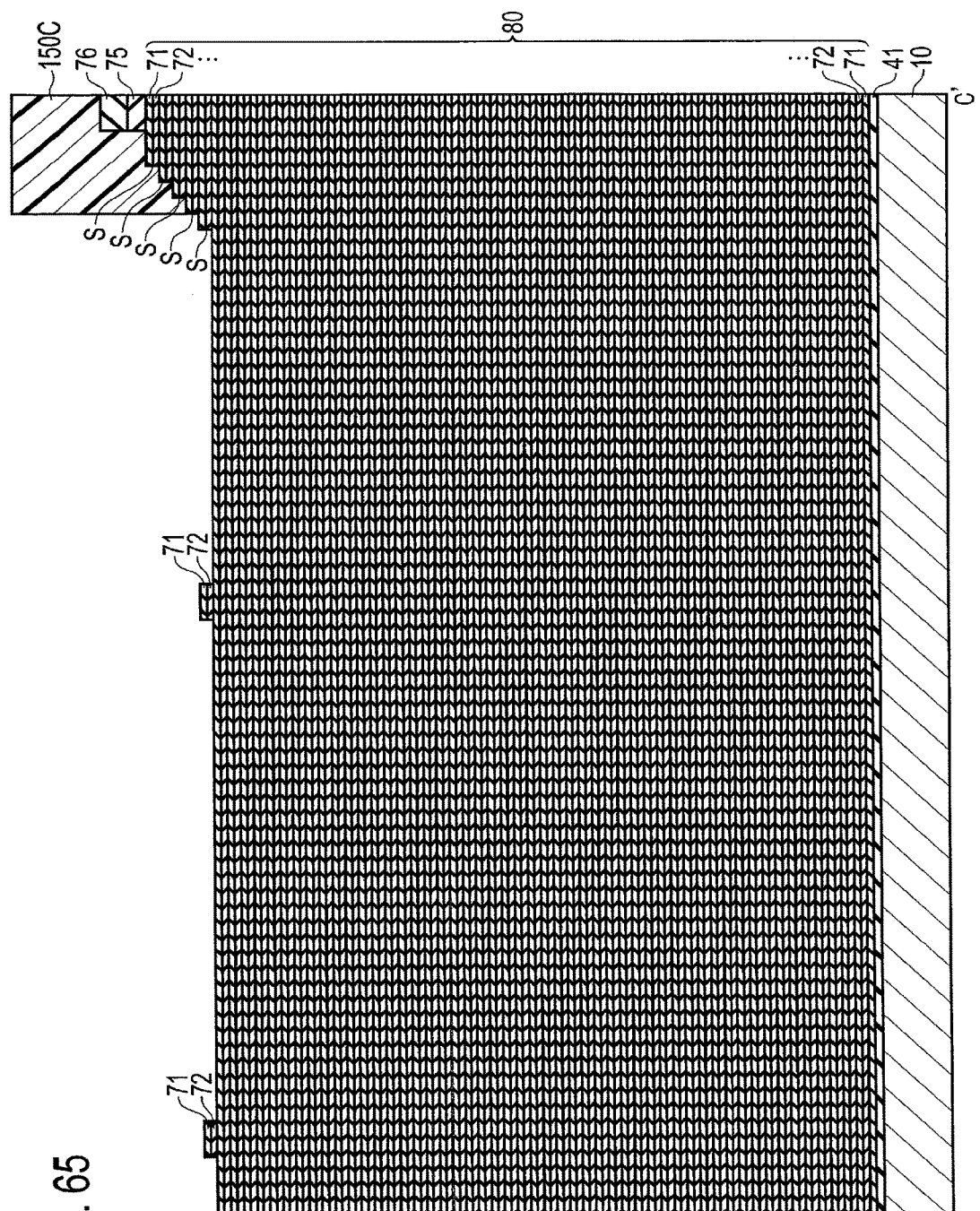
FIG. 65 is a sectional view illustrating the method for manufacturing the staircase area in the semiconductor device according to the fourth embodiment.

Next, as shown in FIGS. 64 and 65, the resist pattern 150C is slimmed. The slimming lets the side face of the resist pattern 150C recede. That is, the side face of the base part of the resist pattern 150C recedes in the X direction. Also, the side faces of the tooth parts of the resist pattern 150C each recede in the Y direction so that the tooth parts cover the respective one side end portions in the Y direction. The resist pattern 150C at the areas for forming the stacks 90 is removed.

Subsequently, etching is performed using the resist pattern 150C as a mask. This removes one sacrifice layer 71 and one insulation layer 72 from the portion of the stack 80 not covered by the resist pattern 150C. As a result, two mono-steps S are formed in the area R1. This also forms two mono-steps S each extending in the X direction, across the areas R1 to R5. Also, the stacks formed due to the bridges between the tooth parts of the resist pattern 150C are transferred to the lower layer portion. The resist pattern 150C is then removed.

Thereafter, the same processes as discussed with reference to FIGS. 33 to 52 for the second embodiment are performed. In this manner, the semiconductor device 1 according to the fourth embodiment is manufactured.

Although the resist pattern 150C has been described as being formed to have bridges between the tooth parts so as to cover the areas for forming the stacks 90, but this is not a limitation. The resist pattern 150C may be formed such that the bridges are disconnected from the tooth parts on both sides in the Y direction, so that only some areas between the tooth parts are covered. Accordingly, the areas for forming the stacks 90 can be discretionarily set.

Also, while it has been described for the process in FIGS. 64 and 65 that the resist pattern 150C at the areas for forming the stacks 90 is completely removed, the resist pattern 150C may instead remain there. For example, in the instance where the resist pattern 150C has a dimension that is large in the areas for forming the stacks 90 in the X direction, this portion of the resist pattern 150C remains after the process in FIGS. 64 and 65. In this instance, the stack 90 on the stack 80, shown in FIG. 57, will be formed to have a portion including one conductive layer 70 and one insulation layer 72 and a portion including two conductive layers 70 and two insulation layers 72.

Effects of Fourth Embodiment

According to the fourth embodiment having been described, the hard masks discussed for the first embodiment are formed using the resist pattern 150C for forming the steps S extending in the X direction. The fourth embodiment therefore allows for the formation of the stacks 90 with a small thickness, and the same effects as in the third embodiment can be attained.

First Modification of Fourth Embodiment

Figure 67:
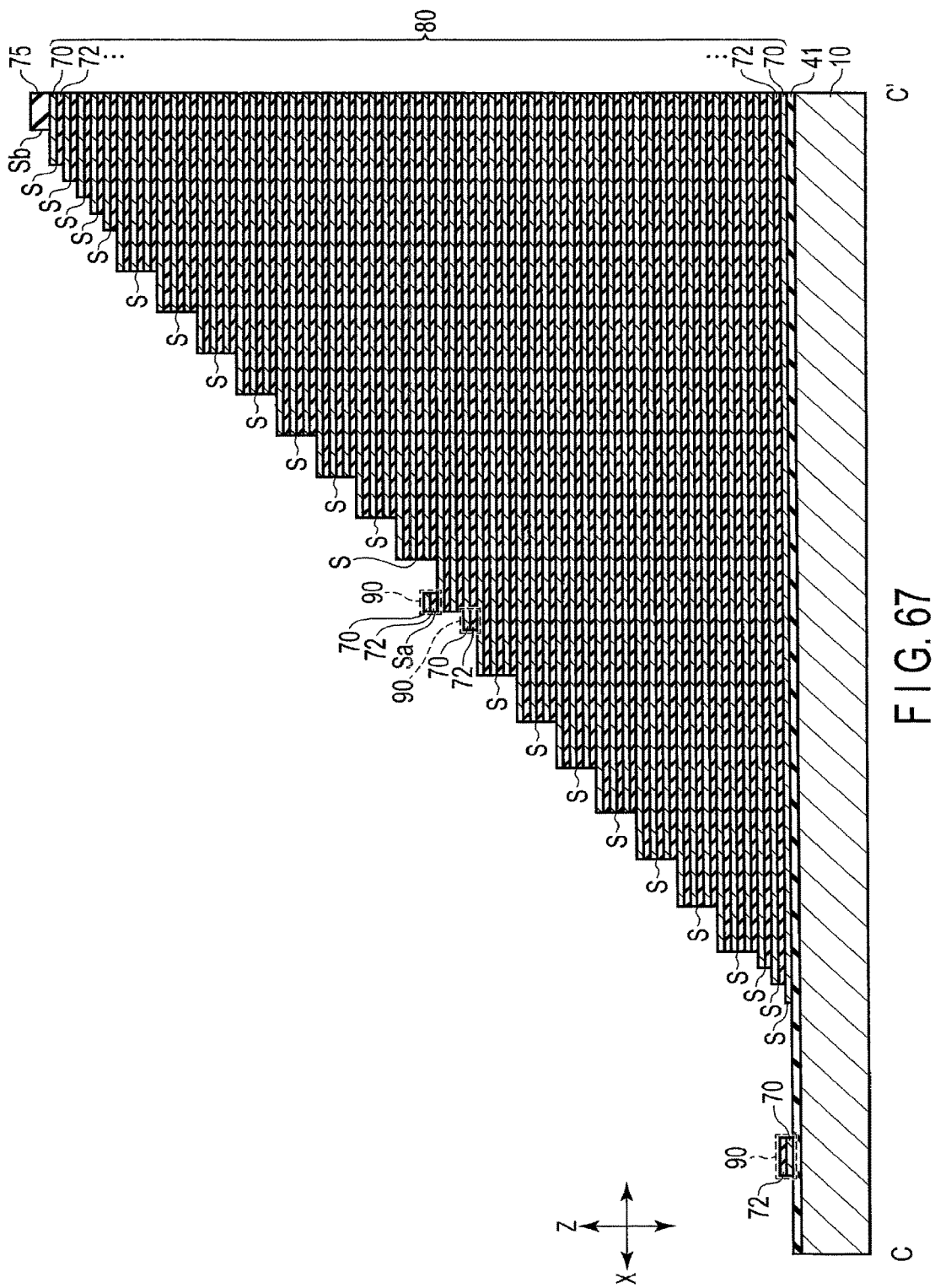
FIG. 67 is a sectional view of the first modification of the staircase area in the semiconductor device according to the fourth embodiment.

FIG. 66 is a planar view of a layout of a first modification of the staircase area 130 in the semiconductor device 1 according to the fourth embodiment. FIG. 67 is a sectional view taken along the line C-C' in FIG. 66, and shows the section of the first modification of the staircase area 130 in the semiconductor device 1 according to the fourth embodiment.

The first modification differs from the fourth embodiment (second embodiment) in that the outside stack 90 is connected to the stack 80.

As shown in FIGS. 66 and 67, the multiple stacks 90 are provided on the insulation layer 41 on the external side of the lowermost step S that is formed in the area R6 of the stack 80 (opposite to the middle portion 100b), or the multiple stacks 90 are provided on the staircase-shaped stack 80. Each of the stacks 90 on the external side of the lowermost step S formed in the area R6 includes one conductive layer 70 and one insulation layer 72. Each of the stacks 90 on the stack 80 includes one conductive layer 70 and one insulation layer 72.

In the stack 80 corresponding to one side end portion of three row portions in the Y direction (that is: the portion corresponding to the uppermost terrace of the three terraces aligned in the Y direction) and the center portion of three row portions in the Y direction (that is: the portion corresponding to the middle terrace of the three terraces aligned in the Y direction), part of the layers is also formed on the external side of the lowermost step S formed in the area R6. The stack 80 at this external portion is formed of the same layers as the outside stacks 90, and this stack 80 (at the external portion) and the outside stacks 90 are connected with each other. In other words, the outside stacks 90 are not separated from the stack 80, and form an integral continuous structure with the stack 80.

The structure in the first modification is manufactured by performing the processes up to FIGS. 64 and 65 as in the fourth embodiment, followed by the processes of FIGS. 33 to 50 as in the second embodiment. That is, the process of FIGS. 51 and 52 as in the second embodiment is not performed. As such, the lowermost sacrifice layer 71 remaining at the portion covered by the resist pattern 150C in the process of FIG. 62 is not removed, and the stack 80 at the external portion and the outside stacks 90 are formed as a structure in which they are connected with each other via the lowermost conductive layer 70 as shown in FIGS. 66 and 67. Note that, although this is not specified by FIG. 66, there is a slit formed to extend between the blocks BLK2 and BLK3 in the X direction (as a separator between the blocks BLK) until intersecting with the outside stack 90. By this slit, the lowermost conductive layer 70 of the stack 80 at the external portion is split along the boundary between the blocks BLK2 and BLK3.

Second Modification of Fourth Embodiment

FIG. 68 is an enlarged view of the broken-line part A in FIG. 19, and gives a planar view of a layout of a second modification of the staircase area 130 in the semiconductor device 1 according to the fourth embodiment. In the figure, two adjacent blocks BLK are shown, and the steps S are drawn without their arc profiles.

As shown in FIG. 68, the staircase area 130 includes the multiple terraces T aligned in the X direction and the Y direction. The figure shows the terraces T0 to T53 sequentially from the lower side. The terraces T0 to T53 are aligned in one row or three rows along the X direction.

The second modification differs from the fourth embodiment (the first modification of the fourth embodiment) in the layout for the areas R0 and R1. Such a modification to the layout of the staircase area 130 is likewise applicable to the second embodiment and the third embodiment.

With respect to the terraces T47 to T49 aligned in three rows, the terraces T50 to T52 are aligned in three rows on the X-direction inside. Also, the terraces T51 and T50 are aligned one-by-one on the X-direction inside with respect to the terrace T52. That is, the terraces T50 and T51 each have a shape of L. Further, the terraces T51 to T53 are aligned one-by-one in a single row on the X-direction inside with respect to the terrace T50. Note, therefore, that there are two terraces T51 and two terraces T52.

FIG. 68 shows the outside stack 90 for consistency with the descriptions of the manufacturing processes below, but the outside stacks 90 may be absent from the manufactured semiconductor device 1 as in the fourth embodiment.

Figure 69:
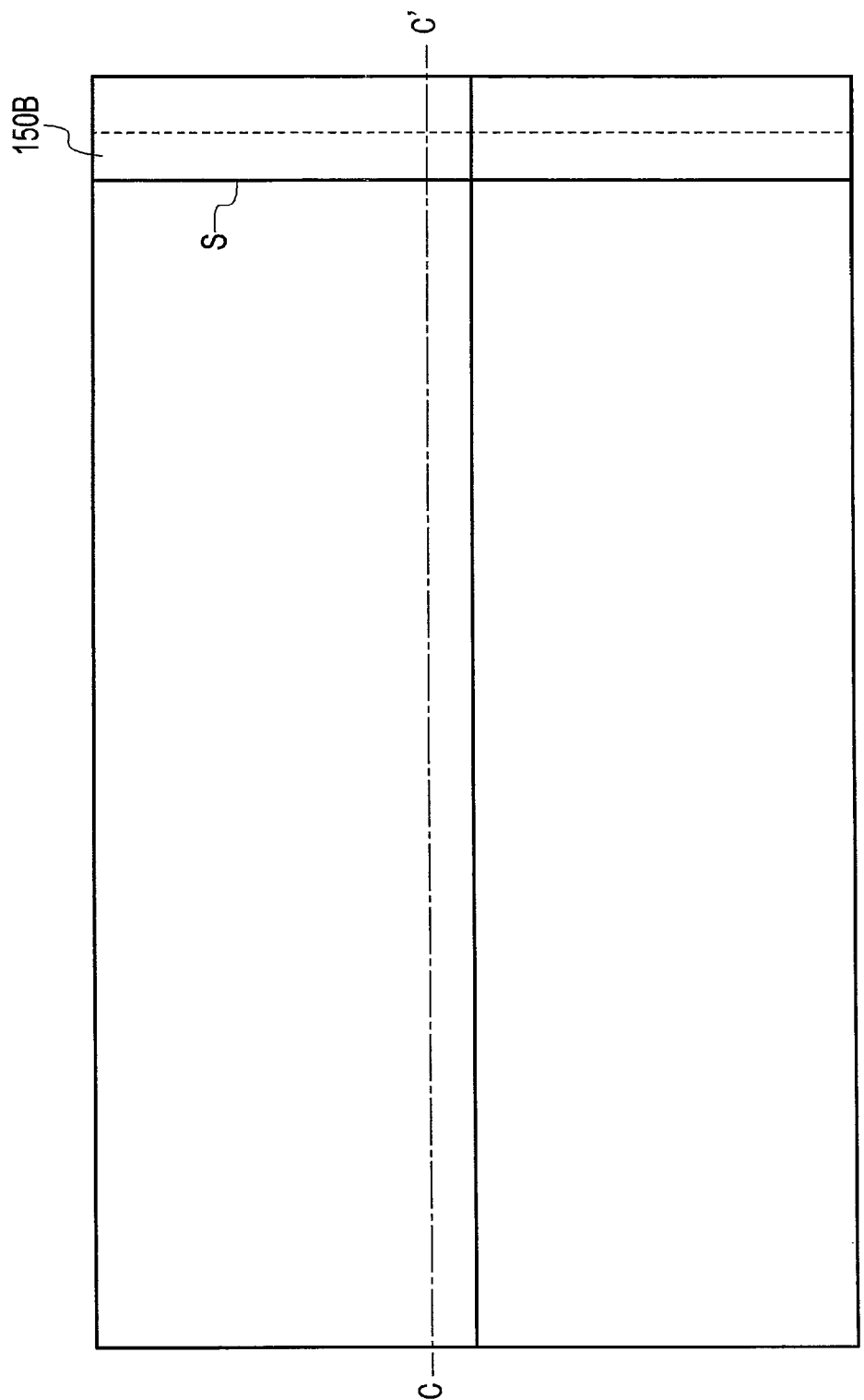
FIG. 69 is a planar view illustrating a method for manufacturing the second modification of the staircase area in the semiconductor device according to the fourth embodiment.
Figure 70:
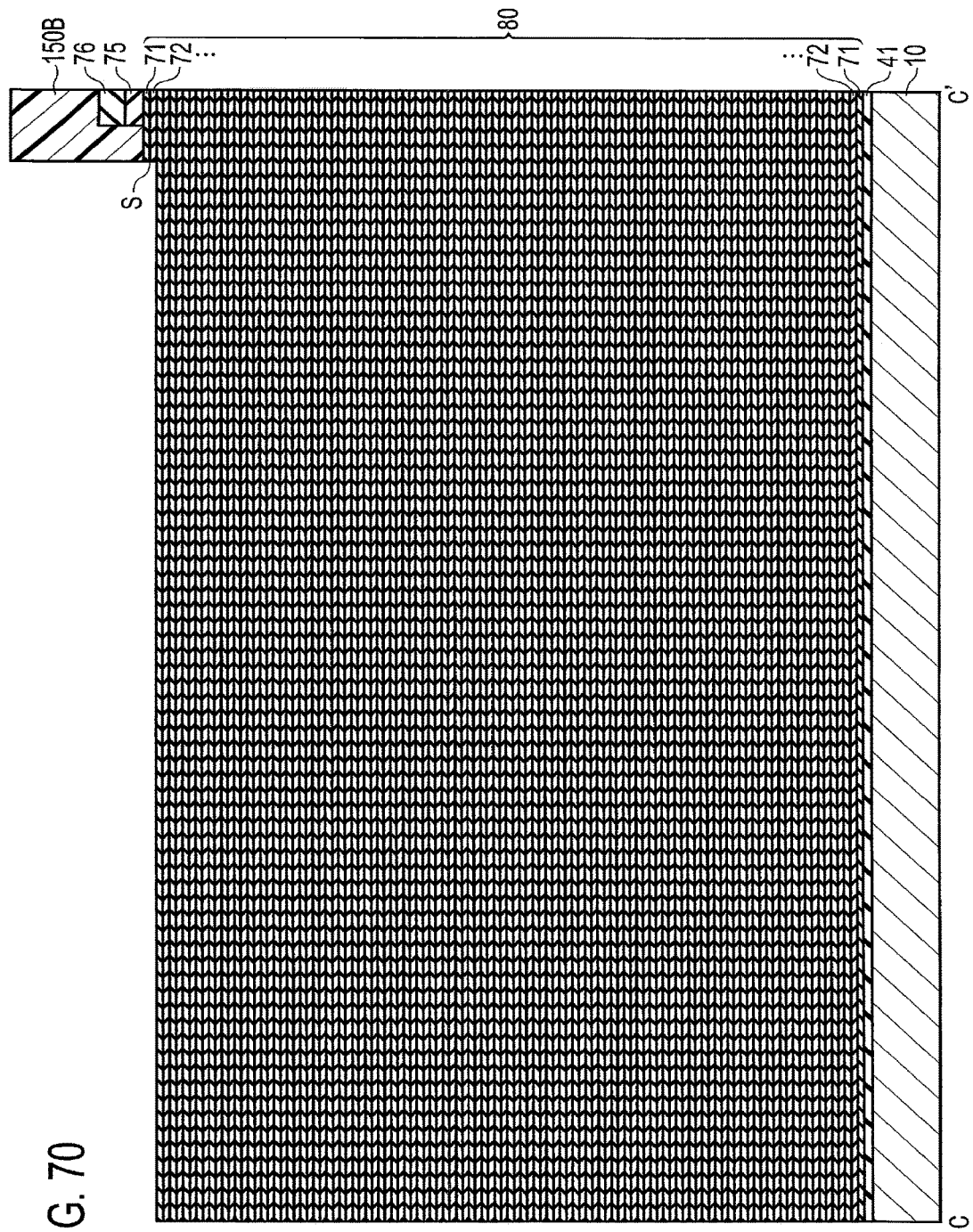
FIG. 70 is a sectional view illustrating the method for manufacturing the second modification of the staircase area in the semiconductor device according to the fourth embodiment.
Figure 72:
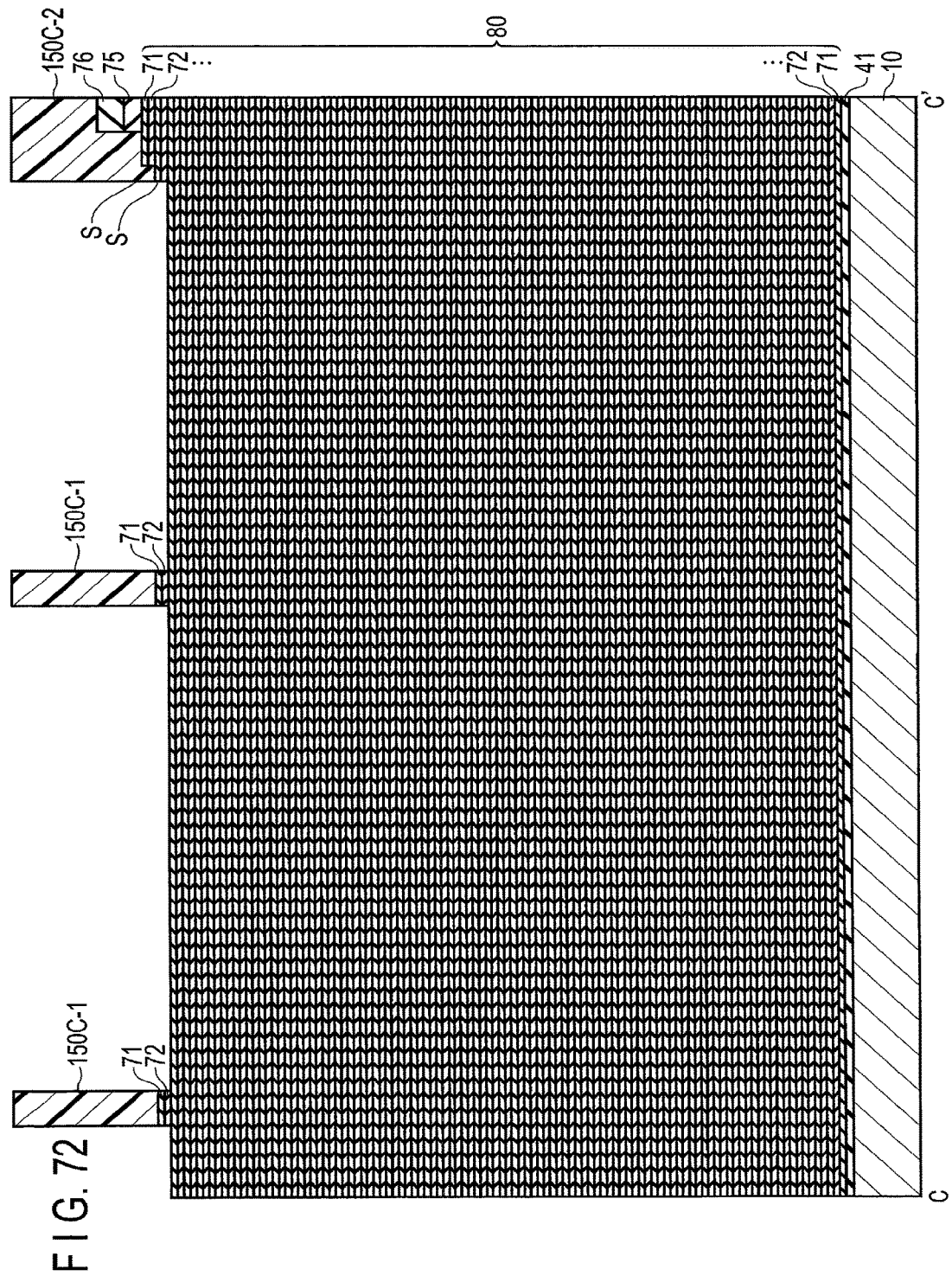
FIG. 72 is a sectional view illustrating the method for manufacturing the second modification of the staircase area in the semiconductor device according to the fourth embodiment.
Figure 73:
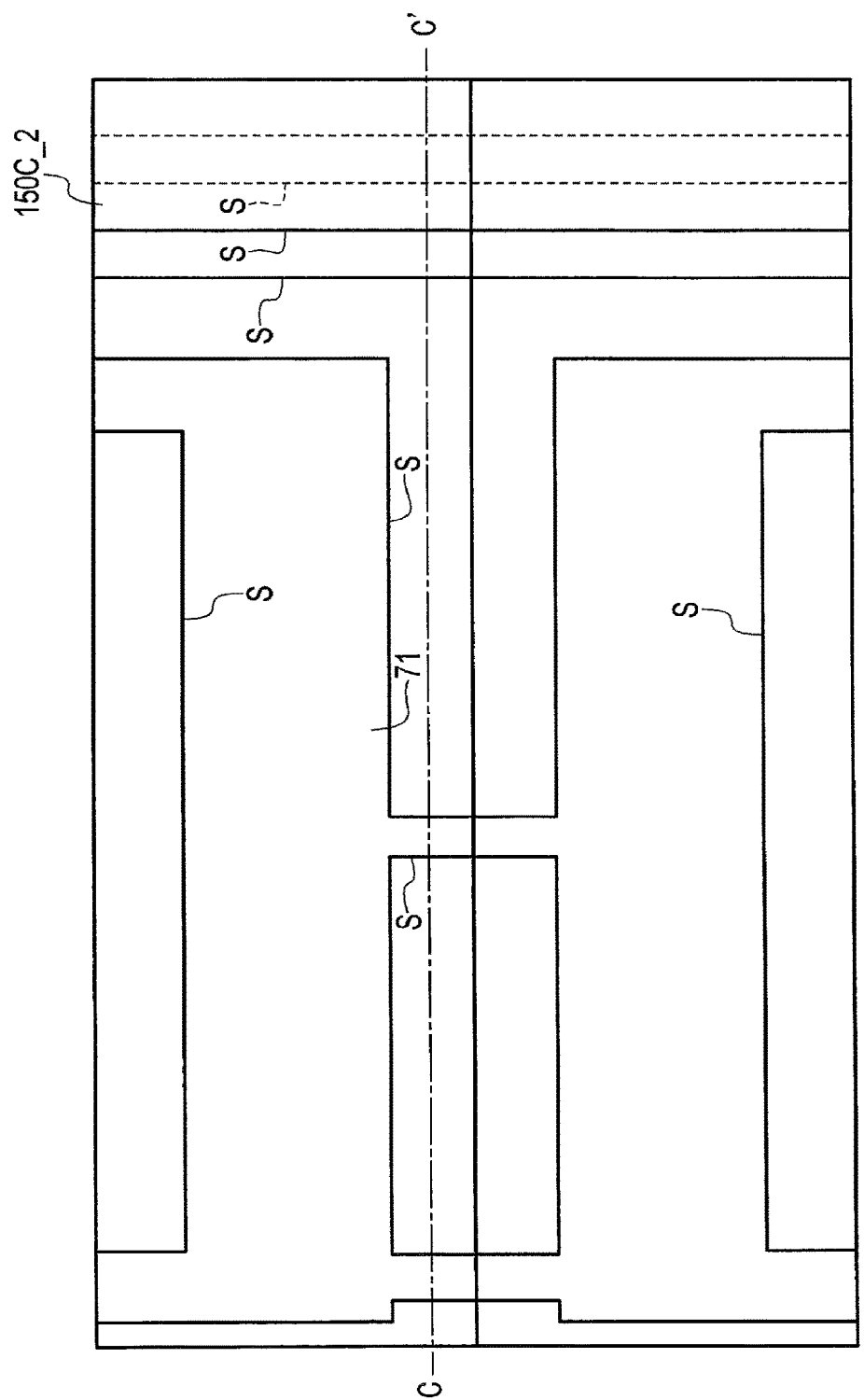
FIG. 73 is a planar view illustrating the method for manufacturing the second modification of the staircase area in the semiconductor device according to the fourth embodiment.
Figure 74:
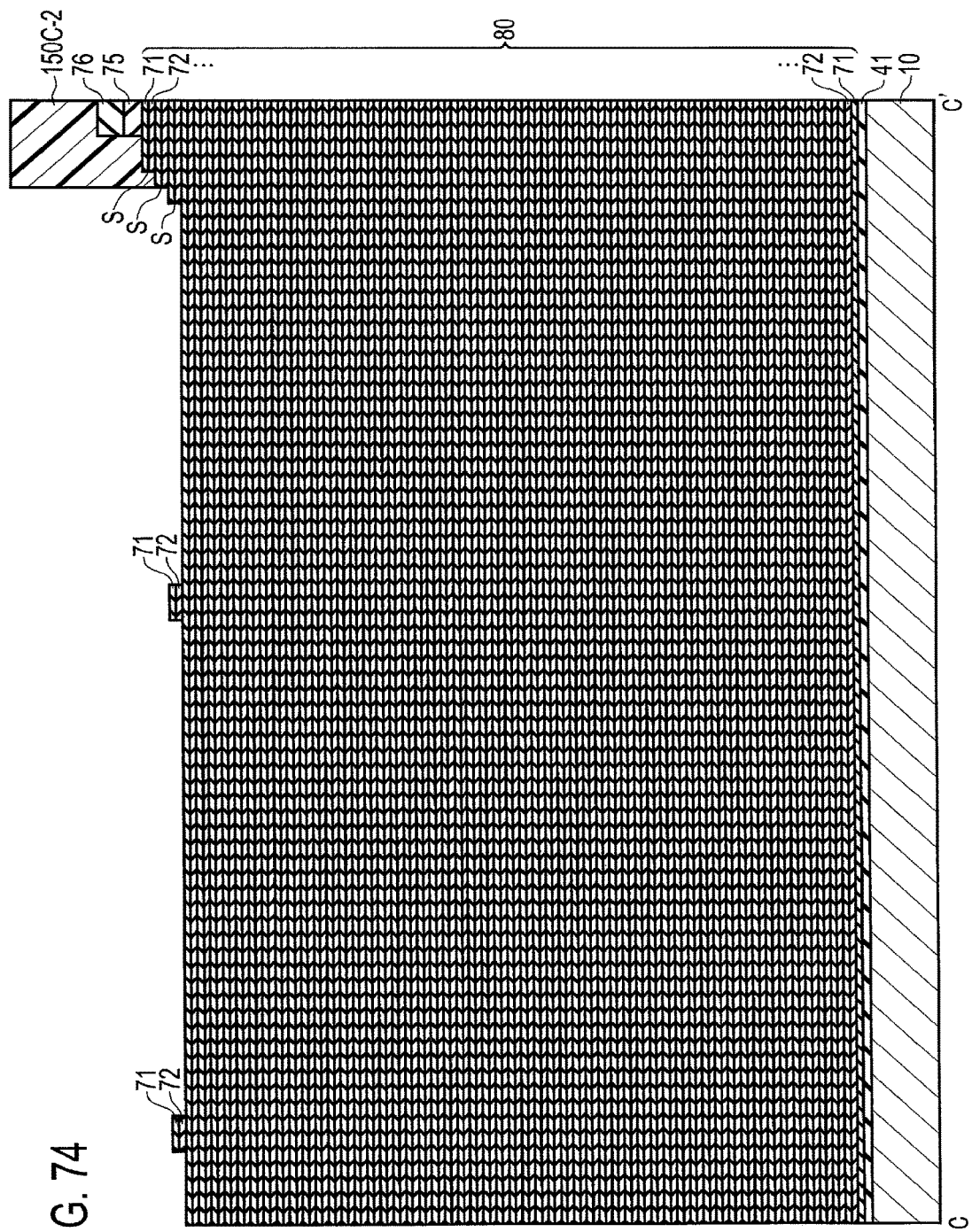
FIG. 74 is a sectional view illustrating the method for manufacturing the second modification of the staircase area in the semiconductor device according to the fourth embodiment.

FIGS. 69 to 74 are sectional views to illustrate the method for manufacturing the second modification of the staircase area 130 in the semiconductor device 1 according to the fourth embodiment. More specifically, FIGS. 69, 71, and 73 are planar views of the end portion 100a. Also, FIGS. 70, 72, and 74 are sectional views each taken along the line C-C' in the corresponding planar view. The description of the arc profile of the steps S will be omitted.

First, in a similar manner to the fourth embodiment, the insulation layer 41, the stack 80, the insulation layer 75, and the stopper layer 76 are formed sequentially on the semiconductor substrate 10. The insulation layer 75 has a thickness corresponding to, for example, one sacrifice layer 71 and one insulation layer 72. Also, the stopper layer 76 has a thickness corresponding to, for example, two sacrifice layers 71 and two insulation layers 72. A resist pattern 150A is then formed on the stopper layer 76. The resist pattern 150A exposes part of the stopper layer 76 and covers the remaining portion of the stopper layer 76. For example, the resist pattern 150A is formed to cover the portion beside the middle portion 100b. Etching is subsequently performed using the resist pattern 150A as a mask. This removes the stopper layer 76 and the insulation layer 75 from the portions not covered by the resist pattern 150A. Thereafter, the resist pattern 150A is removed.

Next, as shown in FIGS. 69 and 70, a resist pattern 150B is formed on the stack 80 and the stopper layer 76. The resist pattern 150B is of a quadrate shape. The resist pattern 150B exposes part of the stack 80 and covers the remaining portion of the stack 80.

Subsequently, etching is performed using the resist pattern 150B as a mask. This removes one sacrifice layer 71 and one insulation layer 72 from the portion not covered by the resist pattern 150B. The resist pattern 150B is then removed.

Next, as shown in FIGS. 71 and 72, a resist pattern 150C_2 is formed. The resist pattern 150C_2 corresponds to the base part extending in the Y direction. Meanwhile, a resist pattern 150C_1 is formed. The resist pattern 150C_1 includes islands corresponding to the respective tooth parts extending in the X direction. That is, the resist pattern 150C_1 and the resist pattern 150C_2 are separate from each other. The resist pattern 150C_1 is formed so that it bridges between the islands and covers the areas where the stacks 90 will be formed.

Subsequently, etching is performed using the resist patterns 150C_1 and 150C_2 as masks. This removes one sacrifice layer 71 and one insulation layer 72 from the portion of the stack 80 not covered by the resist pattern 150C_1 or 150C_2, thereby forming one mono-step S. At this time, one sacrifice layer 71 and one insulation layer 72, which are remaining at the areas for forming the stacks 90, serve as the hard masks 91 discussed for the first embodiment.

Next, as shown in FIGS. 73 and 74, the resist patterns 150C_1 and 150C_2 are slimmed. The slimming lets the side faces of the resist patterns 150C_1 and 150C_2 recede. The side face of the resist pattern 150C_2 thus recedes in the X direction. Also, the side faces of the resist pattern 150C_1 each recede in the Y direction so that the resist pattern 150C_1 covers the respective side end portions in the Y direction. The resist pattern 150C_1 at the areas for forming the stacks 90 is removed.

Subsequently, etching is performed using the resist patterns 150C_1 and 150C_2 as masks. This removes one sacrifice layer 71 and one insulation layer 72 from the portion of the stack 80 not covered by the resist pattern 150C_1 or 150C_2. As a result, four mono-steps S are formed in the area R1. Also, two mono-steps S each extending in the X direction are formed across the areas R1 to R5. Furthermore, the shapes of the stacks formed due to the bridges between the islands of the resist pattern 150C_1 are transferred to the lower layer portion. The resist patterns 150C_1 and 150C_2 are then removed.

Thereafter, the same processes as discussed with reference to FIGS. 33 to 50 for the second embodiment are performed. In this manner, the modification of the semiconductor device 1 according to the fourth embodiment is manufactured.

FIRST APPLICATION EXAMPLE

FIG. 75 is a perspective view to illustrate a first application example of the middle portion 100b of the semiconductor device 1 according to each embodiment.

According to one example for the memory cell array area as shown in FIG. 75, a first underlayer 11 and a second underlayer 12 are provided between the semiconductor substrate 10 and the stack 80. The first underlayer 11 is disposed between the semiconductor substrate 10 and the second underlayer 12. The second underlayer 12 is disposed between the first underlayer 11 and the stack 80.

The second underlayer 12 is a semiconductor layer or a conductive layer. The second underlayer 12 may instead include a stack of a semiconductor layer and a conductive layer. The first underlayer 11 includes transistors and interconnects which form control circuitry.

The lower end of the semiconductor layer 20 of the pillar CL is in contact with the second underlayer 12. The second underlayer 12 is connected to the control circuitry. As such, the lower end of the semiconductor layer 20 of the pillar CL is electrically connected to the control circuitry via the second underlayer 12. That is, the second underlayer 12 can be adopted as a source layer.

The stack 80 is divided by separators 160 into multiple blocks (or finger portions) in the Y direction. The separators 160 are insulation layers and do not include interconnects.

SECOND APPLICATION EXAMPLE

Figure 76:
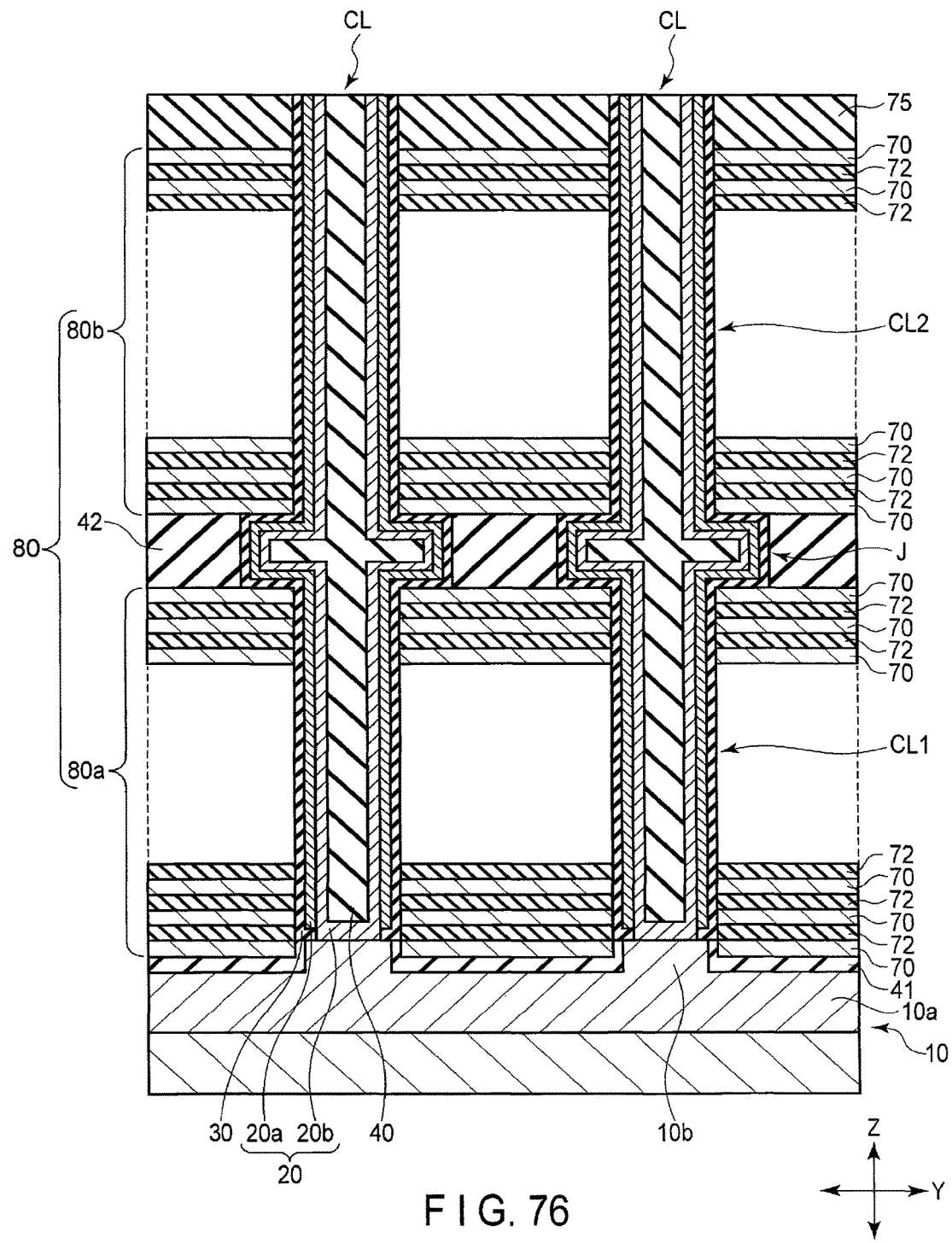
FIG. 76 is a sectional view illustrating a second application example of the middle portion of the semiconductor device according to each embodiment.

FIG. 76 is a sectional view to illustrate a second application example of the middle portion 100b of the semiconductor device 1 according to each embodiment.

According to one example for the memory cell array area as shown in FIG. 76, the stack 80 includes a stack 80a, a stack 80b, and an intermediate layer 42 provided between the stack 80a and the stack 80b.

The stack 80a is disposed on the semiconductor substrate 10 via the insulation layer 41. The stack 80a includes the multiple conductive layers 70 and the multiple insulation layers 72. The conductive layers 70 are stacked in the direction (Z direction) perpendicular to the main face of the semiconductor substrate 10, with the insulation layer (insulator) 72 interposed between the neighboring layers. In other words, the conductive layers 70 and the insulation layers 72 are alternately stacked.

The stack 80b is disposed on the stack 80a via the intermediate layer 42. The stack 80b, as the stack 80a, includes the multiple conductive layers 70 and the multiple insulation layers 72. The conductive layers 70 are stacked in the Z direction with the insulation layer 72 interposed between the neighboring layers.

The intermediate layer 42 is, for example, a silicon oxide layer containing silicon oxide as a main component, as the insulation layers 72. The intermediate layer 42 has a thickness larger than that of one conductive layer 70, as well as that of one insulation layer 72, in the stack 80a or 80b.

The pillars CL each include a first columnar portion CL1, a second columnar portion CL2, and a joint J.

The first columnar portion CL1 extends inside the stack 80a in the stacking direction (Z direction). The second columnar portion CL2 extends inside the stack 80b in the stacking direction. The joint J is provided in the intermediate layer 42 between the first columnar portion CL1 and the second columnar portion CL2. The joint J couples together the first columnar portion CL1 and the second columnar portion CL2, and is disposed consecutively with the first columnar portion CL1 and the second columnar portion CL2. The joint J has a diameter larger than that of the first columnar portion CL1 and that of the second columnar portion CL2.

The first columnar portion CL1 includes the core layer 40, the semiconductor layer 20, and the memory layer 30, which are disposed in this order from the center. As the first columnar portion CL1, the second columnar portion CL2 includes the core layer 40, the semiconductor layer 20, and the memory layer 30, disposed in this order from the center. Furthermore, as the first columnar portion CL1, the joint J includes the core layer 40, the semiconductor layer 20, and the memory layer 30, disposed in this order from the center.

The core layer 40 is provided as a central portion of each of the first columnar portion CL1, the second columnar portion CL2, and the joint J. The core layer 40 extends continuously in the stacking direction within the first columnar portion CL1, the second columnar portion CL2, and the joint J.

The semiconductor layer 20 is provided around the core layer 40 in the first columnar portion CL1, the second columnar portion CL2, and the joint J. That is, the semiconductor layer 20 is provided between the core layer 40 and the memory layer 30. The semiconductor layer 20 extends continuously in the stacking direction within the first columnar portion CL1, the second columnar portion CL2, and the joint J.

The memory layer 30 is provided around the semiconductor layer 20 in the first columnar portion CL1, the second columnar portion CL2, and the joint J. That is, the memory layer 30 is provided between the semiconductor layer 20 and the stack 80. The memory layer 30 extends continuously in the stacking direction within the first columnar portion CL1, the second columnar portion CL2, and the joint J. The memory layer 30 is a layer which does not have a data storage function in the joint J.

The embodiments are applicable to each of the stack 80a and the stack 80b in the second application example. In the instance where the embodiments are applied to the stack 80a, the insulation layer 75 corresponds to the intermediate layer 42.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a substrate;
    a first stack above the substrate and including first insulation layers and first conductive layers alternately stacked in a first direction, the first stack including a staircase-shaped portion in an end part of the first stack in a second direction parallel to a main face of the substrate, the staircase-shaped portion including steps and terraces corresponding to the first conductive layers, at least a part of the steps having arc shape curved along a third direction crossing the second direction; and
    at least one second stack above the substrate and including at least one first layer and at least one second layer stacked in the first direction,
    wherein, in the at least one of the second direction and the third direction, a first dimension of the first stack is larger than a second dimension of the second stack.

2. The semiconductor device according to claim 1, further comprising:
    a third stack above the substrate and including at least one third layer and at least one fourth layer stacked in the first direction, the third stack being aligned with the second stack along the third direction.

3. The semiconductor device according to claim 2, wherein
a first distance in the second direction from an arc-shape step of the steps to the second stack differs from a second distance in the second direction from the arc-shape step to the third stack.

4. The semiconductor device according to claim 3, wherein
the second stack is provided above a side of an end portion of the substrate in the third direction,
the third stack is provided above a side of a center portion of the substrate in the third direction, and
the first distance is smaller than the second distance.

5. The semiconductor device according to claim 1, wherein
the first stack includes a first block and a second block aligned along the third direction,
the first block and the second block each include a first end portion in the second direction and a second end portion opposite the first end portion in the second direction,
in the first block, a first contact is provided on a side of the first end portion, and the second stack is provided on a side of the second end portion, and
in the second block, the second stack is provided on a side of the first end portion, and a second contact is provided on a side of the second end portion.

6. The semiconductor device according to claim 1, further comprising:
a fourth stack above the substrate and including at least one fifth layer and at least one sixth layer stacked in the first direction, the fourth stack being aligned with the second stack along the second direction.

7. The semiconductor device according to claim 1, wherein
the second stack is provided externally in the second direction to the part of the steps having the arc shape of the first stack.

8. The semiconductor device according to claim 1, wherein
the second stack is provided on the staircase-shaped portion of the first stack.

9. The semiconductor device according to claim 8, wherein
the second stack is provided on a first step of the steps and includes a second step aligned with the second step.

10. The semiconductor device according to claim 1, wherein
the second stack is provided on a lowermost one of the terraces aligned along the third direction.

11. A semiconductor device comprising:
a substrate;
a first stack above the substrate and including first insulation layers and first conductive layers alternately stacked in a first direction, the first stack including a staircase-shaped portion in an end part of the first stack in a second direction parallel to a main face of the substrate, the staircase-shaped portion including steps and terraces corresponding to the first conductive layers;
at least one second stack above the substrate and including at least one first layer and at least one second layer stacked in the first direction; and
a third stack above the substrate and including at least one third layer and at least one fourth layer stacked in the first direction, the third stack being aligned with the second stack along a third direction crossing the second direction,
wherein a first dimension of the first stack in the third direction is larger than a second dimension of the second stack in the third direction and a third dimension of the third stack in the third direction, and/or
a first number of stacked layers of the first stack in the first direction is greater than a second number of stacked layers of the second stack in the first direction and a third number of stacked layers of the third stack in the first direction.

12. The semiconductor device according to claim 11, wherein
the first stack includes a first block and a second block aligned along the third direction,
the first block and the second block each include a first end portion in the second direction and a second end portion opposite the first end portion in the second direction,
in the first block, a first contact is provided on a side of the first end portion, and the second stack is provided on a side of the second end portion, and
in the second block, the second stack is provided on a side of the first end portion, and a second contact is provided on a side of the second end portion.

13. The semiconductor device according to claim 11, further comprising:
a fourth stack above the substrate and including at least one fifth layer and at least one sixth layer stacked in the first direction, the fourth stack being aligned with the second stack along the second direction.

14. The semiconductor device according to claim 11, wherein
the second stack and the third stack each is a region provided so as to project in the first direction in both ends thereof in the second direction.

15. The semiconductor device according to claim 11, wherein
the second stack and the third stack are provided on the staircase-shaped portion of the first stack.

16. The semiconductor device according to claim 15, wherein
the second stack and the third stack are provided on a first step of the steps and each includes a second step aligned with the first step.

17. A semiconductor device comprising:
a substrate;
a first stack above the substrate and including first insulation layers and first conductive layers alternately stacked in a first direction, the first stack including a staircase-shaped portion in an end part of the first stack in a second direction parallel to a main face of the substrate, the staircase-shaped portion including steps and terraces corresponding to the first conductive layers, at least a part of the steps having arc shape curved along a third direction crossing the second direction; and
a second stack above the substrate and including at least one first layer and at least one second layer stacked in the first direction,
wherein a first number of stacked layers of the first stack in the first direction is greater than a second number of stacked layers of the second stack in the first direction.

18. The semiconductor device according to claim 17, further comprising:

a third stack above the substrate and including at least one third layer and at least one fourth layer stacked in the first direction, the third stack being aligned with the second stack along the third direction.

19. The semiconductor device according to claim 17, further comprising:
a fourth stack above the substrate and including at least one fifth layer and at least one sixth layer stacked in the first direction, the fourth stack being aligned with the second stack along the second direction.

20. The semiconductor device according to claim 17, wherein
the second stack is provided on a lowermost one of the terraces aligned along the third direction.

* * * * *